(12) United States Patent
Pang et al.

(10) Patent No.: US 8,564,192 B2
(45) Date of Patent: Oct. 22, 2013

(54) PROCESS FOR FABRICATING OLED LIGHTING PANELS

(75) Inventors: Huiqing Pang, Newtown, PA (US);
Emory Krall, Philadelphia, PA (US);
Kamala Rajan, Newtown, PA (US);
Paul E. Burrows, Chatteroy, WA (US);
Ruiqing Ma, Morristown, NJ (US);
Peter Levermore, Belo Horizonte (BR)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 13/468,414

(22) Filed: May 10, 2012

(65) Prior Publication Data

US 2012/0286650 A1    Nov. 15, 2012

Related U.S. Application Data

(63) Continuation-in-part of application No. 13/105,770, filed on May 11, 2011, now Pat. No. 8,432,095.

(51) Int. Cl.
*H01J 1/62* (2006.01)
*H01J 63/04* (2006.01)

(52) U.S. Cl.
USPC ........... 313/504; 313/483; 313/500; 313/501; 313/502; 313/503; 313/505; 313/506

(58) Field of Classification Search
None
See application file for complete search history.

(56) References Cited

U.S. PATENT DOCUMENTS

| | | | |
|---|---|---|---|
| 4,469,719 A | 9/1984 | Martin | |
| 4,769,292 A | 9/1988 | Tang et al. | |
| 5,061,569 A | 10/1991 | VanSlyke et al. | |
| 5,247,190 A | 9/1993 | Friend et al. | |
| 5,703,436 A | 12/1997 | Forrest et al. | |
| 5,707,745 A | 1/1998 | Forrest et al. | |

(Continued)

FOREIGN PATENT DOCUMENTS

| | | |
|---|---|---|
| EP | 0650955 | 5/1995 |
| EP | 1331666 | 7/2003 |

(Continued)

OTHER PUBLICATIONS

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials," *Adv. Mater.*, 6(9):677-679 (1994).

(Continued)

*Primary Examiner* — Natalie Walford
(74) *Attorney, Agent, or Firm* — Sterne, Kessler, Goldstein & Fox P.L.L.C.

(57) ABSTRACT

Systems and methods for the design and fabrication of OLEDs, including high-performance large-area OLEDs, are provided. Variously described fabrication processes may be used to deposit and pattern bus lines and/or insulators using vapor deposition such as vacuum thermal evaporation (VTE) through a shadow mask, and may avoid multiple photolithography steps. Bus lines and/or insulators may be formed with a smooth profile and a gradual sidewall transition. Such smooth profiles may, for example, reduce the probability of electrical shorting at the bus lines. Other vapor deposition systems and methods may include, among others, sputter deposition, e-beam evaporation and chemical vapor deposition (CVD). A final profile of the bus line and/or insulator may substantially correspond to the profile as deposited. A single OILED devices may also be formed with relatively large dimension.

34 Claims, 26 Drawing Sheets

(56) References Cited

U.S. PATENT DOCUMENTS

| | | |
|---|---|---|
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,403,392 B1 | 6/2002 | Burrows et al. |
| 6,468,819 B1 | 10/2002 | Kim et al. |
| 6,528,187 B1 | 3/2003 | Okada |
| 6,626,721 B1 | 9/2003 | Van Slyke |
| 6,687,266 B1 | 2/2004 | Ma et al. |
| 6,835,469 B2 | 12/2004 | Kwong et al. |
| 6,891,327 B2 | 5/2005 | Duineveld et al. |
| 6,921,915 B2 | 7/2005 | Takiguchi et al. |
| 7,034,470 B2 | 4/2006 | Cok et al. |
| 7,087,321 B2 | 8/2006 | Kwong et al. |
| 7,090,928 B2 | 8/2006 | Thompson et al. |
| 7,154,114 B2 | 12/2006 | Brooks et al. |
| 7,250,226 B2 | 7/2007 | Tokito et al. |
| 7,279,704 B2 | 10/2007 | Walters et al. |
| 7,332,232 B2 | 2/2008 | Ma et al. |
| 7,338,722 B2 | 3/2008 | Thompson et al. |
| 7,393,599 B2 | 7/2008 | Thompson et al. |
| 7,396,598 B2 | 7/2008 | Takeuchi et al. |
| 7,431,968 B1 | 10/2008 | Shtein et al. |
| 7,445,855 B2 | 11/2008 | Mackenzie et al. |
| 7,534,505 B2 | 5/2009 | Lin et al. |
| 7,576,496 B2 | 8/2009 | Duggal et al. |
| 8,120,248 B2 | 2/2012 | Shinto et al. |
| 2002/0034656 A1 | 3/2002 | Thompson et al. |
| 2002/0134984 A1 | 9/2002 | Igarashi |
| 2002/0158242 A1 | 10/2002 | Son et al. |
| 2003/0006697 A1 | 1/2003 | Weaver |
| 2003/0138657 A1 | 7/2003 | Li et al. |
| 2003/0152802 A1 | 8/2003 | Tsuboyama et al. |
| 2003/0162053 A1 | 8/2003 | Marks et al. |
| 2003/0175553 A1 | 9/2003 | Thompson et al. |
| 2003/0230980 A1 | 12/2003 | Forrest et al. |
| 2004/0036077 A1 | 2/2004 | Ise |
| 2004/0137267 A1 | 7/2004 | Igarashi et al. |
| 2004/0137268 A1 | 7/2004 | Igarashi et al. |
| 2004/0174116 A1 | 9/2004 | Lu et al. |
| 2004/0253756 A1 | 12/2004 | Cok et al. |
| 2005/0025993 A1 | 2/2005 | Thompson et al. |
| 2005/0112407 A1 | 5/2005 | Ogasawara et al. |
| 2005/0238919 A1 | 10/2005 | Ogasawara |
| 2005/0244673 A1 | 11/2005 | Satoh et al. |
| 2005/0260441 A1 | 11/2005 | Thompson et al. |
| 2005/0260449 A1 | 11/2005 | Walters et al. |
| 2006/0008670 A1 | 1/2006 | Lin et al. |
| 2006/0202194 A1 | 9/2006 | Jeong et al. |
| 2006/0240279 A1 | 10/2006 | Adamovich et al. |
| 2006/0251923 A1 | 11/2006 | Lin et al. |
| 2006/0263635 A1 | 11/2006 | Ise |
| 2006/0280965 A1 | 12/2006 | Kwong et al. |
| 2007/0190359 A1 | 8/2007 | Knowles et al. |
| 2007/0278938 A1 | 12/2007 | Yabunouchi et al. |
| 2008/0015355 A1 | 1/2008 | Schafer et al. |
| 2008/0018221 A1 | 1/2008 | Egen et al. |
| 2008/0106190 A1 | 5/2008 | Yabunouchi et al. |
| 2008/0124572 A1 | 5/2008 | Mizuki et al. |
| 2008/0220265 A1 | 9/2008 | Xia et al. |
| 2008/0297033 A1 | 12/2008 | Knowles et al. |
| 2009/0008605 A1 | 1/2009 | Kawamura et al. |
| 2009/0009065 A1 | 1/2009 | Nishimura et al. |
| 2009/0017330 A1 | 1/2009 | Iwakuma et al. |
| 2009/0030202 A1 | 1/2009 | Iwakuma et al. |
| 2009/0039776 A1 | 2/2009 | Yamada et al. |
| 2009/0045730 A1 | 2/2009 | Nishimura et al. |
| 2009/0045731 A1 | 2/2009 | Nishimura et al. |
| 2009/0061724 A1 | 3/2009 | Cok et al. |
| 2009/0101870 A1 | 4/2009 | Prakash et al. |
| 2009/0108737 A1 | 4/2009 | Kwong et al. |
| 2009/0115316 A1 | 5/2009 | Zheng et al. |
| 2009/0146557 A1 | 6/2009 | Shinto et al. |
| 2009/0165846 A1 | 7/2009 | Johannes et al. |
| 2009/0167162 A1 | 7/2009 | Lin et al. |
| 2009/0179554 A1 | 7/2009 | Kuma et al. |
| 2012/0286648 A1 | 11/2012 | Pang et al. |

FOREIGN PATENT DOCUMENTS

| | | |
|---|---|---|
| EP | 1725079 | 11/2006 |
| EP | 2034538 | 3/2009 |
| JP | 200511610 | 1/2005 |
| JP | 2006147190 | 8/2005 |
| JP | 2007123392 | 5/2007 |
| JP | 2007254297 | 10/2007 |
| JP | 2008074939 | 10/2009 |
| JP | 2010080310 | 8/2010 |
| KR | 20090116551 | 11/2009 |
| WO | WO 0139234 | 5/2001 |
| WO | WO 02002714 | 1/2002 |
| WO | WO 0215645 | 2/2002 |
| WO | WO 03040257 | 5/2003 |
| WO | WO 03060956 | 7/2003 |
| WO | WO 2004093207 | 10/2004 |
| WO | WO 2004107822 | 12/2004 |
| WO | WO 2005014551 | 2/2005 |
| WO | WO 2005019373 | 3/2005 |
| WO | WO 2005030900 | 4/2005 |
| WO | WO 2005089025 | 9/2005 |
| WO | WO 2005123873 | 12/2005 |
| WO | WO 2006009024 | 1/2006 |
| WO | WO 2006056418 | 6/2006 |
| WO | WO 2006072002 | 7/2006 |
| WO | WO 2006082742 | 8/2006 |
| WO | WO 2006098120 | 9/2006 |
| WO | WO 2006100298 | 9/2006 |
| WO | WO 2006103874 | 10/2006 |
| WO | WO 2006114966 | 11/2006 |
| WO | WO 2006132173 | 12/2006 |
| WO | WO 2007002683 | 1/2007 |
| WO | WO 2007004380 | 1/2007 |
| WO | WO 2007063754 | 6/2007 |
| WO | WO 2007063796 | 6/2007 |
| WO | WO 2008101842 | 8/2008 |
| WO | WO 2008132085 | 11/2008 |
| WO | WO 2009000673 | 12/2008 |
| WO | WO 2009003898 | 1/2009 |
| WO | WO 2009008311 | 1/2009 |
| WO | WO 2009018009 | 2/2009 |
| WO | WO 2009050290 | 4/2009 |
| WO | WO 2008056746 | 5/2009 |
| WO | WO 2009021126 | 5/2009 |
| WO | WO 2009062578 | 5/2009 |
| WO | WO 2009063833 | 5/2009 |
| WO | WO 2009066778 | 5/2009 |
| WO | WO 2009066779 | 5/2009 |
| WO | WO 2009086028 | 7/2009 |
| WO | WO 2009100991 | 8/2009 |
| WO | WO 2010/038181 | 4/2010 |

OTHER PUBLICATIONS

Paulose, Betty Marie Jennifer S. et al., "First Examples of Alkenyl Pyridines as Organic Ligands for Phosphorescent Iridium Complexes," *Adv. Mater.*, 16(22):2003-2007 (2004).

Tung, Yung-Liang et al., "Organic Light-Emitting Diodes Based on Charge-Neutral Ru" PHosphorescent Emitters," Adv. Mater., 17(8):1059-1064 (2005).

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," *Adv. Mater.*, 19:739-743 (2007).

Wong, Wai-Yeung, "Multifunctional Iridium Complexes Based on Carbazole Modules as Highly Efficient Electrophosphors," *Angew. Chem. Int. Ed.*, 45:7800-7803 (2006).

Tang, C.W. And VanSlyke, S.A., "Organic Electroluminescent Diodes," *Appl. Phys. Lett.*, 51(12):913-915 (1987).

(56) References Cited

OTHER PUBLICATIONS

Adachi, Chihaya et al., "Organic Electroluminescent Device Having a Hole Conductor as an Emitting Layer," *Appl. Phys. Lett.*, 55(15):1489-1491 (1989).
Ma, Yuguang et al., "Triplet Luminescent Dinuclear-Gold(I) Complex-Based Light-Emitting Diodes with Low Turn-On voltage," *Appl. Phys. Lett.*, 74(10):1361-1363 (1999).
Gao, Zhiqiang et al., "Bright-Blue Electroluminescence From a Silyl-Substituted ter-(phenylene-vinylene) derivative," *Appl. Phys. Lett.*, 74(6):865-867 (1999).
Lee, Chang-Lyoul et al., "Polymer Phosphorescent Light-Emitting Devices Doped with Tris(2-phenylpyridine) Iridium as a Triplet Emitter," *Appl. Phys. Lett.*, 77(15):2280-2282 (2000).
Hung, L.S. et al., "Anode Modification in Organic Light-Emitting Diodes by Low-Frequency Plasma Polymerization of $CHF_3$,"*Appl. Phys. Lett.*, 78(5):673-675 (2001).
Ikai, Masamichi and Tokito, Shizuo, "Highly Efficient Phosphorescence From Organic Light-Emitting Devices with an Exciton-Block Layer," *Appl. Phys. Lett.*, 79(2):156-158 (2001).
Wang, Y. et al., "Highly Efficient Electroluminescent Materials Based on Fluorinated Organometallic Iridium Compounds," *Appl. Phys. Lett.*, 79(4):449-451 (2001).
Kwong, Raymond C. et al., "High Operational Stability of Electrophosphorescent Devices," *Appl. Phys. Lett.*, 81(1):162-164 (2002).
Holmes, R.J. et al., "Blue Organic Electrophosphorescence Using Exothermic Host-Guest Energy Transfer," *Appl. Phys. Lett.*, 82(15):2422-2424 (2003).
Sotoyama, Wataru et al., "Efficient Organic Light-Emitting Diodes with Phosphorescent Platinum Complexes Containing $N^{\wedge}C^{\wedge}N$-Coordinating Tridentate Ligand," *Appl. Phys. Lett.*, 86:153505-1-153505-3 (2005).
Okumoto, Kenji et al., "Green Fluorescent Organic Light-Emitting Device with External Quantum Efficiency of Nearly 10%," *Appl. Phys. Lett.*, 89:063504-1-063504-3 (2006).
Kanno, Hiroshi et al., "Highly Efficient and Stable Red Phosphorescent Organic Light-Emitting Device Using bis[2-(2-benzothiazoyl)phenolato]zinc(II) as host material,"*Appl. Phys. Lett.*, 90:123509-1-123509-3 (2007).
Aonuma, Masaki et al., "Material Design of Hole Transport Materials Capable of Thick-Film Formation in Organic Light Emitting Diodes," *Appl. Phys. Lett.*, 90:183503-1-183503-3 (2007).
Sun, Yiru and Forrest, Stephen R., "High-Efficiency White Organic Light Emitting Devices with Three Separate Phosphorescent Emission Layers," *Appl. Phys. Lett.*, 91:263503-1-263503-3 (2007).
Adachi, Chihaya et al., "High-Efficiency Red Electrophosphorescence Devices," *Appl. Phys. Lett.*, 78(11):1622-1624 (2001).
Wong, Keith Man-Chung et al., A Novel Class of Phosphorescent Gold(III) Alkynyl-Based Organic Light-Emitting Devices with Tunable Colour, *Chem. Commun.*, 2906-2908 (2005).
Hamada, Yuji et al., "High Luminance in Organic Electroluminescent Devices with Bis(10-hydroxybenzo[h]quinolinato)beryllium as an Emitter," *Chem. Lett.*, 905-906 (1993).
Nishida, Jun-ichi et al., "Preparation, Characterization, and Electroluminescence Characteristics of α-Diimine-type Platinum(II) Complexes with Perfluorinated Phenyl Groups as Ligands," *Chem. Lett.*, 34(4):592-593 (2005).
Mi, Bao-Xiu et al., "Thermally Stable Hole-Transporting Material for Organic Light-Emitting Diode: an Isoindole Derivative," *Chem. Mater.*, 15(16):3148-3151 (2003).
Huang, Wei-Sheng et al., "Highly Phosphorescent Bis-Cyclometalated Iridium Complexes Containing Benzoimidazole-Based Ligands," *Chem. Mater.*, 16(12):2480-2488 (2004).

Niu, Yu-Hua et al., "Highly Efficient Electrophosphorescent Devices with Saturated Red Emission from a Neutral Osmium Complex," *Chem. Mater.*, 17(13):3532-3536 (2005).
Lo, Shih-Chun et al., "Blue Phosphorescence from Iridium(III) Complexes at Room Temperature," *Chem. Mater.*, 18(21):5119-5129 (2006).
Takizawa, Shin-ya et al., "Phosphorescent Iridium Complexes Based on 2-Phenylimidazo[1,2-α]pyridine Ligands: Tuning of Emission Color toward the Blue Region and Application to Polymer Light-Emitting Devices," *Inorg. Chem.*, 46(10):4308-4319 (2007).
Lamansky, Sergey et al., "Synthesis and Characterization of Phosphorescent Cyclometalated Iridium Complexes," *Inorg. Chem.*, 40(7):1704-1711 (2001).
Ranjan, Sudhir et al., "Realizing Green Phosphorescent Light-Emitting Materials from Rhenium(I) Pyrazolato Diimine Complexes," *Inorg. Chem.*, 42(4):1248-1255 (2003).
Noda, Tetsuya and Shirota,Yasuhiko, "5,5'-Bis(dimesitylboryl)-2,2'-bithiophene and 5,5"Bis(dimesitylboryl)-2,2':5',2"-terthiophene as a Novel Family of Electron-Transporting Amorphous Molecular Materials," *J. Am. Chem. Soc.*, 120 (37):9714-9715 (1998).
Sakamoto,Youichi et al., "Synthesis, Characterization, and Electron-Transport Property of Perfluorinated Phenylene Dendrimers," *J. Am. Chem. Soc.*, 122(8):1832-1833 (2000).
Adachi, Chihaya et al., "Nearly 100% Internal Phosphorescence Efficiency in an Organic Light Emitting Device," *J. Appl. Phys.*, 90(10):5048-5051 (2001).
Shirota, Yasuhiko et al., "Starburst Molecules Based on π-Electron Systems as Materials for Organic Electroluminescent Devices," *Journal of Luminescence*, 72-74:985-991 (1997).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," *J. Mater. Chem.*, 3(3):319-320 (1993).
Kido, Junji et al., 1,2,4-Triazole Derivative as an Electron Transport Layer in Organic Electroluminescent Devices, *Jpn. J. Appl. Phys.*, 32:L917-L920 (1993).
Van Slyke, S. A. et al., "Organic Electroluminescent Devices with Improved Stability," *Appl. Phys. Lett.*, 69(15):2160-2162 (1996).
Guo, Tzung-Fang et al., "Highly Efficient Electrophosphorescent Polymer Light-Emitting Devices," *Organic Electronics*, 1:15-20 (2000).
Palilis, Leonidas C., "High Efficiency Molecular Organic Light-Emitting Diodes Based on Silole Derivatives and Their Exciplexes," *Organic Electronics*, 4:113-121 (2003).
Ikeda, Hisao et al., "P-185: Low-Drive-Voltage OLEDs with a Buffer Layer Having Molybdenum Oxide," *SID Symposium Digest*, 37:923-926 (2006).
T. Östergård et al., "Langmuir-Blodgett Light-Emitting Diodes of Poly(3-Hexylthiophene): Electro-Optical Characteristics Related to Structure," *Synthetic Metals*, 87:171-177 (1997).
Hu, Nan-Xing et al., "Novel High $T_g$, Hole-Transport Molecules Based on Indolo[3,2-b]carbazoles for Organic Light-Emitting Devices," *Synthetic Metals*, 111-112:421-424 (2000).
Salbeck, J. et al., "Low Molecular Organic Glasses for Blue Electroluminescence," *Synthetic Metals*, 91:209-215 (1997).
Baldo et al., "Highly Efficient Phosphorescent Emission from Organic Electroluminescent Devices," *Nature*, vol. 395, 151-154, (1998).
Baldo et al., "Very high-efficiency green organic light-emitting devices based on electrophosphorescence,"Appl. Phys. Lett., vol. 75, No. 3, 4-6 (1999).
International Search Report corresponding to the PCT/US2012/037378 application.

PROCESS FOR FABRICATING OLED LIGHTING PANELS

RELATED APPLICATIONS

This application is a continuation-in-part of application Ser. No. 13/105,770 filed May 11, 2011, the contents of which are hereby incorporated by reference in their entirety.

FIELD OF THE INVENTION

The present invention relates to systems and processes for fabricating OLED lighting panels, and particularly for forming metal bus lines as may be used in large-area OLED lighting panels.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine)iridium, denoted Ir(ppy)$_3$, which has the following structure:

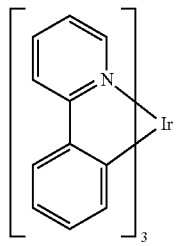

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

As used herein, "bus lines" generally refer to lines that are configured to conduct current from electrode contacts across a device. Bus lines may be further configured to distribute current evenly across, for example, an OLED light panel. In large area OLED light panels, potential drops due to significant electrode resistances can cause luminance non-uniformity and reduce device efficacy. One method used to reduce potential drops is to introduce highly conductive bus lines. Current distribution is then dependent on bus line resistance, electrode resistance, active area and the particular JVL characteristics of the OLED stack. Bus line resistance is determined by the resistivity of the bus line material and the geometry of the bus line, including thickness, length and width. In principle, the resistance of the bus lines could be reduced by using a material with lower resistivity (such as gold, silver, aluminum or copper) or increasing the height of the bus line. However, in practice, there is a finite height at which it is practical to deposit a bus line—any higher than, and it becomes difficult to dispose uniform thin films over the bus lines. Further reduction in the resistance is then typically achieved by increasing the width of the bus lines.

As used herein, an "insulator" may be used to refer generally to a material or structure that blocks current from flowing between different layers or structures of a device. This may include, for example, a material disposed in between a first electrode and a second electrode, and may refer to materials that block current from flowing through the organic stacks when an electric field is applied between the two electrodes. That is to say, the material itself may be conductive or semi-conductive but does not transport charges to and/or from the other organic layers and therefore prohibits emission. Such materials may be dielectric materials, such as $SiO_2$, which do not conduct charges themselves. In some embodiments, the insulator may be wide-band gap materials, such as LiF. In other embodiments, the insulator may be Electron Transportation layer (ETL) or Electron Injection layer (EIL) material, such as Liq, which forms a reverse biased diode when disposed between anode and organic layers and thereby blocks charge flow. An insulator may also be disposed between metal bus lines and organic layers to prevent shorting.

As used herein, a spacer mask may refer to a shadow mask that is inserted between the substrate and the patterning shadow mask, and may have a larger opening than the patterning shadow mask. A patterning shadow mask (or, shadow mask as referred below), is a mask with specific openings that will shape the deposited materials into substantially the same pattern. However, the spacer mask is usually an open mask with no specific features and would allow the deposition through the patterning shadow mask with substantially the same pattern, i.e., the pattern may have a different edge profile or slightly wider but the plan view shape is substantially the same as if deposited only through a patterning shadow mask. The spacer mask is inserted to generate gap between the substrate and the shadow mask for controlling the profile of the deposited layer. The thickness of the spacer mask can be tuned to adjust the gap for a desired distance based on the target profile shape of the deposited layer. For example, an insulator may be patterned through the same shadow mask as that of bus lines but with a spacer mask to create a wider patterns so that the insulator can cover the edge of the bus lines to prevent shorting. This may reduce the amount of shadow masks used in the fabrication and therefore reduce the manufacturing cost.

As used herein, a single device may refer to an OLED device that can be separately addressed, i.e., at least one of the anode and cathode electrodes is patterned and electrically separated from any other part of the panel. For example, the entire panel may comprise only one single device, if both the anode and cathode are common layers. On the contrary, if one of the electrodes is patterned into a plurality of individual segments and each segment can be separately addressed, each segment may form a single device and the panel comprises a plurality of single devices. Alternatively, the panel may still be considered as a single device if the patterned electrode segments are electrically connected to each other through bus lines, because the plurality of the segments is connected in parallel and may not be separately addressed. If the panel is patterned into a plurality of pixels and the pixels are connected in series, a pixel may be considered to be a single device.

More details on OLEDs, and the definitions described above, can be found in U.S. Pat. No. 7,279,704, which is incorporated herein by reference in its entirety.

In a typical bottom-emission OLED device, the anode material is conventionally a transparent conducting oxide (TCO), which generates power losses and Joule heating due to its relatively high resistivity and thin film thickness. For example, sheet resistance is typically in the range of 10-100 Ohm/square for a thickness range of 50-200 nm. This is in contrast to metal, which is often used for the reflective cathode. This can result in brightness non-uniformity, which becomes more evident when scaling up to large-area light panels. In order to improve uniformity, highly-conductive metal bus lines may be deposited in electrical contact with the TCO electrode to provide improved current distribution across the panel. Bus lines can help distribute current more evenly across the entire panel with very little power loss. A similar approach may be applied to top-emission OLED devices, where a semi-transparent cathode is required. In this instance, uniformity may be improved by depositing highly conductive metal bus lines in electrical contact with the cathode. In a transparent OLED device, highly conductive metal bus lines may be deposited in electrical contact with both electrodes.

The conventional way to pattern metal bus lines is through photolithography followed by a lift-off process. Many published materials have taught that an insulating layer (such as $SiO_2$ or a photo-resist) is required to cover the bus lines to prevent shorting. U.S. Patent Application Pub. No. US 2003/0006697 by Weaver discloses such a device including a first electrode, an insulating strip disposed over a portion of the first electrode, and a bus line disposed on top of the insulating strip, such that the bus line is electrically insulated from the first electrode by the insulating strip. International Patent Application Pub. No. WO 2010/038181 A1 by Schwab et al. ("Schwab") also describes an OLED device where bus (shunt) lines are applied to an electrode. Schwab goes on to describe how passivation (electrical insulation) at least partially and preferably totally covering the bus lines is required to prevent electrical shorting to an opposing electrode. In fact, it has become a standard practice in the industry to use an insulating layer (e.g., $SiO_2$, SiN, polyimide etc.) to cover the bus lines to prevent electrical shorts occurring between the bus lines and the opposing electrode.

However, introducing an insulating layer, or grid, such as those described in the foregoing publications, can reduce the emissive area since the area covered by the insulating material is non-emissive. In addition, shelf life of the OLED may be reduced if moisture is stored in the insulating layer. Finally, bus lines and the insulating layer are typically patterned using photolithography, which is time-consuming and expensive.

SUMMARY OF THE INVENTION

According to aspects of the invention, systems and methods for the design and fabrication of OLEDs, including high-performance large-area OLEDs, are provided. In embodiments, fabrication processes may be used to deposit and pattern bus lines with a smooth profile and a gradual sidewall transition. Such smooth profiles and gradual sidewall transitions have been found by the inventors to, for example, reduce the probability of electrical shorting at the bus lines. Accordingly, in certain embodiments, an insulating layer may no longer be considered essential, and may be optionally avoided altogether. In cases where an insulating layer is not used, further enhancements in the emissive area and shelf life of the device may be achieved as well. As discussed further herein, by depositing and patterning bus lines according to the described methods, improvements in the luminance uniformity of large-area OLED light panels may also be achieved.

According to further aspects of the invention, systems and methods for the design and fabrication of OLEDs, including one or more relatively-large OLED devices, may also be provided. In embodiments, the bus lines and/or an insulator may be patterned, by vapor deposition, through a shadow mask.

In embodiments, bus lines and/or insulators such as those described herein may be deposited, and patterned, using vapor deposition such as vacuum thermal evaporation (VTE) through a shadow mask, which may simplify the fabrication process by eliminating, for example, multiple photolithography steps. Other vapor deposition systems and methods may include, among others, sputter deposition, e-beam evaporation and chemical vapor deposition (CVD).

According to first aspects of the invention, a method of manufacturing a light emitting panel with a plurality of bus lines may include forming a first electrode layer and forming an organic layer stack over the first electrode layer. A second electrode layer may be formed over the organic layer stack. Embodiments may include patterning a plurality of bus lines by vapor deposition through a shadow mask on at least one of the first electrode layer, the second electrode layer, or such other layers that may allow the bus lines to be electrically connected to the first electrode layer and/or the second electrode layer. In embodiments, the plurality of bus lines may be in electrical contact with at least one of the first electrode layer and the second electrode layer. For example, an electrical contact may be formed by depositing the bus lines on an electrode layer and/or depositing an electrode layer on the bus lines.

In embodiments, the plurality of bus lines may be in electrical contact with the first electrode layer and the first electrode layer may be deposited before the plurality of bus lines. In embodiments, the plurality of bus lines may be in electrical contact with the first electrode layer and the plurality of bus lines may be deposited before first electrode layer. In embodiments, the plurality of bus lines may be in electrical contact with the second electrode layer and the second electrode layer may be deposited before the plurality of bus lines. In embodiments, the plurality of bus lines may be in electrical contact with the second electrode layer and the plurality of bus lines may be deposited before the second electrode layer. In embodiments, a first set of the plurality of bus lines may be in electrical contact with the first electrode layer and a second set of the plurality of bus lines may be in electrical contact with the second electrode layer.

In embodiments, a final profile shape of the bus lines may substantially correspond to a profile shape of the bus lines as deposited. In embodiments, the patterning of the plurality of bus lines may include at least one of vacuum thermal evaporation (VTE) deposition, sputter deposition, e-beam evaporation and chemical vapor deposition (CVD). For example, the patterning of the plurality of bus lines may include deposition by VTE through the shadow mask.

In embodiments, the patterning of the plurality of bus lines may include at least one of (a) selecting a thickness of the shadow mask; (b) selecting a position of a material source with respect to the shadow mask; and (c) controlling the gap between the substrate and the shadow mask based on the desired final profile shape of the bus lines. In embodiments, the thickness of the shadow mask may be in a range of approximately 20 microns to 500 microns. In embodiments, the angle between the line connecting source and center of the substrate and the normal line of the substrate may be in a range of approximately 0° to 20°.

In embodiments, a spacer mask may be inserted between the substrate and the shadow mask. The thickness of the spacer mask may be used for controlling the gap between the substrate and the shadow mask based on the desired final profile of the bus lines.

In embodiments, the organic layer stack may be grown on the bus lines without an interceding insulator. In alternative embodiments, an insulator may be formed between the organic layer stack and the bus lines. The insulator may be formed between organic layer stack and the bus lines without breaking vacuum. The final profile of the insulating layer may correspond to the profile of the insulating layer as formed.

In embodiments, the forming of the first electrode layer, the patterning of the bus lines, the forming of the organic layer stack, and/or the forming of the second electrode layer may be performed without wet processing.

In embodiments, the first electrode may be an anode, the first electrode may be pre-patterned, and the forming of the organic layer stack, the forming of the second electrode layer, the patterning of the bus lines and the patterning of the insulator may be performed without wet processing and/or without breaking vacuum.

In embodiments, a slope angle of a sidewall of the bus line may be in a range of, for example, 0.01°-30°, the slope angle measured based on a line between two points on the bus line sidewall at 10% and 90% respectively of bus line thickness. In embodiments, the maximum absolute value of the second derivative of the sidewall profile of the bus line layer with respect to distance along the substrate surface may be, for example, <1.0. A root-mean-square (RMS) value of surface roughness of the bus line layer along the sidewall may be, for example, <30 nm.

In embodiments, the thickness of the insulator may be at least the same as that of the bus line. In embodiments, the thickness of the insulator may be at least 30% greater than that of the bus line.

In embodiments, an electrode layer may be formed before the bus lines are patterned. In other embodiments, the bus lines may be patterned before an electrode layer is formed. In embodiments, an anode may be formed between the organic stacks and a substrate. In embodiments, a cathode may be formed between the organic stacks and a substrate. In embodiments, an electrode layer may be formed on both sides of the bus lines.

According to further aspects of the invention, a light emitting panel device may include a first electrode layer and a plurality of bus lines patterned by vapor deposition. In embodiments, the light emitting panel may also include an organic layer stack over the first electrode layer and the bus lines, and a second electrode layer over the organic layer stack. In embodiments, the plurality of bus lines may include a final profile shape substantially as deposited.

In embodiments, the organic layer stack of the device may be on the bus lines without an interceding insulator. In alternative embodiments, the device may include an insulator between the organic layer stack and the bus lines. The insulator may be formed between organic layer stack and the bus lines without breaking vacuum. The final profile of the insulating layer may correspond to the profile of the insulating layer as formed. In embodiments, a spacer mask may be inserted between the substrate and the shadow mask for patterning the insulator, and the thickness of the spacer mask may be used for controlling the gap between the substrate and the shadow mask based on the desired final profile of the insulator. In embodiments, the shadow mask of the insulator may be the same mask as the shadow mask of the bus lines.

In embodiments, a slope angle of a sidewall of the bus line layer of the device may be in a range of 0.01°-30°. In embodiments, the maximum absolute value of the second derivative of the sidewall profile of the bus line layer of the device with respect to distance along the substrate surface may be <1.0. In embodiments, a root-mean-square (RMS) of surface roughness of the bus line layer along the sidewall may be <30 nm According to further aspects of the invention, another light emitting panel device may include a first electrode layer and a plurality of bus lines, with an organic layer stack over the first electrode layer and the bus lines. A second electrode layer may be included over the organic layer stack. In embodiments, the plurality of bus lines may include a final profile shape having sidewall angles in a range approximately between 0.01°-30°. The organic layer stack may be, for example, on the bus lines without an interceding insulator. Embodiments may include an insulator between the organic layer stack and the bus lines.

In embodiments, the sidewall angle may be measured based on a line between two points on the bus line slope at 10% and 90% respectively of bus line thickness.

In embodiments, the final profile shape may have sidewall angles, for example, in a range approximately between 0.01°-20°, or between 0.01°-10°, or between 0.01°-1°.

In embodiments, the maximum absolute value of the second derivative of the sidewall of the bus line layer with respect to distance along the substrate surface may be <1.0, and/or an RMS surface roughness of the bus line layer along the sidewall may be <30 nm.

According to further aspects of the invention, another method of manufacturing a light emitting panel may include forming a first electrode layer; forming an organic layer stack over the first electrode layer; forming a second electrode layer over the organic layer stack; and patterning, by vapor deposition through a shadow mask, at least one of (a) a plurality of bus lines in electrical contact with at least one of the first electrode layer or the second electrode layer, or (b) an insulator. In embodiments, at least one single OLED device having at least one of a shortest dimension in plan view of greater than approximately 2 cm, and/or an active area greater than approximately 10 cm$^2$ plan view, may be formed. In embodiments, a single device may refer to an OLED device that can be separately addressed. In embodiments, a lighting panel may comprise only one single OLED device. Alternatively, exemplary panels may comprise a plurality of pixels, one or more of which may be considered a single device. For example, if the pixels are connected in parallel (e.g. as light stripes), the entire panel may be considered as a single device, e.g. because the plurality of pixels are not separately addressed. By way of further example, if the pixels are connected in series, a pixel may also be considered to be a single device.

In embodiments, at least one single OLED device may have at least one of a shortest dimension in plan view of greater than approximately 5 cm, and/or an active area greater than approximately 25 cm$^2$ plan view, may be formed In embodiments, the insulator may be patterned by vapor deposition through a shadow mask. The patterning of the insulator may include at least one of vacuum thermal evaporation (VTE) deposition, sputter deposition, e-beam evaporation and chemical vapor deposition (CVD).

In embodiments, a final profile shape of the insulator may correspond to a profile shape of the insulator as deposited.

In embodiments, the insulator may comprise at least one of LiF or SiO$_2$. In embodiments, the insulator may comprise an ETL or EIL layer, which may include, for example, LiF or LiQ. In embodiments, the insulator may comprise a dielectric layer, which may include, for example, silicon oxide, aluminum oxide or silicon nitride.

In embodiments, the insulator may be disposed between the bus line and the organic layer stack. In embodiments, the insulator may be disposed between the first electrode and the organic layer stack. In embodiments, the insulator may be disposed between the second electrode and the organic layer stack. In embodiments, the insulator may be disposed to cover at least the edges of the bus lines from contacting with the organic layer. In embodiments, the insulator may be disposed to cover the edges of the first or second electrode from contacting with the organic layer.

In embodiments, the panel may be formed on a flexible substrate. The substrate may be, for example, a plastic substrate, and may include PET or PEN. In embodiments, the substrate may have a thickness of, for example, less than 200 µm.

In embodiments, the forming of the first electrode layer, the forming of the organic layer stack, the forming of the second electrode layer, the patterning of the bus lines and the patterning of the insulator may be performed without wet processing.

In embodiments, the forming of the first electrode layer, the forming of the organic layer stack, the forming of the second electrode layer, the patterning of the bus lines and the patterning of the insulator may be performed without breaking vacuum.

In embodiments, the insulator may be patterned by deposition to substantially correspond to a pattern of the plurality of bus lines. In embodiments, a spacer mask may be inserted between the substrate and the shadow mask for patterning the insulator, and the thickness of the spacer mask may be used for controlling the gap between the substrate and the shadow mask based on the desired final profile of the insulator. In embodiments, the shadow mask of the insulator may be the same mask as the shadow mask of the bus lines.

In embodiments, the patterning of at least one of the bus lines or insulator may include at least one of (a) selecting a thickness of the shadow mask, (b) selecting a position of a material source with respect to the shadow mask and (c) controlling the gap between the substrate and the shadow mask based on the desired final profile shape of the bus lines or insulator.

In embodiments, the organic layer stack may be grown on the bus lines without an interceding insulator.

In embodiments, the insulator may be formed between the organic layer stack and the bus lines.

According to further aspects of the invention, another light emitting panel may include a first electrode layer; an organic layer stack over the first electrode layer; a second electrode layer over the organic layer stack; and a plurality of bus lines in electrical contact with at least one of the first electrode layer and the second electrode layer, an insulator between the first electrode layer and the second electrode layer; and a single PLED device having at least one of a shortest dimension in plan view of greater than approximately 2 cm, or an active area greater than approximately 10 cm$^2$ plan view. In embodiments, the bus lines and/or the insulator may be patterned by vapor deposition through a shadow mask.

In embodiments, the plurality of bus lines may include a final profile shape having sidewall angles in a range approximately between, for example, 0.01°-30°, 0.01°-20°, 0.01°-10°, or 0.01°-1.0°

In embodiments, the sidewall angle may be measured based on a line between two points on the sidewall slope at 10% and 90% respectively of bus line thickness.

In embodiments, the maximum absolute value of the second derivative of the sidewall of the bus line layer may be <1.0.

In embodiments, a RMS surface roughness of the bus line layer along a sidewall may be <30 nm.

In embodiments, the insulator may be formed without breaking a vacuum formed during patterning of the bus lines by vapor deposition.

In embodiments, the final profile shape of the insulator may correspond to a profile shape of the insulator as deposited. In embodiments, the insulator may be formed by inserting a spacer mask between the substrate and the shadow mask for patterning the insulator, and the thickness of the spacer mask may be used for controlling the gap between the substrate and the shadow mask based on the desired final profile of the insulator. In embodiments, the shadow mask of the insulator may be the same mask as the shadow mask of the bus lines.

According to further aspects of the invention, another method of manufacturing a light emitting panel may include forming a first electrode layer; forming an organic layer stack over the first electrode layer; forming a second electrode layer over the organic layer stack; forming a plurality of bus lines in electrical contact with at least one of the first electrode layer or the second electrode layer; and patterning an insulator by vapor deposition through a shadow mask. In embodiments, the insulator may be configured to electrically insulate the bus lines from organic layer stack.

In embodiments, the insulator may be an Electron Transportation layer (ETL) or Electron Injection layer (EIL) material, such as Liq. In embodiments, the insulator may include a reverse biased diode, formed with other organic layers, that blocks charge flow.

In embodiments, the insulator may be disposed fully or partially covering the bus lines, e.g. the insulator may cover all or part of a top or side of the bus line. In embodiments, the insulator may be disposed as separate lines covering opposite sides of a bus line. In embodiments, the insulator may be disposed between the organic layer and first electrode. In embodiments, the insulator may be disposed to cover the edges of first electrode from contacting the organic layer. In embodiments, a spacer mask may be inserted between the substrate and the shadow mask for patterning the insulator, and the thickness of the spacer mask may be used for controlling the gap between the substrate and the shadow mask based on the desired final profile of the insulator. In embodiments, the shadow mask of the insulator may be the same mask as the shadow mask of the bus lines.

In embodiments, the a brightness of the panel may be greater than, for example, 1,000 cd/m². In embodiments, a luminance uniformity of the panel may be, for example, greater than 70% at 1,000 cd/m².

Additional features, advantages, and embodiments of the invention may be set forth or apparent from consideration of the following detailed description, drawings, and claims. Moreover, it is to be understood that both the foregoing summary of the invention and the following detailed description are exemplary and intended to provide further explanation without limiting the scope of the invention claimed. The detailed description and the specific examples, however, indicate only preferred embodiments of the invention. Various changes and modifications within the spirit and scope of the invention will become apparent to those skilled in the art from this detailed description.

BRIEF DESCRIPTION OF THE DRAWINGS

The accompanying drawings, which are included to provide a further understanding of the invention, are incorporated in and constitute a part of this specification, illustrate embodiments of the invention and together with the detailed description serve to explain the principles of the invention. No attempt is made to show structural details of the invention in more detail than may be necessary for a fundamental understanding of the invention and various ways in which it may be practiced. In the drawings.

DETAILED DESCRIPTION

Figure 1:
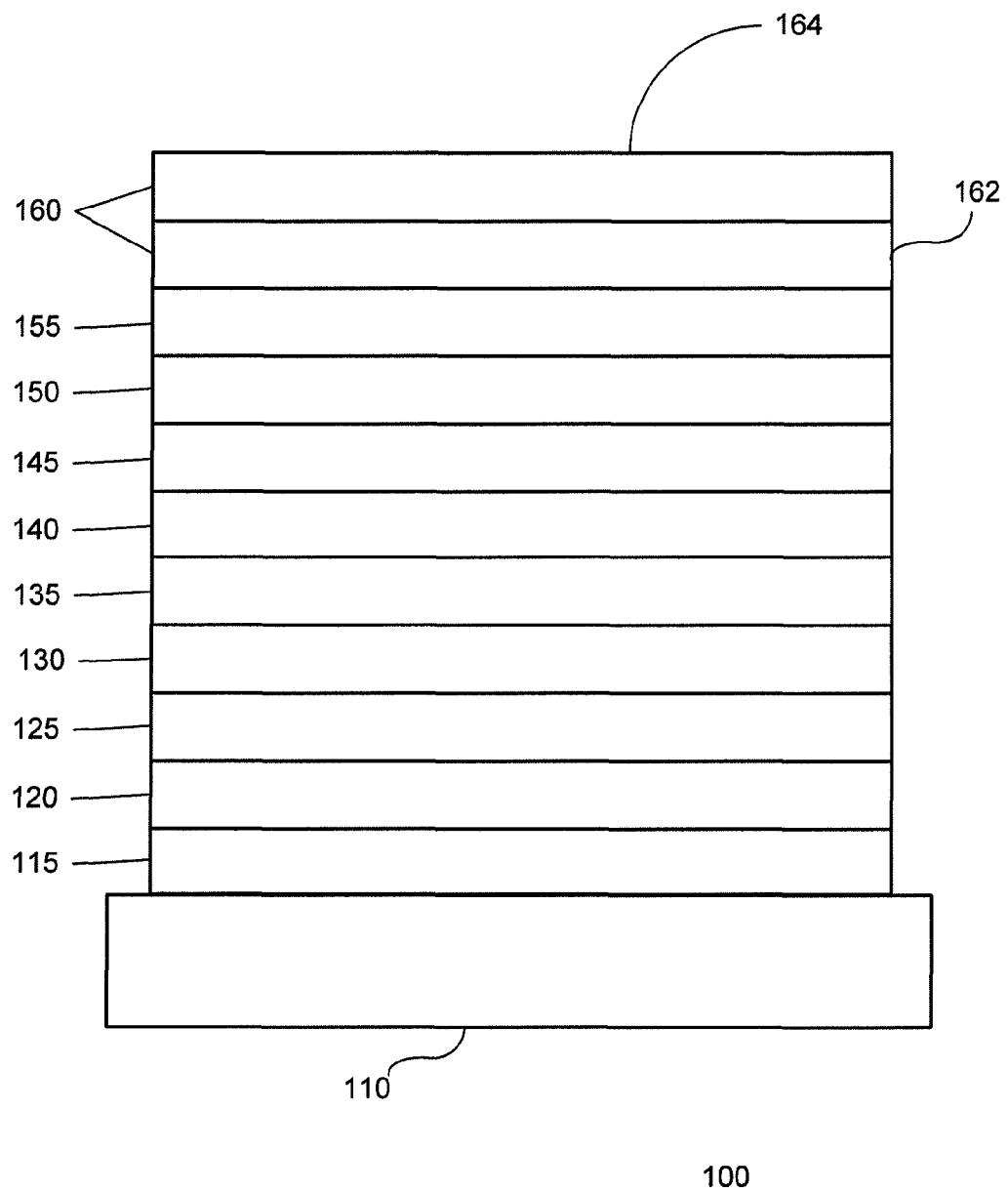
FIG. 1 shows an organic light emitting device.

It is understood that the invention is not limited to the particular methodology, protocols, and reagents, etc., described herein, as these may vary as the skilled artisan will recognize. It is also to be understood that the terminology used herein is used for the purpose of describing particular embodiments only, and is not intended to limit the scope of the invention. It also is be noted that as used herein and in the appended claims, the singular forms "a," "an," and "the" include the plural reference unless the context clearly dictates otherwise. Thus, for example, a reference to "a bus line" is a reference to one or more bus lines and equivalents thereof known to those skilled in the art.

Unless defined otherwise, all technical and scientific terms used herein have the same meanings as commonly understood by one of ordinary skill in the art to which the invention pertains. The embodiments of the invention and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the invention. The examples used herein are intended merely to facilitate an understanding of ways in which the invention may be practiced and to further enable those of skill in the art to practice the embodiments of the invention. Accordingly, the examples and embodiments herein should not be construed as limiting the scope of the invention, which is defined solely by the appended claims and applicable law. Moreover, it is noted that like reference numerals reference similar parts throughout the several views of the drawings.

The following preferred embodiments may be described in the context of exemplary OLED devices for ease of description and understanding. However, the invention is not limited to the specifically described devices and methods, and may be adapted to various circuit assemblies without departing from the overall scope of the invention. For example, devices and related methods including concepts described herein may be used for the assembly of microchips, optoelectronic devices, such as solar cells and photodetectors, and other apparatus with multi-layer circuitry.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
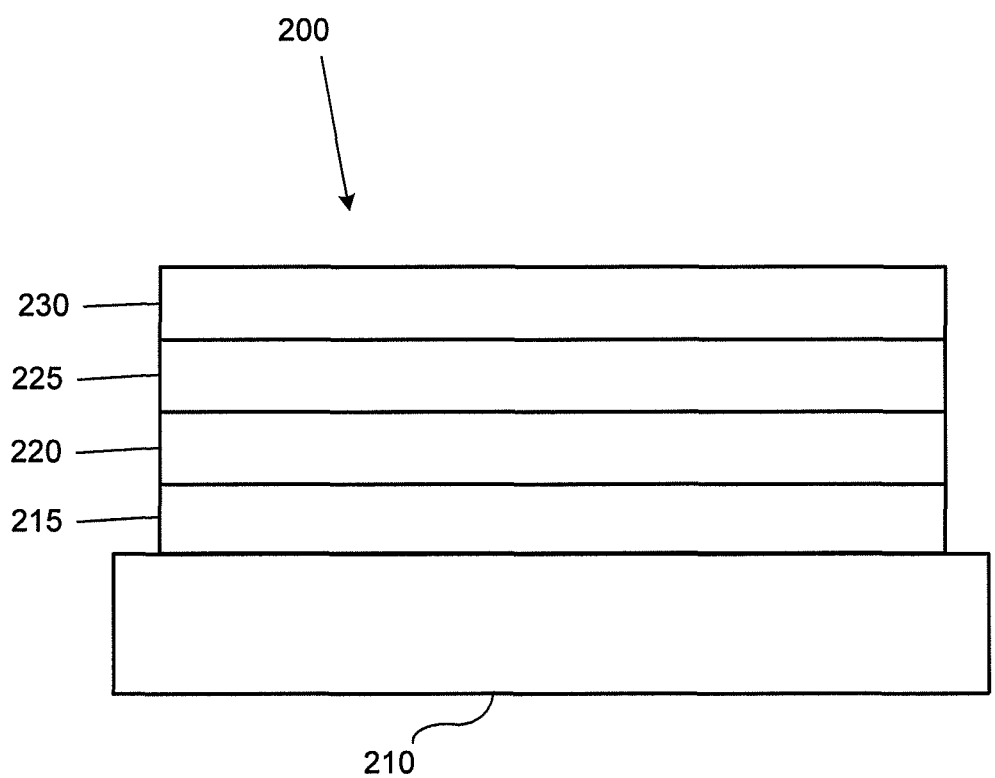
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

As mentioned previously, the conventional method to form bus lines is photolithography patterning, followed by a lift-off step. Aspects of the present invention, and comparisons to other known fabrication techniques and devices are discussed further with respect to FIG. 3, which depicts a OLED panel 300, with emissive areas 310 and bus lines 320.

A typical OLED device comprises anode, organic layers and cathode. Either the anode or cathode is typically a TCO or thin metal, which has high resistivity. When scaling up to large area, luminance uniformity degrades due to voltage drop across the high resistivity electrode. There are two means to address this problem. The first is to build a plurality of small-area OLEDs and connect them in series, such as described in U.S. Pat. No. 7,034,470 and U.S. Pat. No. 7,576,496. However, such configurations usually generate more non-emissive regions due to the interconnection between two adjacent devices and may reduce the aperture ratio. In order to minimize interconnections, an additional spacer (such as in U.S. Pat. No. 7,034,470) or interconnect metal (such as in U.S. Pat. No. 7,576,496) needs to be inserted between pixels, which then involves photo lithography and/or etching steps. On the other hand, highly conductive metal bus lines are commonly disposed over TCO anode (or cathode) to reduce the sheet resistance of TCO anode and so as to improve the uniformity. An insulating layer is conventionally necessary to cover the metal bus lines to prevent shorting. Bus lines and insulator are typically patterned through photo lithography followed by lift-off or etching step. This is a complicated process that may include spin-coating photo resist, UV exposure through photo mask, developing photo resist, metal or dielectric evaporation, lift-off, etching, stripping off photo resist and high temperature post baking. Substantial handling and wet processes are involved in such steps. Handling may undesirably attract particles to be adhered onto the surface of the substrate and cause potential electrical short. Additionally, moisture may be trapped in the insulating grid, such as polyimide, due to the wet processing, or the material properties. Other type of defects, such as photo resist residuals and metal flakes from lift-off step, may also be introduced during such processes.

According to aspects of the invention, in embodiments, all layers of large-area OLED light panel may be completed through vacuum deposition without any wet process. Metal bus lines may be deposited, for example, inside VTE chamber through shadow mask in order to improve luminance uniformity. Other vacuum deposition means, such as e-beam evaporation may also be used to dispose metal bus lines. Insulating material may be deposited using VTE through shadow mask, or may be deposited using Plasma Enhanced Chemical Vapor Deposition (PECVD) through shadow mask. Insulating material may be disposed to cover the edge of electrode to prevent shorting. Insulating materials may also be disposed over bus lines to prevent shorting and charge injection, but is not necessary. Some advantages of processes as described herein may include one or more of: 1) simple fabrication process, 2) less handling so that less defects and potential shorting are introduced; 3) no wet process, such that the moisture level kept inside the device is significantly reduced and a longer lifetime may be achieved; 4) insulator formed using vacuum deposition contains less moisture than polyimide, which may improve device lifetime, and it is also simpler process than using other inorganic insulators such as silicon nitride which requires additional etching steps; 5) insulator is not necessary to be disposed over bus lines, owing to the gentle edge profile and smooth surface of bus lines patterned through shadow masks inside vacuum chamber. By using simplified processes such as those described herein, the inventors have demonstrated a large-area OLED light panel that achieved brightness greater than 1,000 cd/m$^2$ and luminance uniformity greater than 70% at 1,000 cd/m$^2$.

According to aspects of the invention an alternative means of depositing and patterning metal bus lines using, for example, vacuum thermal evaporation through a shadow mask has been developed. Such processes have been shown to be, in general, simpler and less expensive than photolithography. Moreover, according to further aspects of the invention, wet processes may be avoided, which can serve to reduce the amount of moisture that is retained in the device so as to extend the device shelf lifetime. As discussed further herein, the inventors have demonstrated, for example, a large area OLED light panel with a device layer structure including a first electrode, bus lines, a second electrode and an emissive layer, in which the metal bus lines may be patterned through VTE, and the like, followed by direct deposition of the organic layers. An increased emissive area can be achieved due to the elimination of non-emissive insulating layer which is conventionally deposited on to metal bus lines to prevent shorting. This can lead to increased total light output for a given luminance, which in turn improved device lifetime and efficiency.

Figure 3:
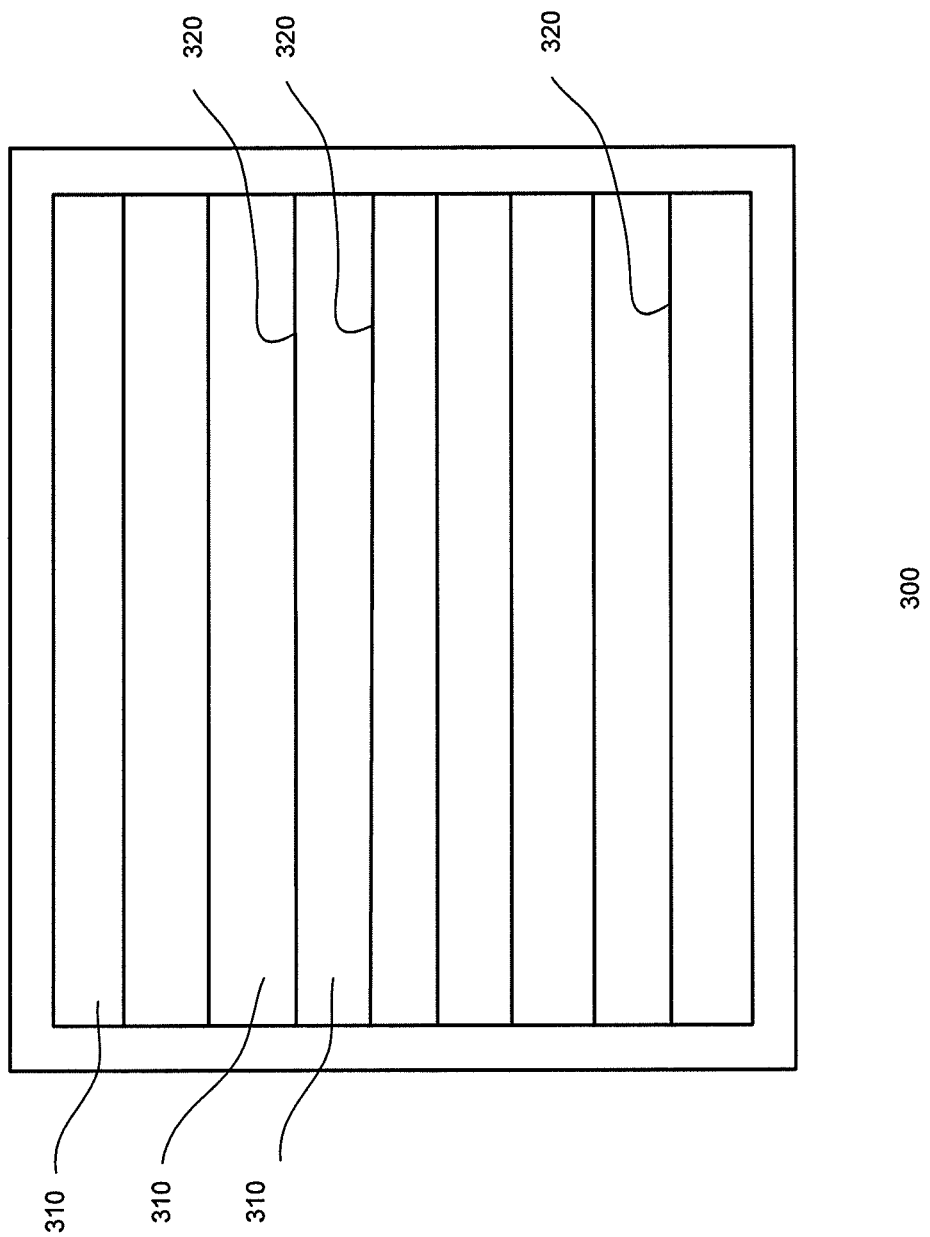
FIG. 3 shows an exemplary large-area OLED light panel with metal bus lines.
Figure 4:
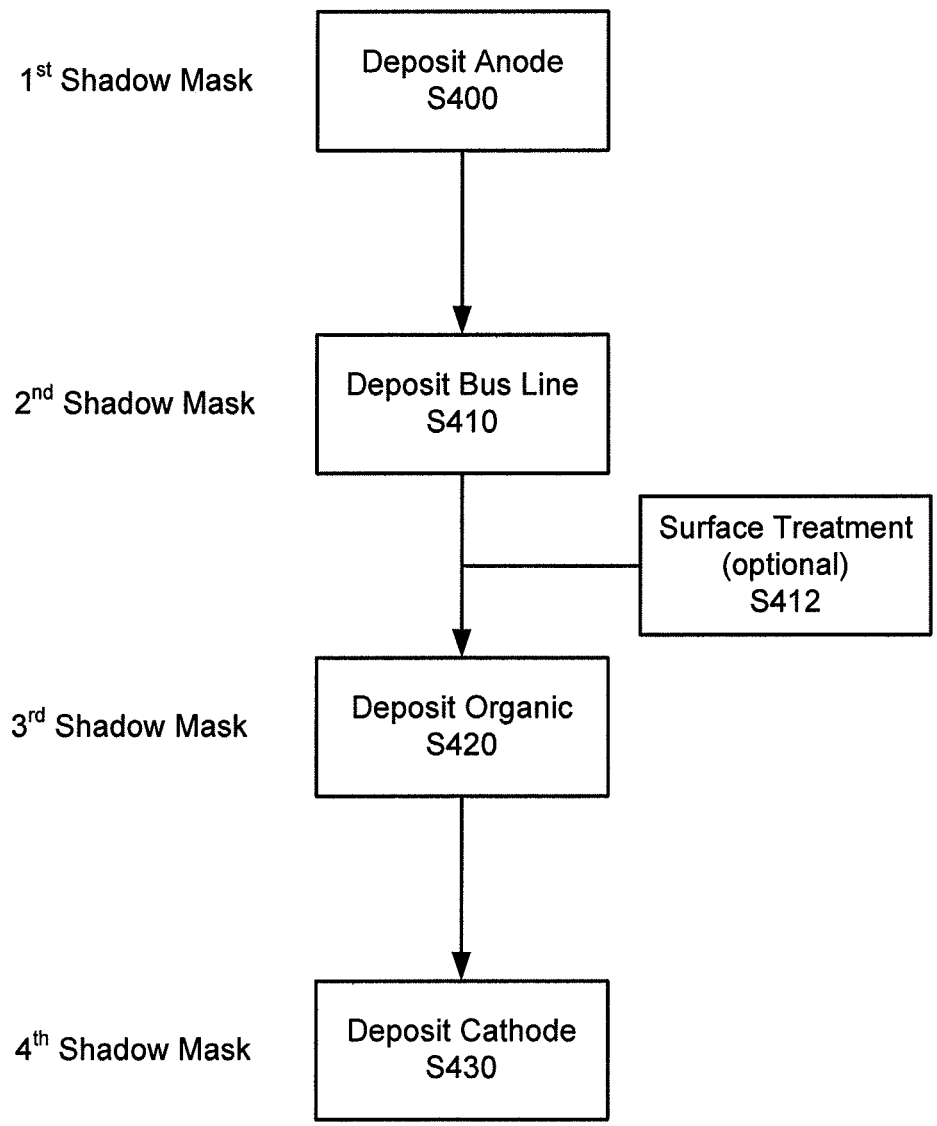
FIG. 4 shows an exemplary process for forming OLED devices according to aspects of the invention.

For example, a process of manufacturing an OLED lighting panel including bus lines, such as those generally depicted in FIG. 3, may include steps shown in FIG. 4. The method may begin with S400 in which a first electrode may be deposited. The first electrode may be an anode. In other embodiments, the first electrode may be a cathode. In embodiments, the first electrode may be deposited through a first shadow mask. The method may continue with S410.

In S410, a plurality of bus lines may be patterned by vapor deposition through a second shadow mask. In embodiments, the patterning of the plurality of bus lines may include at least one of vacuum thermal evaporation (VTE) deposition, sputter deposition, e-beam evaporation and chemical vapor deposition (CVD), or other similar techniques known in the art. For example, the patterning of the plurality of bus lines may include deposition by VTE through the shadow mask. As discussed further below, such patterning may result in a desirable profile of the bus lines without, for example, further patterning steps. That is, a final profile shape of the bus lines may substantially correspond, or directly correspond, to a profile shape of the bus lines as they were deposited in S410.

It is noted that FIG. 4 depicts a manufacturing process where the first electrode is deposited before the bus lines. In an alternative process, the bus lines may be deposited before the first electrode, e.g. the bus lines may be deposited on a substrate and the first electrode formed on the bus lines and substrate. Such methods may be beneficial, for example, in providing a flat interface, without bus lines, between a first electrode layer and an organic stack formed over the first electrode layer. The method may continue with optional step S412.

In S412 a surface treatment, or other process, may be applied to form an insulating layer over the bus lines deposited in S410. The insulating layer can provide insulation between the metal bus lines and the organic layers to further prevent shorting. The insulating layer can also prevent charge injection from the metal bus lines into the organic layers. In embodiments, such insulating layers, when present, may have a relatively thin profile compared to those formed in conventional techniques owing, for example, to the improved performance of the gradually sloped bus lines. An example of forming an insulating layer in S412 may include exposing an Al bus line surface to oxygen to form an aluminum oxide layer. A further example may include VTE deposition through a shadow mask of insulating material such as $SiO_2$ or SiN over the bus lines. The thickness of the insulating materials may be, for example, <1000 Å. In embodiments, such steps may be performed without breaking vacuum, which may help increase throughput and/or improve device lifetime. In embodiments, the final profile shape of the insulating layer may correspond to a profile shape of the insulating layer as deposited. The method may continue with S420.

In S420, one or more organic layers, e.g. an organic layer stack, may be grown over, and/or on, the bus lines and first electrode, or, if an insulating layer was formed in optional S412, the organic layer(s) may be grown over, and/or on, the insulating layer and first electrode. The organic layer may be deposited through a third shadow mask, or via other techniques known in the art. The method may continue with S430.

In S430, a second electrode may be deposited over the organic layer. The second electrode may be a cathode. In other embodiments, the second electrode may be an anode. The second electrode may be formed, for example, using a fourth shadow mask. Accordingly, and as described further herein, an OLED stack including at least a first electrode, a plurality of bus lines, an organic layer and a second electrode may be manufactured without any wet processing steps. FIG. 4 shows a process flow wherein the first electrode is deposited before the organic layers and before the second electrode. In an alternative embodiment, the second electrode is deposited before the organic layers and before the first electrode, wherein the bus lines are in electrical contact with the first electrode. In an alternative embodiment, separate bus lines are in electrical contact with both the first and second electrodes. Aspects of an exemplary bus line profile are shown in FIG. 5.

Figure 5:
FIG. 5 shows an exemplary cross section illustration of a panel structure, where organic materials of the OLED stack are disposed directly onto the bus lines and anode.

As shown in FIG. 5, a bus line 510 deposited over an a first electrode 500 according to aspects of the invention may include a relatively gradual slope, without sharp corners. In the embodiment shown in FIG. 5, an organic layer 520 is disposed on the bus line 510, and a second electrode 530 is disposed over the organic layer 520. The bus line 510 may be an evaporated metal. Additional details of exemplary bus line 510 are shown in FIG. 6.

A slope angle $\theta$ of a sidewall of the bus line 510 may preferably be in a range of, for example, 0.01°-30°. The slope angle $\theta$ may represent an angle that is measured based on a line L between two points on the bus line sidewall at 10% and 90% respectively of bus line thickness T. In embodiments, the maximum absolute value of the second derivative of the sidewall of the bus line layer with respect to distance along the substrate surface may be, for example, <1.0.

It should be noted that organic layer 520 may be deposited directly on the bus line 510, or, optionally, there may be an insulating layer formed between the organic layer and the bus line. Alternative arrangements, such as the relative positions of the electrodes with respect to the bus lines, are also possible depending, for example, on the desired operation of the device.

Figure 6:
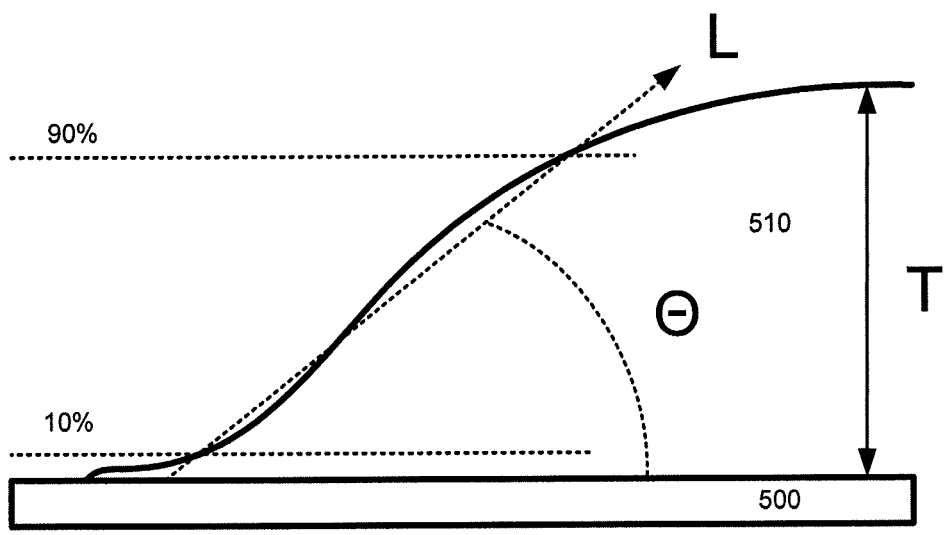
FIG. 6 shows further details of a bus line profile according to aspects of the invention.
Figure 7:
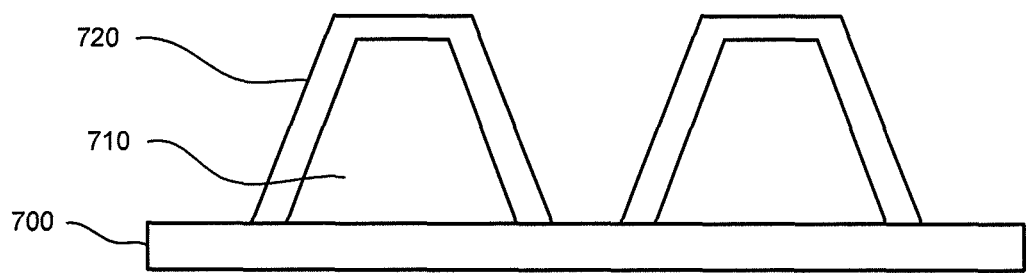
FIG. 7 shows a related art OLED device structure including passivation (insulating layer) on top of metal bus lines.

The profiles shown in FIGS. 5 and 6 may be contrasted with a related art device as shown in FIG. 7. As shown in FIG. 7, a device including metal bus lines 710 over an ITO 700 may be formed by techniques including lithography steps to pattern the metal bus lines 710. At least partly because of the sharp corners and/or relatively steep angle of the sidewalls, which induce strong local electric fields and can potentially cause electrical shorting, a passivation (insulating) layer 720 is required on such devices to avoid short circuits between the bus lines 710 and the OLED cathode (not shown).

Figure 8:
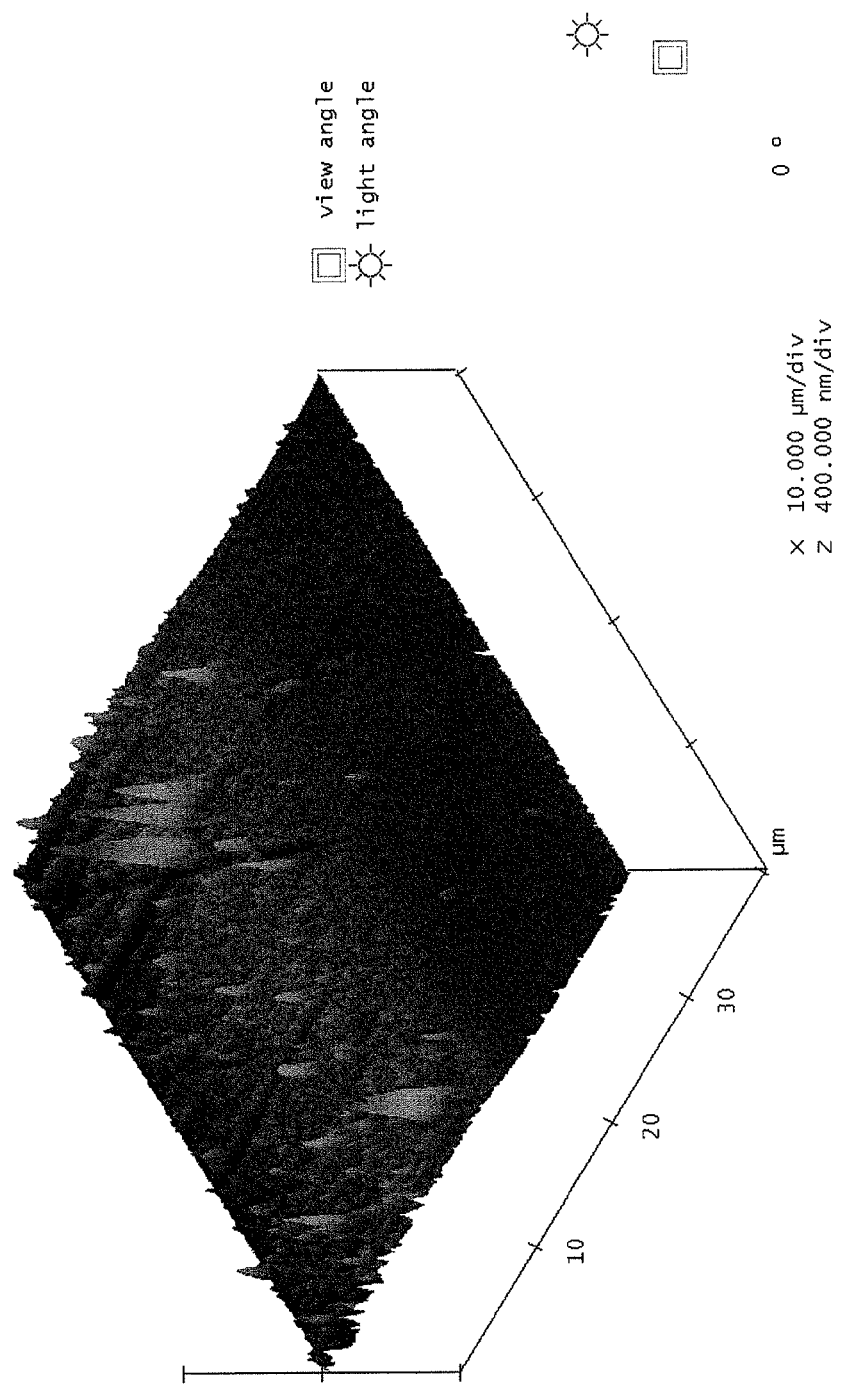
FIG. 8 shows a 3D AFM image of the slope of a bus line deposited by VTE through a shadow mask.
Figure 9:
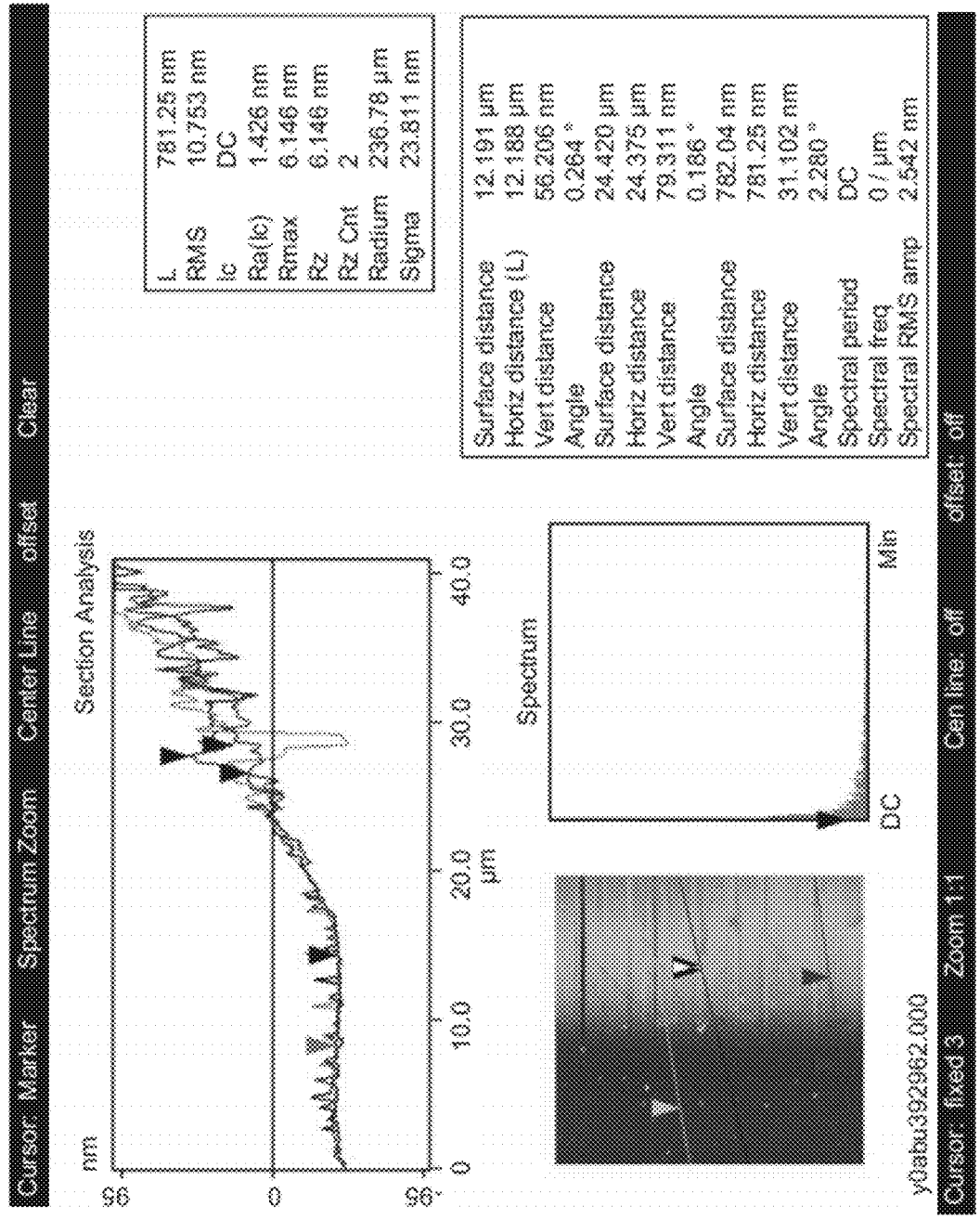
FIG. 9 shows data regarding the RMS of the VTE slope.

A 3D atomic force microscope (AFM) image of the sidewall of an exemplary bus line formed by the inventors by VTE is shown in FIG. 8. Detailed data in FIG. 9 shows that the root-mean-square (RMS) roughness value of the slope is around 11 nm, and the black cursor measures the height of the small peak to be about 31 nm. In embodiments, an RMS surface roughness of the bus line layer along the sidewall may be, for example, approximately, 30 nm or less. Bus lines deposited in this manner may also prove more secure against electrical shorting, compared to other bus lines discussed further herein, owing to a gradual sidewall profile, smooth surface and reduced number of defects.

Such bus line features may allow for OLED devices to be formed by simply growing the OLED structure over the bus lines without a further insulating layer, or with a relatively thin and/or low-resistivity insulating layer compared to known devices. For example, the insulating layer may be required only to prevent charge injection from the bus lines, rather than to prevent electrical shorting.

Returning to FIG. 4, it has been demonstrated by the inventors that the foregoing processes may be performed as an all-vacuum process that could be used to fabricate an OLED light panel. For example, an anode (such as ITO or IZO) may be sputtered through a shadow mask. Then bus lines may be disposed onto the anode as described herein. The organic layers may then be deposited, for example, by VTE through a shadow mask, followed by the cathode through a separate shadow mask. Finally, thin film encapsulation could also be applied in vacuum. Alternatively, a substrate with an electrode and bus lines and optional insulating layer could be fabricated completely in vacuum (e.g. steps S400-S410 or S412 in FIG. 4), and this could then be used to fabricate an OLED lighting panel using any available means.

Figure 10A:
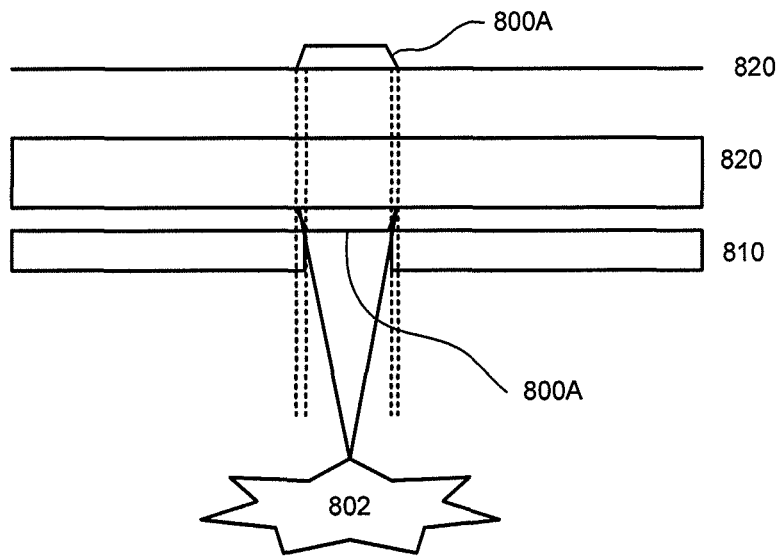
FIGS. 10A-10C show various aspects of changes in source location and mask thickness according to aspects of the invention.

The inventors have further noted that the gradual sidewall profile of metal bus lines deposited through a shadow mask is benefited from a feathering effect during vapor deposition. Owing to a small gap between the mask 810 and the substrate 820, as illustrated in FIG. 10A, which may be caused due to thermal expansion, rotation or weight of the mask, additional materials may be deposited onto the substrate beyond the mask opening. For example, if the gap is 100 μm, and the angle between the edge of mask opening with respect to the center of source material is 10°, additional material will be deposited about 500 μm beyond the mask opening. If the target thickness of the material is 200 nm, very mild slope of the sidewall may be formed with an angle of only 0.02°. Alternatively, if the gap is less than 100 μm, less material may be deposited beyond the mask opening and therefore a steeper slope may be expected. The gap between the mask and substrate is dependent on factors such as mask thickness, mask material, substrate material, deposition temperature etc.

Figure 10B:
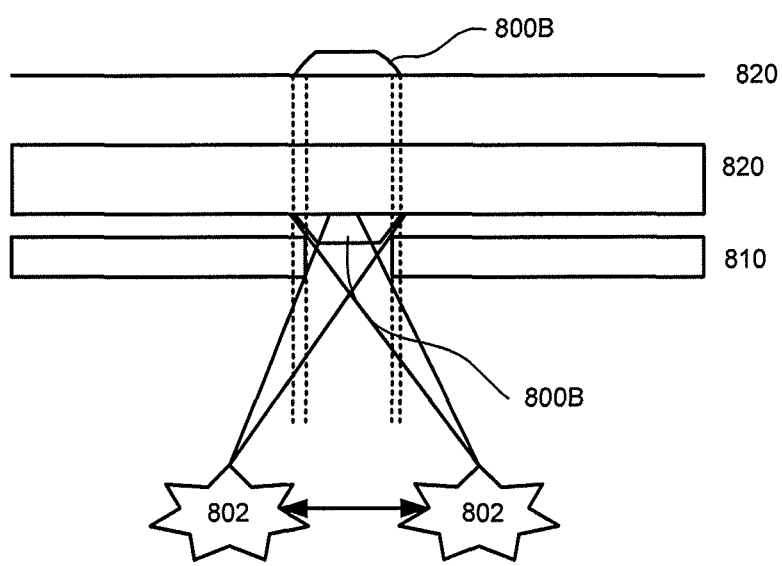
Figure 10C:
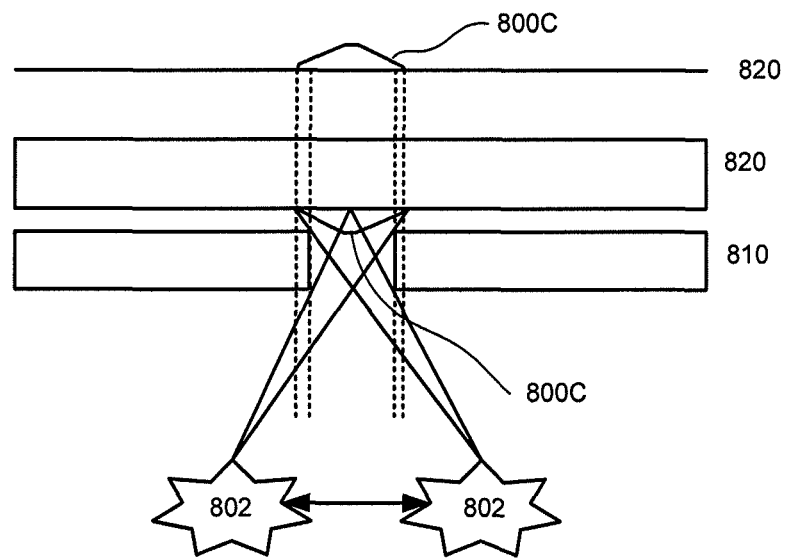

In addition, the inventors have found that the sidewall profile of the VTE deposited bus lines (or other layers, such as the insulator etc.) may be controlled by properly positioning the source material in combination with certain mask thickness, as can be seen in FIGS. 10A-10C. For example, a sharper profile of VTE deposited bus line 800A is illustrated in FIG. 10A, where the source material 802 is positioned at the center, and the bus line 800A is deposited through shadow mask 810 onto a substrate 820. The top portions of FIGS. 10A-10C provide an unobstructed view of the bus line as deposited for clarity.

If the source 802 is positioned at an angle away from the center, the profile may be altered to look like that in FIG. 10B, with a slope at both edges. FIG. 10B shows the source material 802 in different positions. This is for illustration purposes only. In a manufacturing environment, relative changes in deposition angle would most likely be achieved by rotating the substrate, while the source material remains fixed.

If the thickness of the mask 810 increases as shown in FIG. 10C, a more gradual transition of the bus line 800C can be achieved. Accordingly, the patterning of the plurality of bus lines may include at least one of (a) selecting a thickness of the shadow mask, (b) selecting a position of a material source with respect to the shadow mask and (c) controlling the gap between the shadow mask and the substrate based on the desired final profile shape of the bus lines. In this regard, the inventors have found that a thickness of the shadow mask may preferably be in a range of approximately 20 microns to 500 microns.

In some embodiments, a spacer mask may be used for controlling the gap between the shadow mask and the substrate based on the desired final profile shape of the bus lines. A spacer mask may refer to a shadow mask that is inserted between the substrate and the patterning shadow mask and has a larger opening than the patterning shadow mask (i.e., shadow mask). A patterning shadow mask, is a mask with specific openings that will shape the deposited materials into substantially the same pattern. However, the spacer mask is usually an open mask with no specific features and would allow the deposition through the patterning shadow mask with substantially the same pattern, i.e., the pattern may have a different edge profile or slightly wider but the plan view shape is substantially the same as if deposited only through a patterning shadow mask. The spacer mask is inserted to generate gap between the substrate and the shadow mask for controlling the profile of the deposited layer. The thickness of the spacer mask can be tuned to adjust the gap for a desired distance based on the target profile shape of the deposited layer (i.e., bus line).

Figure 11:
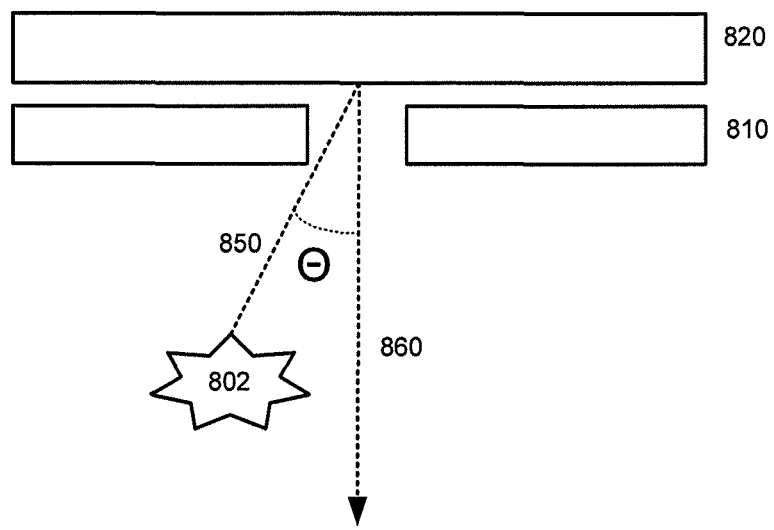
FIG. 11 shows additional details regarding a source location according to aspects of the invention.

As further shown in FIG. 11, the angle θ between the line 850 connecting source and center of the substrate 820 and the normal line 860 of the substrate may be preferably in a range of approximately 0° to 20°.

Figure 12:
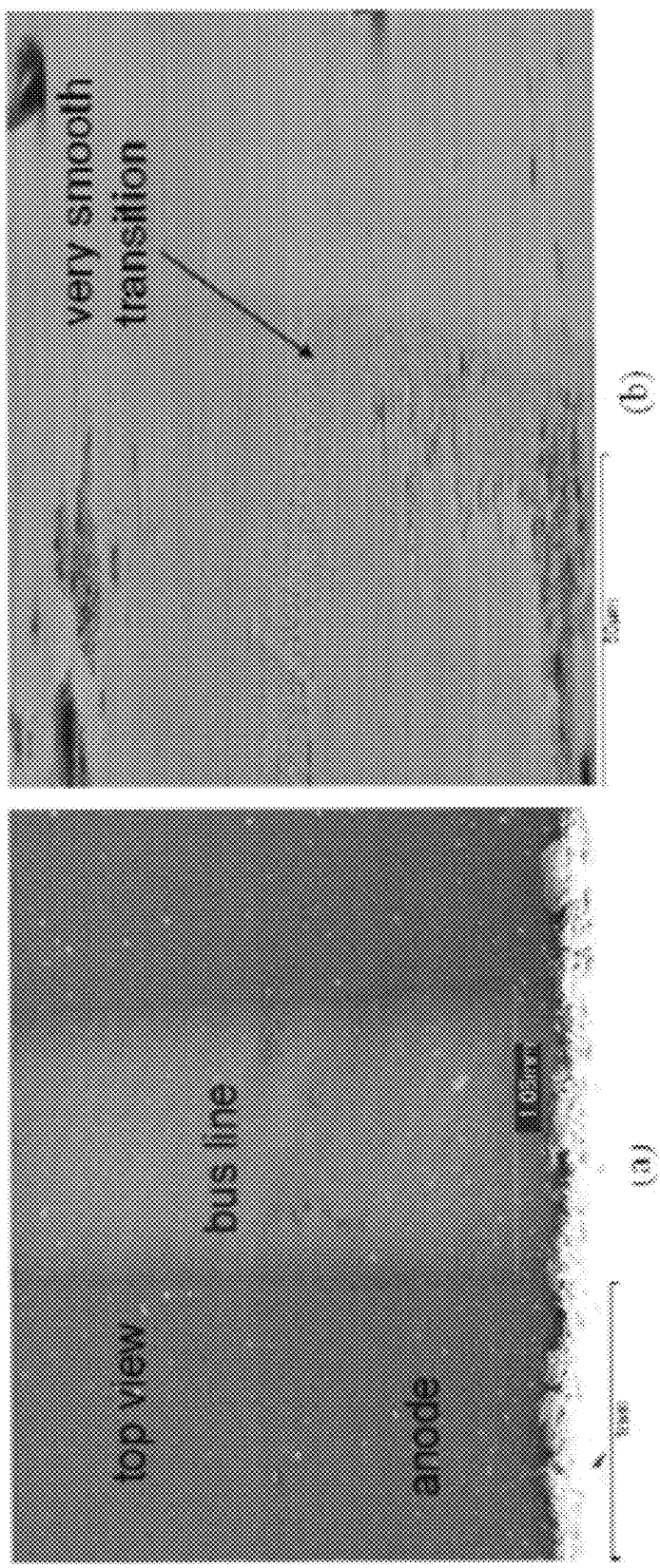
FIG. 12 shows SEM images of (a) top view and (b) side view 2600 Å aluminum bus line deposited by VTE through a shadow mask.
Figure 13A:
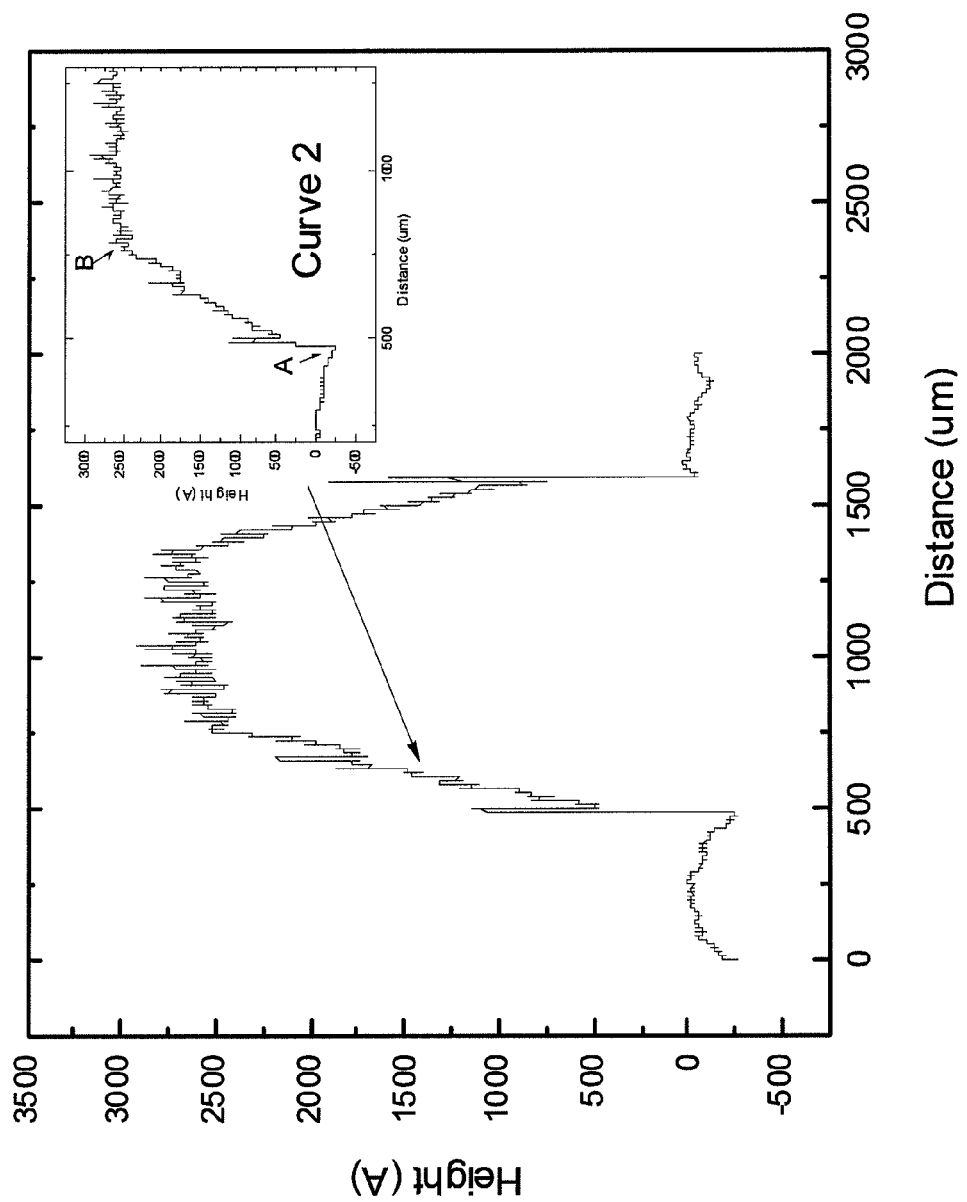
FIGS. 13A-13B show test results of a VTE deposited aluminum metal bus line (Curve 2), and a second derivative of Curve 2, where a smooth transition of about 0.06 is acquired.
Figure 13B:
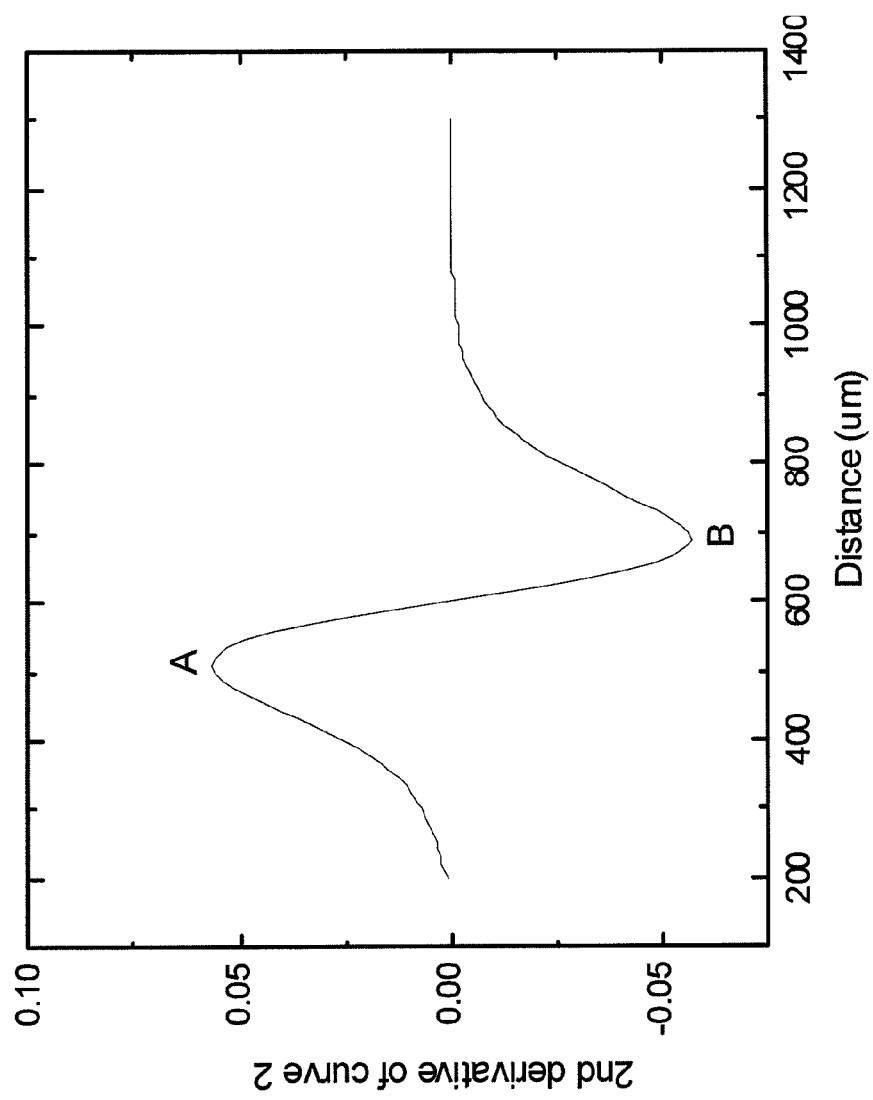

The inventors have produced SEM images of VTE patterned bus line, where very gradual sidewall profile and edge transitions are clearly observed. FIG. 12 is an SEM images of (a) top view and (b) side view of a 2600 Å aluminum bus line deposited by VTE through a shadow mask. FIG. 13A shows an exemplary profile of a tested VTE metal bus line. The extracted slope angle for Curve 2 is approximately 0.05°. The transition rates at Points A and B on this curve also determine the smoothness of the sidewall profile at the edge transition. Mathematically, the rate of change of gradient, i.e. how smooth the transition is at the top and bottom of the bus line, can be acquired by calculating the second derivative of the curve with respect to distance along the substrate surface at these locations. For the purpose of extracting second derivative of points A and B, the profile curve is first smoothed to eliminate local profile variation caused by asperities. The second derivative of the smoothed curve was then calculated. The maximum absolute value of the second derivative of Curve 2 plotted in FIG. 13B is about 0.06, which is about 40 times smaller than that of a curve derived from a conventional processing technique, discussed further below. Accordingly, in embodiments, the maximum absolute value of the second derivative at both edges (points A and B) of the bus line layer may be, for example, less than 1.0, less than 0.5, less than 0.1, etc.

Figure 14:
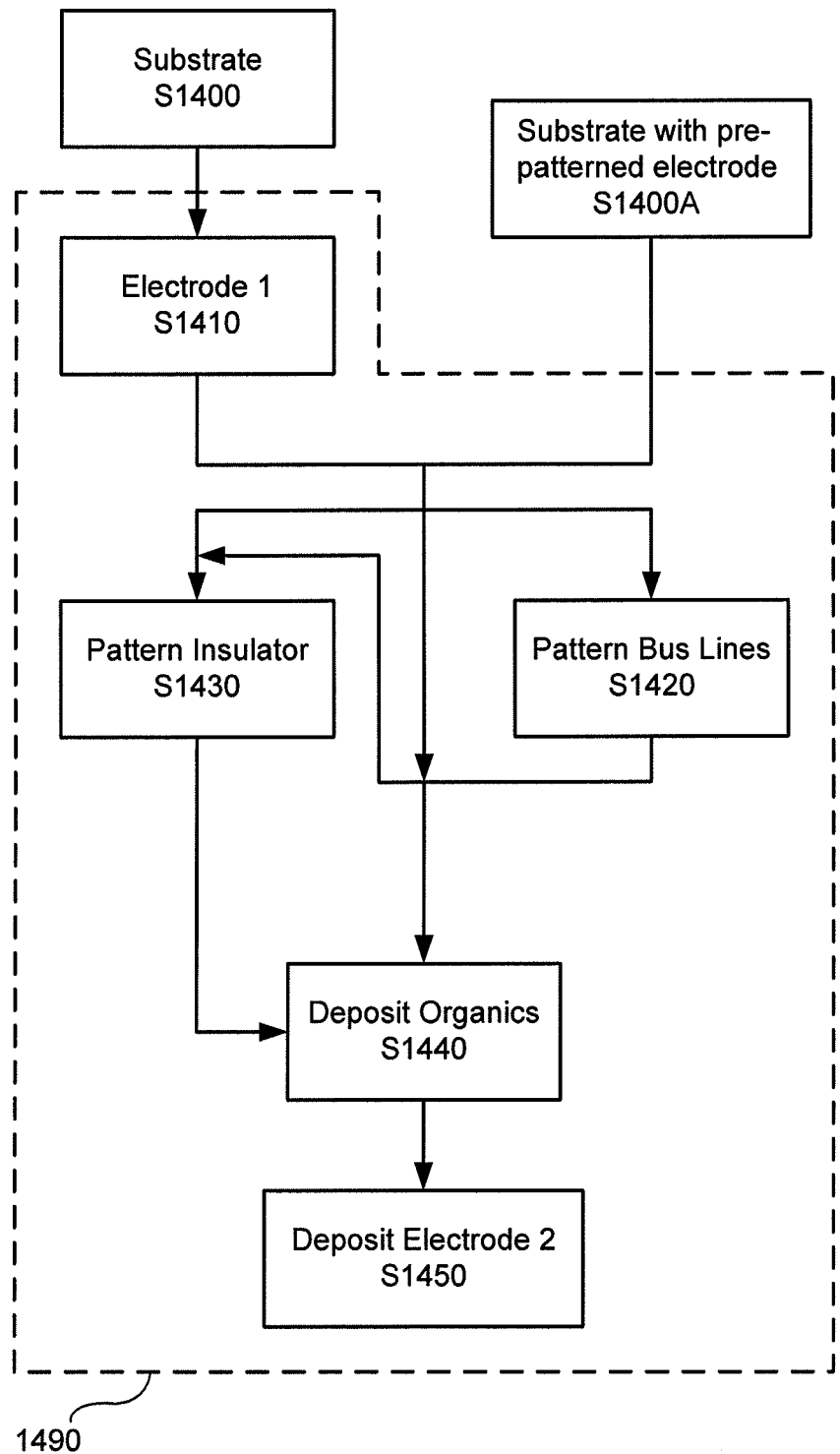
FIG. 14 shows another exemplary process for forming OLED devices according to aspects of the invention.

Another exemplary process of manufacturing an OLED lighting panel according to aspects of the invention may include steps shown in FIG. 14. The method may begin with S1400 in which a substrate is provided. In embodiments, the substrate may be, for example, a flexible substrate, and may include plastic materials such as polyethylene terephthalate (PET) or polyethylene naphthalate (PEN). The substrate may have a thickness of, for example, less than 1 mm, less than 500 μm, or less than 200 μm. The method may continue with S1410.

In S1410, a first electrode may be deposited. The first electrode may be an anode. In other embodiments, the first electrode may be a cathode. In embodiments, the first electrode may be deposited, e.g. by sputtering, through a first shadow mask. It should be noted that the substrate may also include a pre-patterned first electrode, such as shown in S1400A. In such cases, it may not be required to perform a first electrode patterning step, as discussed in optional S1410. The method may continue with optional step S1420.

In S1420, a plurality of bus lines may be deposited, and may be, for example, patterned by vapor deposition through a second shadow mask. In embodiments, the patterning of the plurality of bus lines may include at least one of vacuum thermal evaporation (VTE) deposition, sputter deposition, e-beam evaporation and chemical vapor deposition (CVD), or other similar techniques known in the art. For example, the patterning of the plurality of bus lines may include deposition by VTE through the shadow mask. As discussed further below, such patterning may result in a desirable profile of the bus lines without, for example, further patterning steps. That is, a final profile shape of the bus lines may substantially correspond, or directly correspond, to a profile shape of the bus lines as they were deposited in S1420. In some embodiments, bus lines may be disposed in contact with a cathode to improve the conductivity of cathode. In some embodiments, bus lines may not be essential for the device, i.e., step S1420 may not be present. For example, if the panel comprises a plurality of small-area pixels and they are electrically connected in series, bus lines may not be needed. The method may continue with optional step S1430.

In S1430, an insulator may be deposited, and may be, for example, patterned by vapor deposition through a third shadow mask. In embodiments, the patterning of the insulator may include at least one of vacuum thermal evaporation (VTE) deposition, sputter deposition, e-beam evaporation and chemical vapor deposition (CVD), or other similar techniques known in the art. For example, the patterning of the insulator may include deposition by VTE through the shadow mask. As discussed herein, such patterning may result in a desirable profile of the insulator without, for example, further patterning steps. That is, a final profile shape of the insulator may substantially correspond, or directly correspond, to a profile shape of the insulator as they were deposited in S1430. It is also noted that the pattern of the insulator may substantially correspond to the plurality of bus lines. The insulator may cover the bus lines, run along edges of the bus lines, or cover the edges of the first electrode, etc.

In some embodiments, an insulator may be patterned through the same shadow mask as that of bus lines, i.e. the second shadow mask, but with a spacer mask to create a wider pattern, so that the insulator can cover the edge of the bus lines to prevent shorting. The spacer mask is inserted to generate gap between the substrate and the second shadow mask for controlling the profile of the deposited layer. The thickness of the spacer mask can be tuned to adjust the gap between the substrate and the second shadow mask for a desired distance based on the target profile shape of the insulator, e.g. a wider pattern or a more gradual edge profile than that of bus lines. This may reduce the amount of shadow masks used in the fabrication and therefore reduce the manufacturing cost.

As mentioned above, an insulator refer generally to a material or structure that blocks current from flowing between different layers or structures of a device. Insulators may include materials that are, by themselves, conductive or semi-conductive, but that do not transport charges to and/or from the other layers in the completed device. Such materials may be dielectric materials, such as $SiO_2$, which do not conduct charges themselves. In some embodiments, the insulator may be wide-band gap materials, such as LiF. In other embodiments, the insulator may be Electron Transportation layer (ETL) or Electron Injection layer (EIL) material, such as Liq, which forms a reverse biased diode when disposed between anode and organic layers and thereby blocks charge flow.

The insulator can provide insulation between the metal bus lines and the organic layers to further prevent shorting. The insulator can also prevent charge injection from the metal bus lines into the organic layers. In embodiments, such insulators, when present, may have a relatively thin profile compared to those formed in conventional techniques owing, for example, to the improved performance of the gradually sloped bus lines. A preferred method of forming the insulator is LiF deposited through VTE. Another example of forming an insulating layer in S1430 may include exposing an Al bus line surface to oxygen to form an aluminum oxide layer. In other embodiments, the insulator may be a layer of $SiO_2$ that is disposed using Plasma Enhanced Chemical Vapor Deposition (PECVD) through shadow masks. Other means of thin film deposition may also be used, such as e-beam evaporation.

One advantage of depositing an insulator is that it may define the active area with a much higher misalignment tolerance. In practice, the actual active area may differ from the designed value due to the misalignment between anode and cathode which are completed in two separate steps. However, if the insulator is present, even if the position of the active area shifts due to the misalignment among anode, insulator and cathode, the area stays the same. This is due to the active area being defined by the insulator within a single step deposition.

It should be noted that the insulator may be disposed over portions of the electrode, such as anode or cathode, simultaneously with covering the bus lines. Alternatively, owing to the gentle edge profile and smooth surface of shadow mask-patterned metal bus lines, the insulator may not be essential to cover the bus lines. That is, the organic layer stack may be directly disposed on top of bus lines without an interceding insulator. In some embodiments, bus lines may not be present, e.g. pixels connected in series, the insulator may still be disposed between the organic and the first electrode, and the insulator may cover the edges of the first electrode from contacting the organic layer stack.

The thickness of the insulator may be, for example, <4000 Å, <3000 Å, <2000 Å, or <1000 Å. In some embodiments, the thickness of the insulator is at least the same as that of the bus lines to prevent shorting. More preferably, the thickness of the insulator is at least 30% greater than that of the bus lines. In embodiments, such steps may be performed without breaking vacuum, which may help increase throughput and/or improve device lifetime. In embodiments, the final profile shape of the insulator may correspond to a profile shape of the insulator as deposited. Additional optional surface treatments may also be performed in S1430. The method may continue with step S1440.

In S1440, one or more organic layers, e.g. an organic layer stack, may be grown over, and/or on, the bus lines and first electrode, or, if an insulator was formed in optional S1430, the organic layer(s) may be grown over, and/or on, the insulator and first electrode. The organic layer may be deposited through a fourth shadow mask, or via other techniques known in the art. The method may continue with S1450.

In S1450, a second electrode may be deposited over the organic layer. The second electrode may be a cathode. In other embodiments, the second electrode may be an anode. The second electrode may be formed, for example, using a fifth shadow mask. Accordingly, and as described further herein, an OLED stack including at least a first electrode, a plurality of bus lines, an insulator, an organic layer stack and a second electrode may be manufactured without any wet processing steps. Alternatively, the first electrode may be an anode and may be pre-patterned using photo lithography.

In embodiments, the formation of the first electrode layer, the insulator, the bus lines, the organic layers and the second electrode layer may all be completed using vacuum deposition through shadow mask, where the final profiles of these layers correspond to the profile shapes as deposited. In some embodiments, the formation of all layers may be kept under vacuum. In some embodiments, the fabrication process may be completed without breaking the vacuum, e.g. a vacuum may be maintained throughout the steps bounded by box 1490 in FIG. 14. Alternatively, the first electrode may be an anode and may be pre-determined through photo lithography patterning. In embodiments, the steps in box 1490 may also be performed with no wet processing. In other embodiments, the substrate may leave vacuum chamber for additional treatment. For example, a high temperature baking may be desired to anneal the anode after sputtering. Another example is to expose the metal bus lines to air environment so as to prevent charge injection through metal bus lines by forming a native oxide on the surface of the metal. Nevertheless, these treatments need not change the profile shape of the layers. In some embodiments, thin-film encapsulation may be further applied on top of the finished device inside PECVD chamber through shadow masks.

It has been demonstrated by the inventors that the foregoing processes may be performed as an all-vacuum process that could be used to fabricate an OLED light panel. For example, an anode (such as ITO or IZO) may be sputtered through a shadow mask. Then bus lines may be disposed onto the anode as described herein. An insulator may be disposed on the bus lines, e.g. by VTE through a shadow mask. The organic layers may then be deposited, for example, by VTE through a shadow mask, followed by the cathode through a separate shadow mask. Finally, thin film encapsulation could also be applied in vacuum. Alternatively, a substrate with a pre-patterned electrode could be provided (as in S1400A) and the remaining process completed in vacuum (e.g. steps S1420-S1450).

Figure 15:
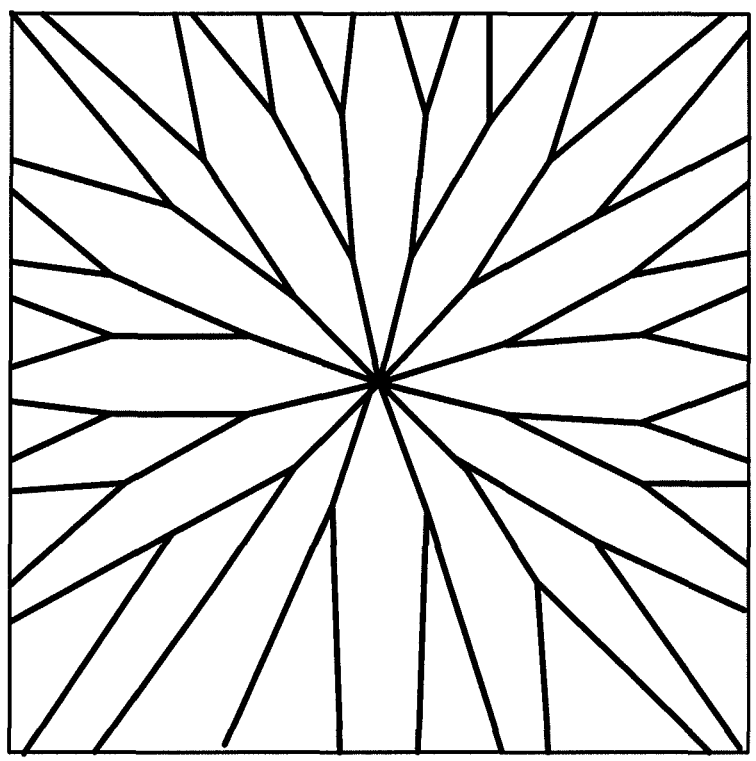
FIG. 15 depicts an exemplary bus line pattern according to further aspects of the invention.

It should also be noted that various patterns for the bus lines are possible, including, for example, a branch-shaped pattern as shown in FIG. 15. An exemplary device was constructed with a similar branch-shaped structure of metal bus lines, as shown in FIG. 15, made of 2600 Å aluminum. A completed 15 cm×15 cm OLED light panel was shown to provide uniform light output using such a structure, and, importantly, after extended operation, the OLED light panel did not develop any electrical shorts.

An organic light emitting device is also provided including features as described herein. The device may include an anode, a cathode, and an organic emissive layer disposed between the anode and the cathode. The organic emissive layer may include a host and a phosphorescent dopant, exemplary materials of which are discussed further below, following the comparative test results.

Comparative Test Results

To compare aspects of the present subject matter to more conventional approaches, the inventors fabricated a large-area white OLED light panel using lift-off processed metal bus lines. In this example, an insulating layer was not included. A panel structure similar to that illustrated in FIG. 3 was constructed. The organic material was in direct contact with electrode and bus lines. The layout of the panel comprised nine stripes, and the anode of each OLED stripe was connected to metal bus lines, as shown in FIG. 3. The bus lines were patterned using photo lithography, where 6000 Å gold was e-beam evaporated, followed by a lift-off process. The OLED included, in order, an anode (1200 Å thick ITO), a hole injection layer (100 Å thick LG101, available from LG Chemicals of Korea), a hole transport layer (3800 Å thick NPD), a first emissive layer (200 Å thick Host B doped with 24% Green Dopant A and 0.6% Red Dopant A), a second emissive layer (75 Å thick Blue Host A doped with 20% Blue Dopant A), a blocking layer (50 Å thick Blue Host A), a layer (450 Å thick layer of LG201, available from LG Chemicals of Korea and 40% LiQ), and a cathode (10 Å thick layer of LiQ (lithium quinolate) and a 1000 Å thick layer of Al).

Figure 22A:
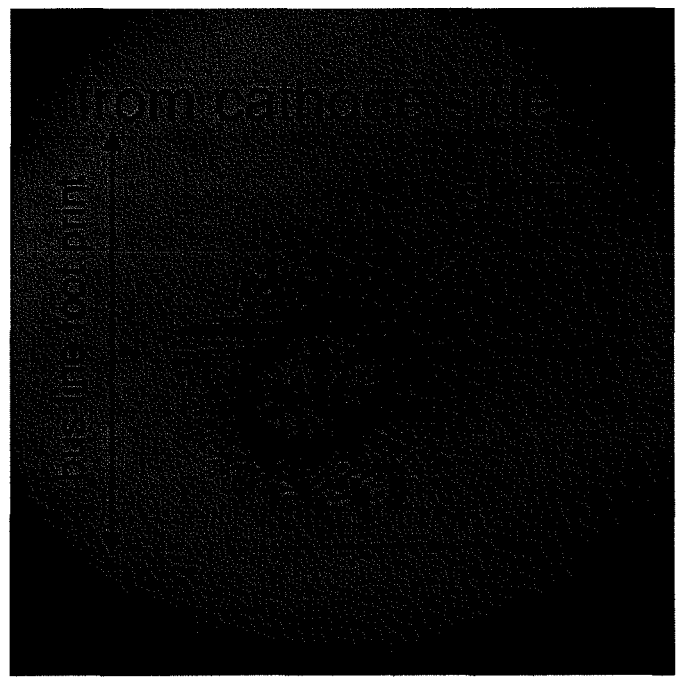
FIGS. 22A-22B show microscopic images of short spot on a bus line from the view of cathode side and anode side.
Figure 22B:
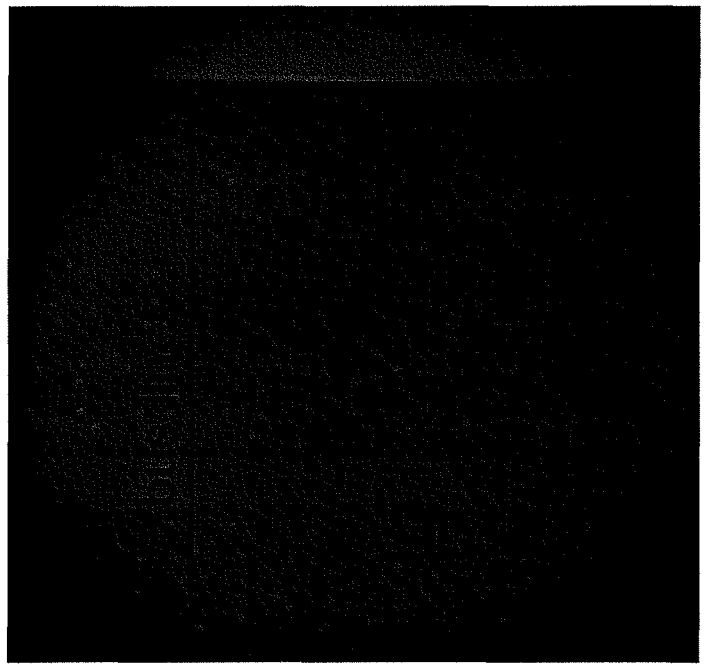

The inventors found that the panel lit up initially, however, a short circuit developed very soon on one of the bus lines. See FIGS. 22A and 22B for cathode side, and anode side views, respectively. This single short resulted in the failure of the whole panel.

Figure 16:
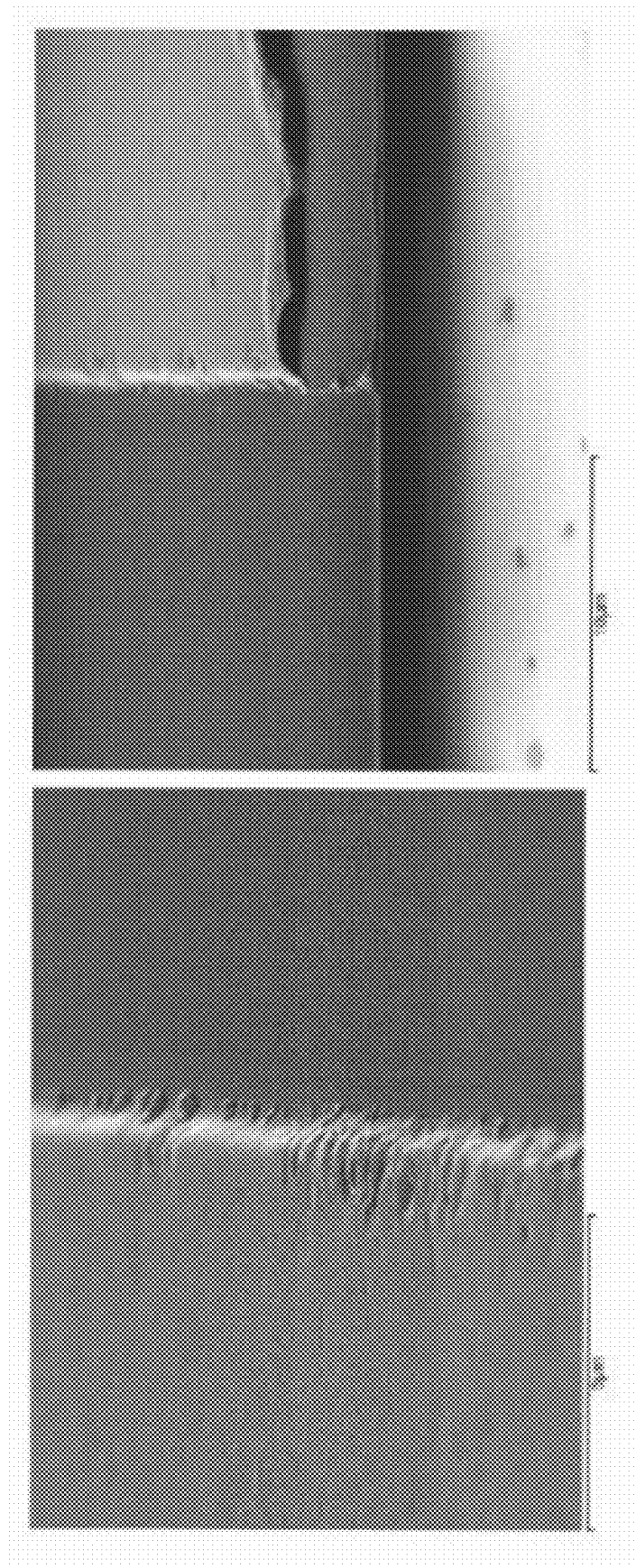
FIG. 16 includes SEM images of a tilted top view of 6000 Å metal bus line profile patterned through lift-off process.
Figure 17:
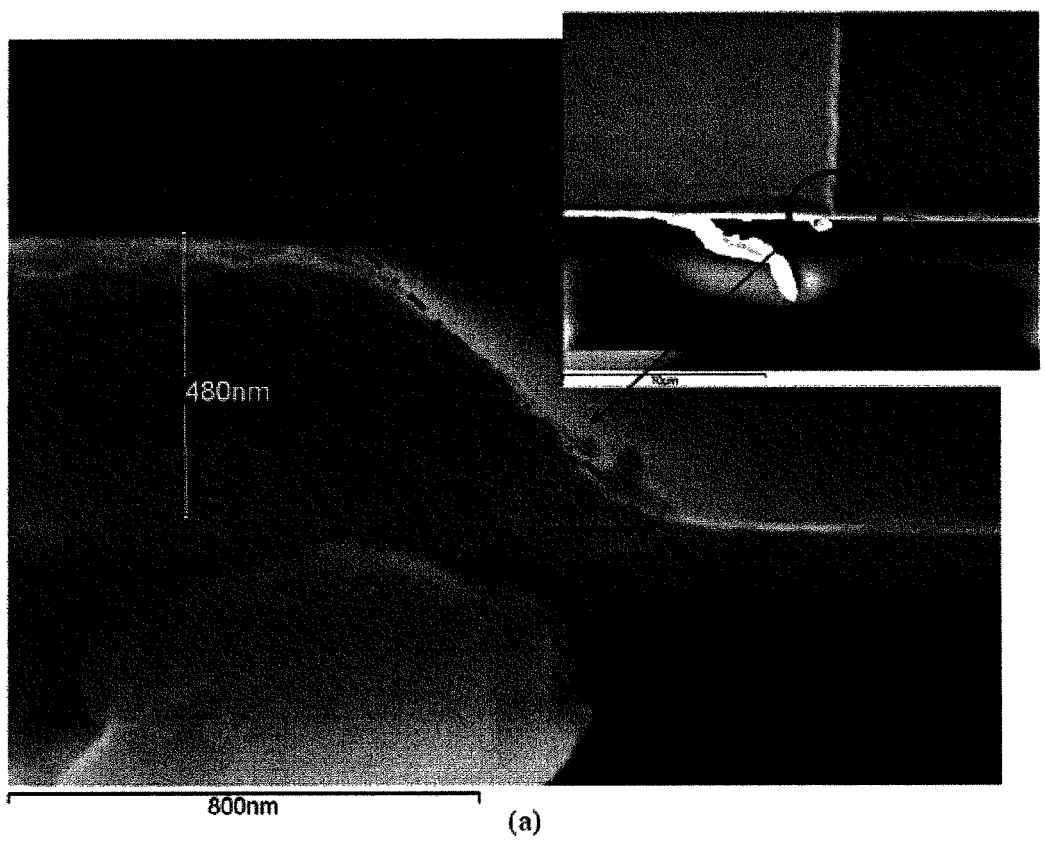
FIG. 17 is an SEM image of a side view of 6000 Å metal bus line profile patterned through lift-off process.

Further analysis showed that metal bus lines formed through a lift-off process have a sharp sidewall profile. FIG. 16 shows scanning electron microscope (SEM) images (taken from above and to the side) of 6000 Å gold bus lines deposited on an ITO anode. An SEM image of a side view of the metal layer is shown in FIG. 17. The slope of the sidewall was found to be on average approximately 45-47°. The sharp corners at top and base of the sidewalls will induce strong local electrical fields that can potentially cause an electrical short. In addition, the organic layers have total thickness typically in the range of a few hundred nm, and it is hard to uniformly coat such thin layers of material over a tall and steep sidewall. This will also result in a strong local electrical field where the bus line has the thinnest coverage which can potentially cause an electrical short. Electrical shorting is also likely at places where the organic layer fails to cover the bus lines.

Figure 18:
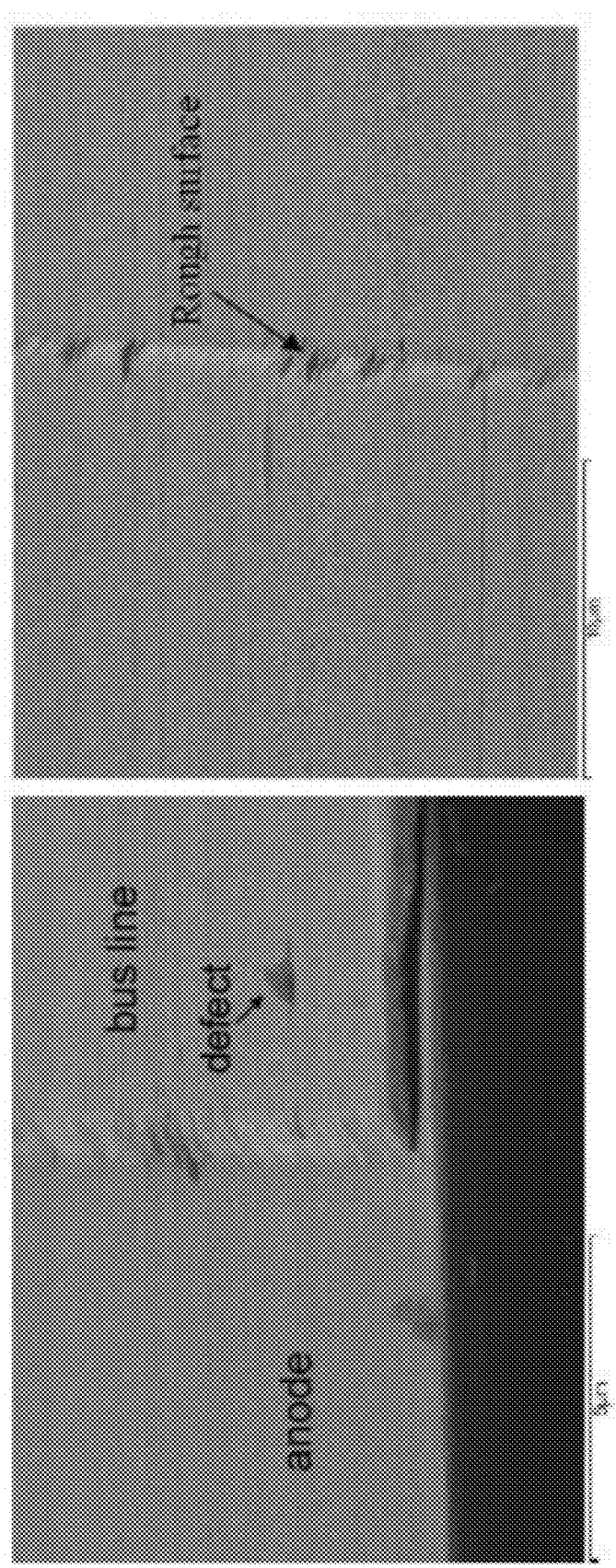
FIG. 18 includes SEM images of a metal bus line profile patterned through lift-off process, where rough edge surfaces and defects can be found.

In addition to the abrupt transition at the bus line edge, asperities on the metal side walls are also as large as hundreds of nanometers, as seen in FIG. 18. These sharp peaks can also serve as potential shorting paths. Finally, particulate defects introduced by photolithography and lift-off may also cause electrical shorts. One such defect is shown in FIG. 18. In order to prevent shorting, a subsequent protective insulating layer (e.g. polyimide or $SiO_2$) is normally required to cover the bus line.

Figure 19:
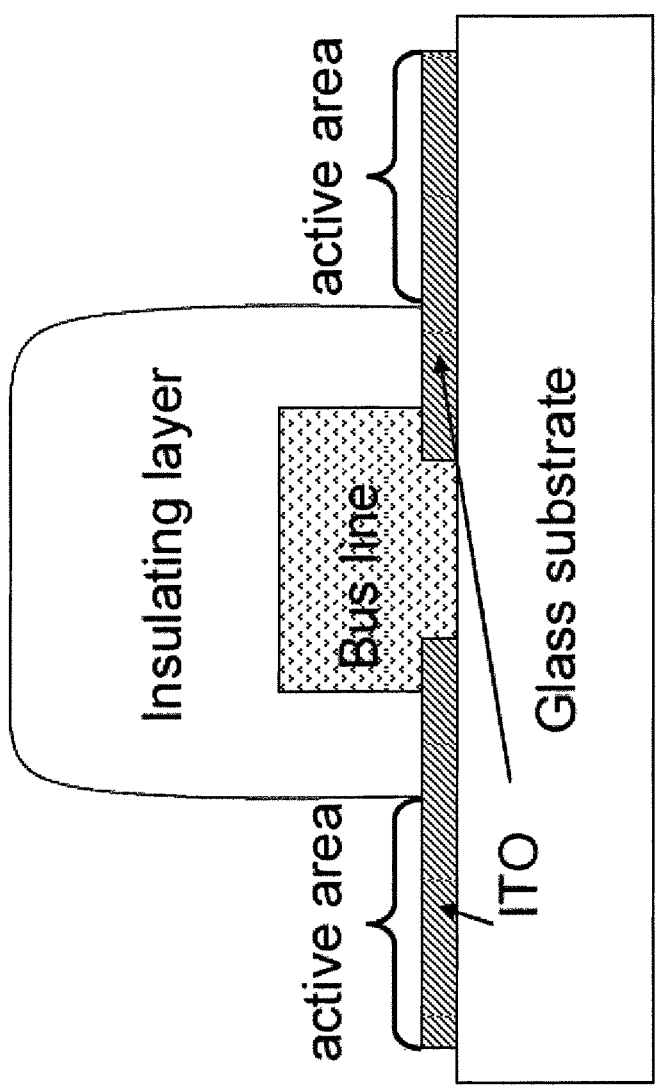
FIG. 19 is a cross sectional view of a device including an insulating layer covering the edge of bus lines.

The area required for the overlap of the insulating layer covers part of the emissive area and decreases the fill factor of the OLED light panel, as illustrated in FIG. 19. Moreover, wet processes are involved in the lift-off method, such as developing and dissolving. Polymer insulators can easily absorb moisture during process (or even after process, during substrate storage) and thus water may be retained in the device, reducing shelf life time. Also, photolithography and lift-off processes generate defects more easily, which may cause catastrophic failure of the device. Finally, photolithography and lift-off are time consuming and expensive processes.

Figure 20:
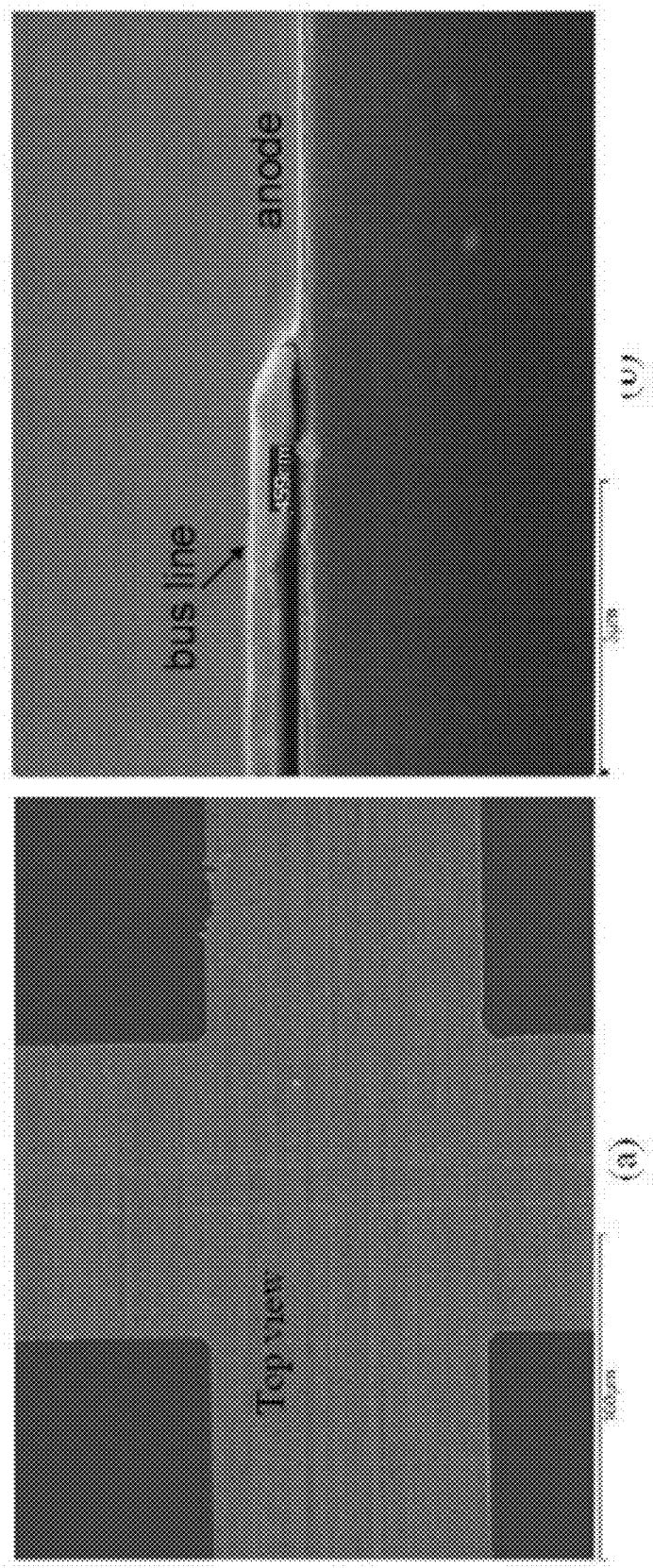
FIG. 20 shows scanning electron microscope (SEM) images of (a) top view and (b) side view of metal bus line profile fabricated from modified photolithography process.
Figure 21A:
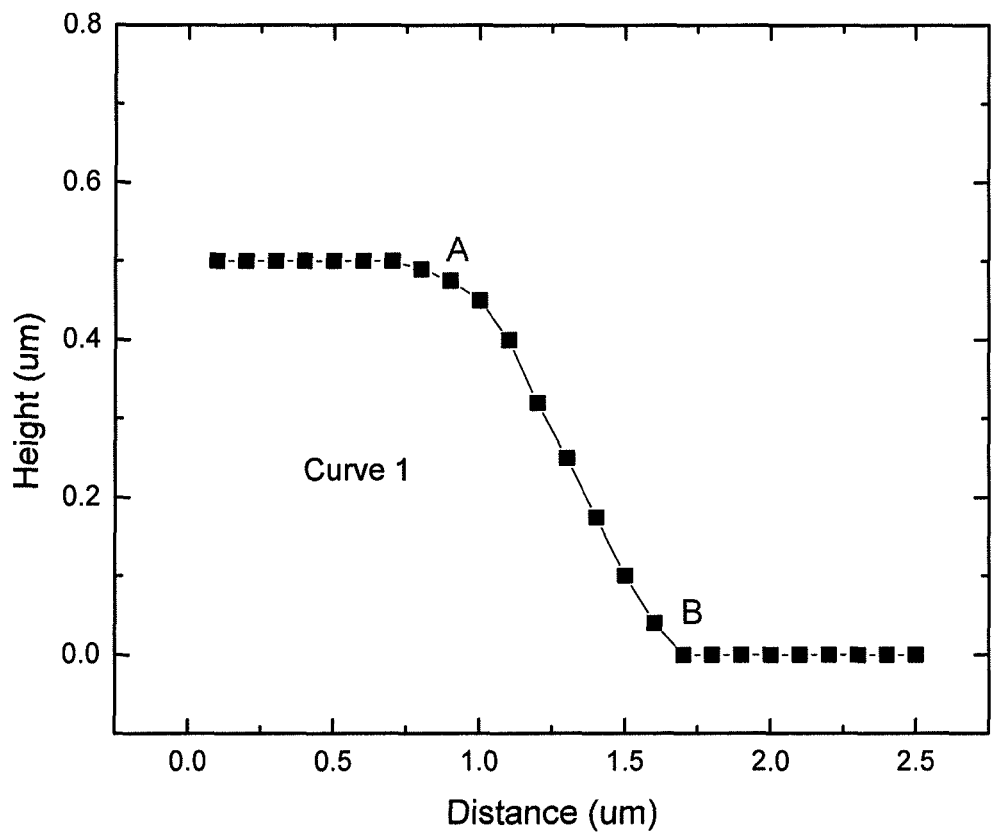
FIGS. 21A-21B show a profile of a metal bus line formed through a modified lift-off process (Curve 1) and a second derivative of Curve 1.
Figure 21B:
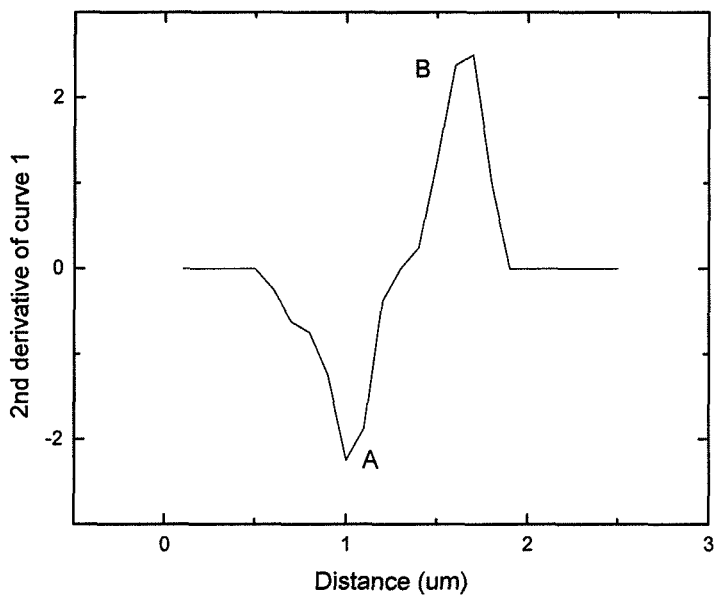

The bus line profile from a lift-off process can be modified by using different photoresist, and adjusting exposure time etc. FIG. 20 shows scanning electron microscope (SEM) images of (a) top view and (b) side view of a metal bus line profile fabricated from a modified photolithography process. A bus line sidewall profile deposited and patterned in a modified manner including a lift-off process is plotted in FIG. 21A. The angle of the slope extracted from this Curve 1 is reduced to about 33°. Using a modified lift-off process, the slope angle of the sidewall profile is less than 47° achieved using a conventional lift-off process in FIG. 17. However, this slope of the sidewall is still steep enough to cause strong localized electric fields and potentially an electrical short. The extracted maximum absolute value of the second derivative of Curve 1 is about 2.375, as shown in FIG. 21B. Thus, comparing the results shown in FIGS. 21A and 21B to those of the exemplary embodiments previously discussed with respect to FIGS. 13A and 13B, it can be seen that bus lines deposited by VTE through a shadow mask can result in transitions that are orders of magnitude smoother than lift-off processed bus lines.

Benefits of metal bus lines with a relatively smooth profile may include: 1) less shorting owing to the smooth sidewall transition, 2) larger emissive area owing to the elimination of the insulating layer which enables higher efficiency and longer operational life time for a constant light output, 3) longer shelf life time owing to the elimination of the insulating layer, such that water is no longer stored within the device 4) less shorting or visual defect owing to fewer particles from fewer handling steps, and/or 5) lower cost owing to reduced/eliminated photolithography processes. Although specific embodiments discussed herein have used, for example, vacuum thermal evaporation (VTE) to pattern the bus lines, other vapor deposition system may include sputter deposition, e-beam evaporation and chemical vapor deposition (CVD).

As discussed herein, devices according to aspects of the invention may be fabricated including bus lines without an insulator (such as in the example, discussed above), as well as devices in which the bus lines include an insulator. Another exemplary test device was fabricated with bus lines including an insulator, and is discussed below.

Figure 23A:
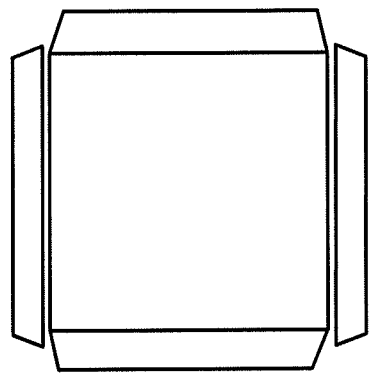
FIGS. 23A-23F show plan view schematic details of various layers included in a large-area OLED light panel with bus lines and an insulator according to aspects of the invention.
Figure 23B:
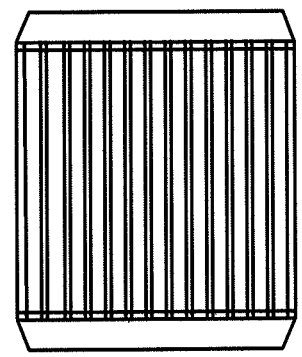
Figure 23C:
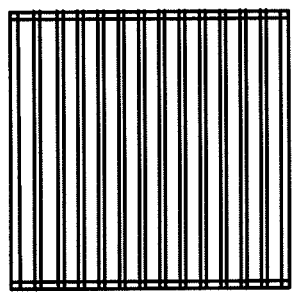
Figure 23D:
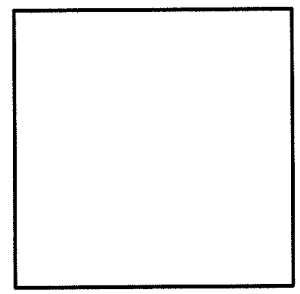
Figure 23E:
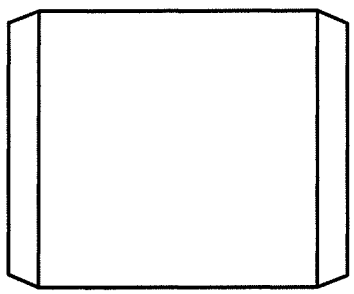
Figure 23F:
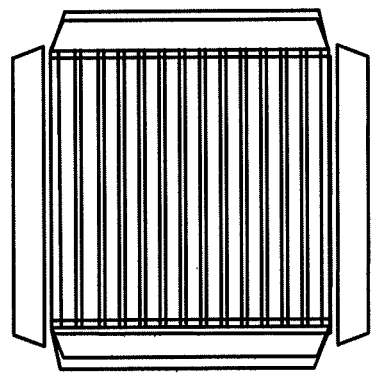

Further aspects of the present subject matter were tested by fabricating a 15 cm×15 cm large-area white OLED light panel using a process as described with reference to FIG. 14. FIG. 23 shows the panel layout of each layer, including anode (FIG. 23A), bus lines (FIG. 23B), insulator (FIG. 23C), organic (FIG. 23D) and cathode (FIG. 23E). Each bus line is 1.7 mm wide and the insulator is 2.3 mm wide that covers each side of the bus line by 0.3 mm. The panel comprises 13 light stripes and each of them is 7.4 mm×121 mm. The active areas of the stripes are defined by the insulator grids. The aperture ratio of this panel is 76%, defined as the ratio between the total active area over the outline of the active area. The anode, organic and cathode are all common layers, i.e., not segmented, so the entire panel is one single device. The overall layout including anode, bus lines, insulator grids, organic and cathode layers is drawn in FIG. 23F. A close-up schematic of bus lines and insulator grids is shown in FIG. 24.

Figure 24:
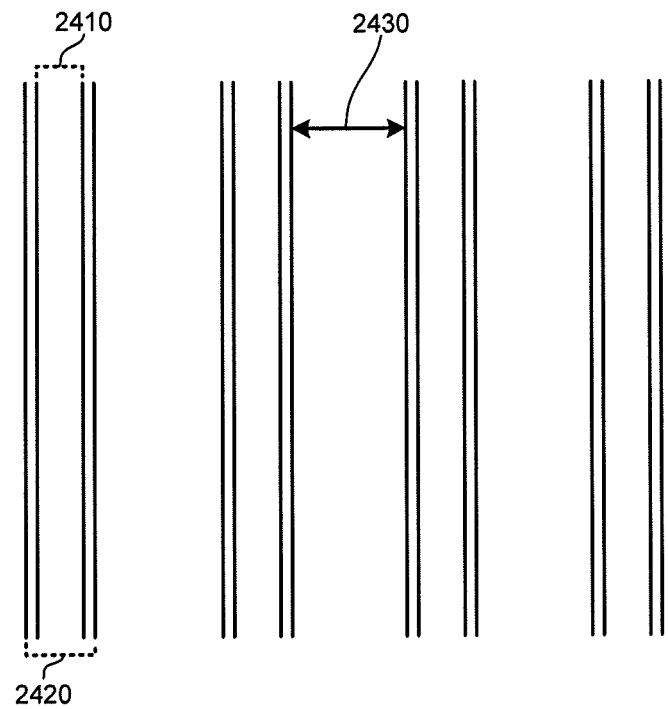
FIG. 24 shows additional details of the bus lines, insulator, and active area of the device shown in FIGS. 23A-23F.

As shown in FIG. 24, the insulator has a pattern that substantially corresponds to that of the bus line. Each of the bus lines 2410 is covered by an insulator 2420 that extends beyond the width of the bus line, in this case 0.3 mm on each side of the bus line. The coverage of the insulator over bus line is determined by the process tolerance as well as the shadow effect of the deposition. As used herein, the insulator substantially corresponding to the pattern of the bus lines may include an overlapping region, and a region extending beyond the edges of the bus lines, in plan view, such as shown in FIG. 24. An active area 2430 is defined between each insulator 2420.

Figure 25:
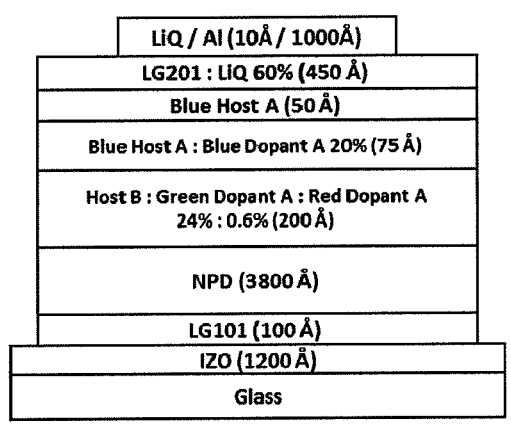
FIG. 25 shows additional details regarding the materials included in the stack of the device shown in FIGS. 23A-23F.

The OLED device structure is shown in FIG. 25. Each OLED includes, in order, an anode (1200 Å thick IZO), a hole injection layer (100 Å thick LG101, available from LG Chemicals of Korea), a hole transport layer (3800 Å thick NPD), a first emissive layer (200 Å thick Host B doped with 24% Green Dopant A and 0.6% Red Dopant A), a second emissive layer (75 Å thick Blue Host A doped with 20% Blue Dopant A), a blocking layer (50 Å thick Blue Host A), a layer (450 Å thick layer of LG201, available from LG Chemicals of Korea and 60% LiQ), and a cathode (10 Å thick layer of LiQ (lithium quinolate) and a 1000 Å thick layer of Al). Some examples of OLED materials that may be used to form the device stack are shown below. The bus lines are 3000 Å aluminum deposited through VTE. The insulator grids are 4000 Å LiF deposited through VTE.

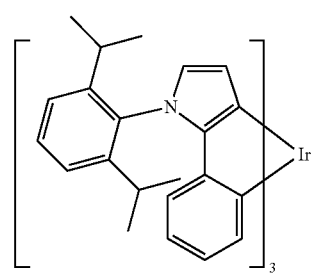

Blue Dopant A

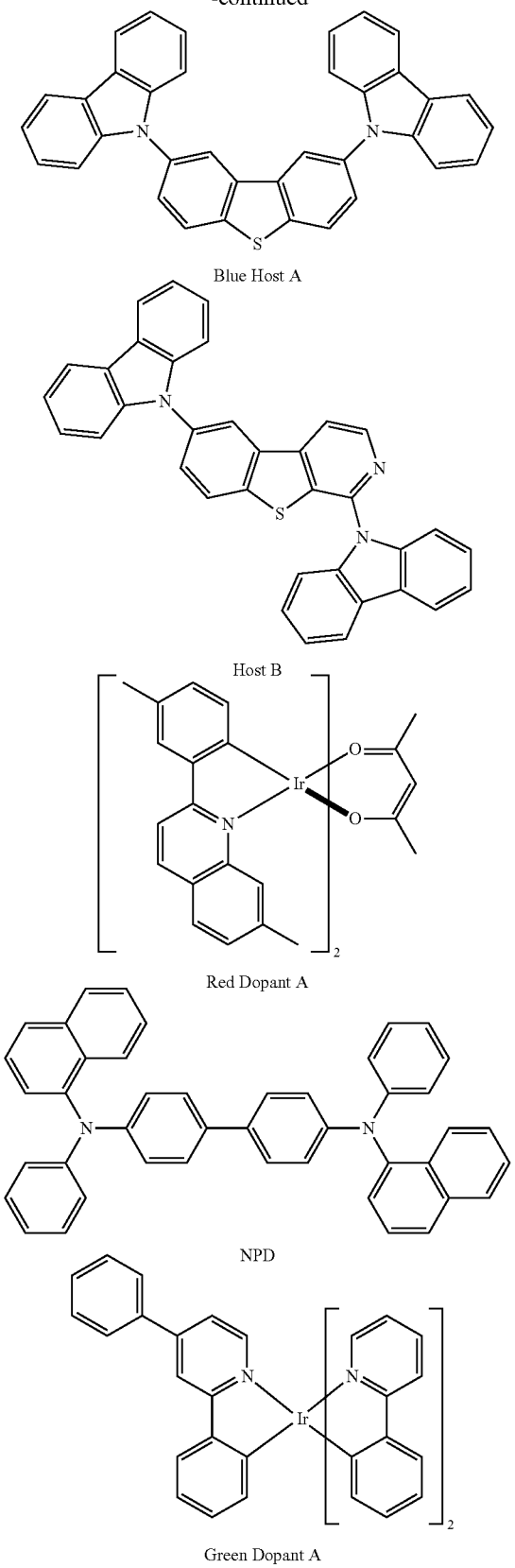

Blue Host A

Host B

Red Dopant A

NPD

Green Dopant A

Figure 26:
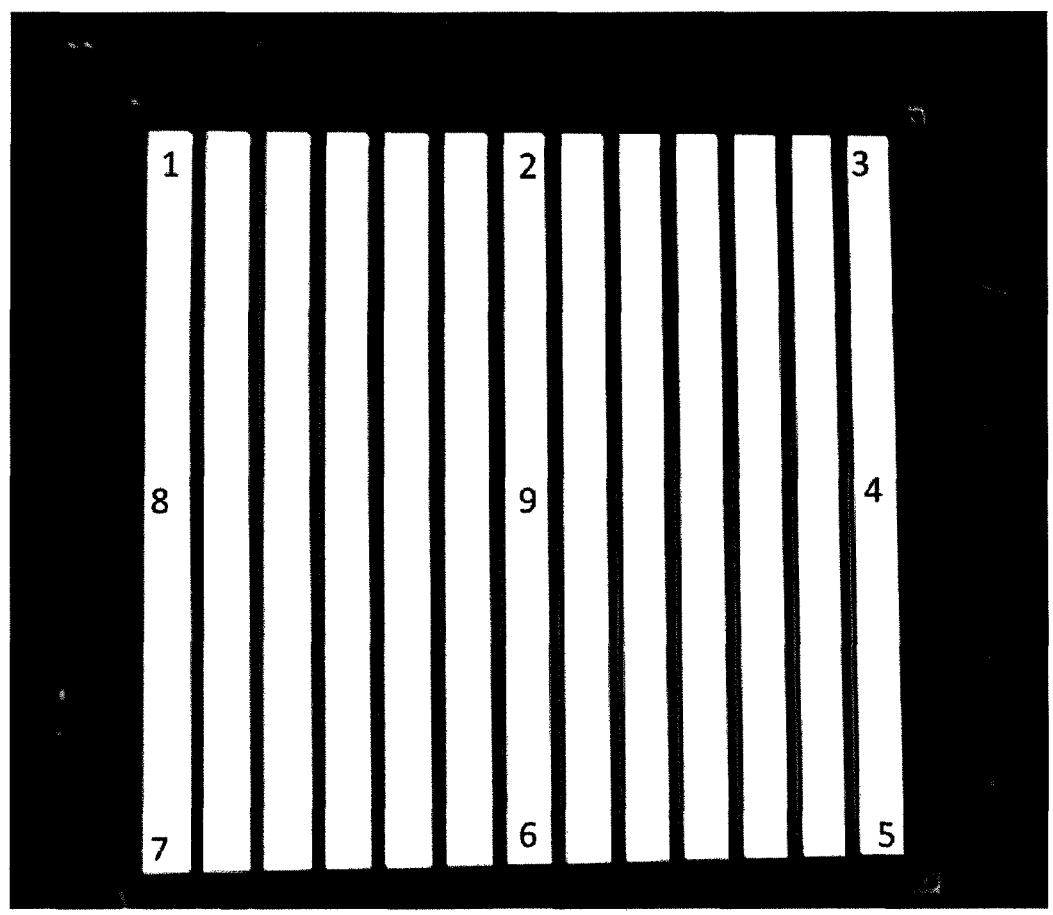
FIG. 26 is a photograph of an exemplary light panel constructed according to aspects of the invention, including labels identifying test regions.

FIG. 26 shows a photo image of the completed OLED light panel. Luminance and CIE color coordinates of positions 1-9 on the panel are measured at 5 V, 294 mA, and the summary is listed in Table I. The uniformity of the entire panel is 94%, calculated from the ratio between lowest luminance of 1250 cd/m² at points 2 and 5 and the highest luminance of 1330 cd/m² at point 1. The uniformity calculated within one stripe, such as points 2, 9, 6, is 98%. Accordingly, the inventors have demonstrated brightness of the panel is greater than 1,000 cd/m², and luminance uniformity of the panel is significantly greater than 70% at 1,000 cd/m².

TABLE I

| Position | Luminance [cd/m²] | CIE 1931 X, Y |
|---|---|---|
| 1 | 1330 | (0.387, 0.407) |
| 2 | 1250 | (0.394, 0.408) |
| 3 | 1270 | (0.388, 0.406) |
| 4 | 1270 | (0.391, 0.406) |
| 5 | 1320 | (0.388, 0.406) |
| 6 | 1270 | (0.392, 0.408) |
| 7 | 1310 | (0.384, 0.406) |
| 8 | 1300 | (0.389, 0.406) |
| 9 | 1250 | (0.395, 0.409) |

One advantage of processes such as discussed above is that large-area flexible OLED light panel may be built with high efficacy on low-cost plastic substrates. Two types of flexible substrates may typically be used for fabricating OLED light panels, thin metal foil and plastic. Only top-emission devices can be built on metal foil because the substrate is opaque. However, it is hard to achieve a uniform white light at all viewing angles due to the cavity structure that is commonly used in top emission devices. On the contrary, plastic substrates are transparent and therefore can be used to fabricate high-efficacy bottom-emission flexible white OLED light panel. However, one disadvantage of plastic is the low process temperature constraint. Typical photo lithography patterning requires minimum 120° C. baking, and to fully cure the insulator such as polyimide, 250° C. baking may be required. Therefore, low-cost plastic such as polyethylene terephthalate (PET) cannot be processed using lithography step. Although Polyethylene naphthalate (PEN) can sustain temperature higher than 250° C., it is an expensive type of plastic. By eliminating lithography steps, as detailed herein, process temperature may be significantly reduced. Therefore, using a simplified all-vacuum deposition process, high-efficacy bottom-emission flexible OLED lamps may be built on low-cost plastic.

Figure 27A:
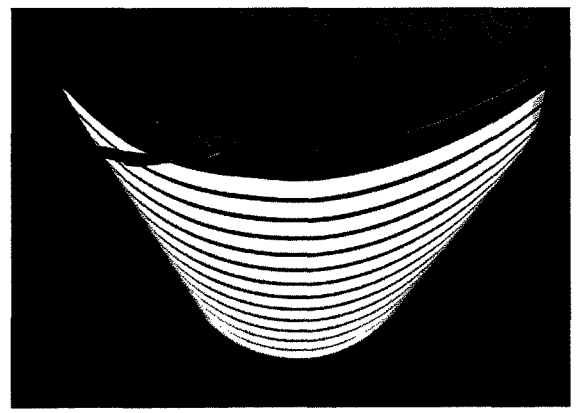
FIGS. 27A-27C are photographs of an exemplary flexible light panel constructed according to aspects of the invention.
Figure 27B:
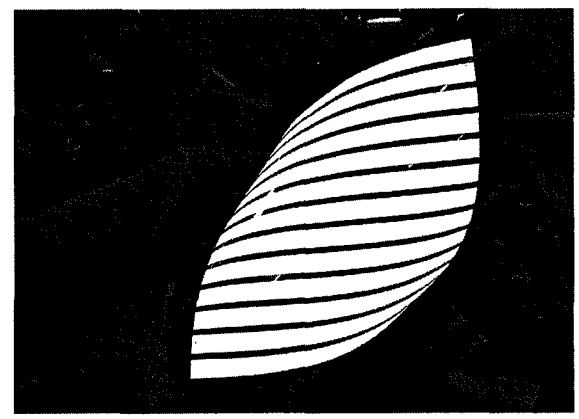
Figure 27C:
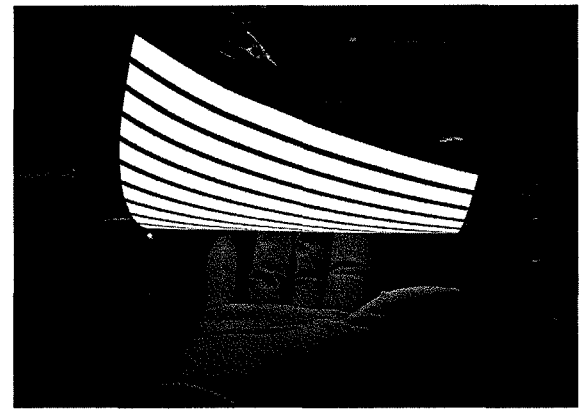

Using such methods, the inventors demonstrated a 15 cm×15 cm large-area flexible white OLED light panel on a plastic substrate, as shown photographically in FIGS. 27A-27C. The substrate is 140 µm thick planarized PEN. The panel layout is the same as illustrated in FIGS. 23 and 24. Thin-film encapsulation is deposited on top of the cathode. Thin-film encapsulation is formed in PECVD chamber under vacuum.

As mentioned previously, a single device may refer to an OLED device that can be separately addressed. For example, the entire panel may comprise only one single device, such as the example shown in FIGS. 15 and 26, because the anode, organic and cathode are all common layers. Alternatively, the panel may comprise a plurality of pixels. If each pixel has at least one electrode patterned into segments which are electrically separated from each other and can be individually addressed, each pixel may be considered to be a single device. For example, if the pixels are connected in series, each pixel may be considered to be a single device. However, if the segmented electrodes are connected to each other through bus lines, the entire panel may still be considered to be one single device, because all the pixels are connected in parallel and may not be separately addressed.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

HIL/HTL:

A hole injecting/transporting material to be used in the present invention is not particularly limited, and any compound may be used as long as the compound is typically used as a hole injecting/transporting material. Examples of the material include, but not limit to: a phthalocyanine or porphryin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and sliane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

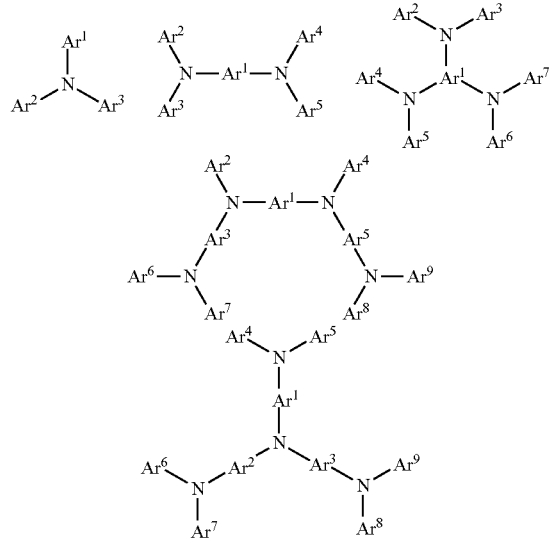

Each of $Ar^1$ to $Ar^9$ is selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each Ar is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

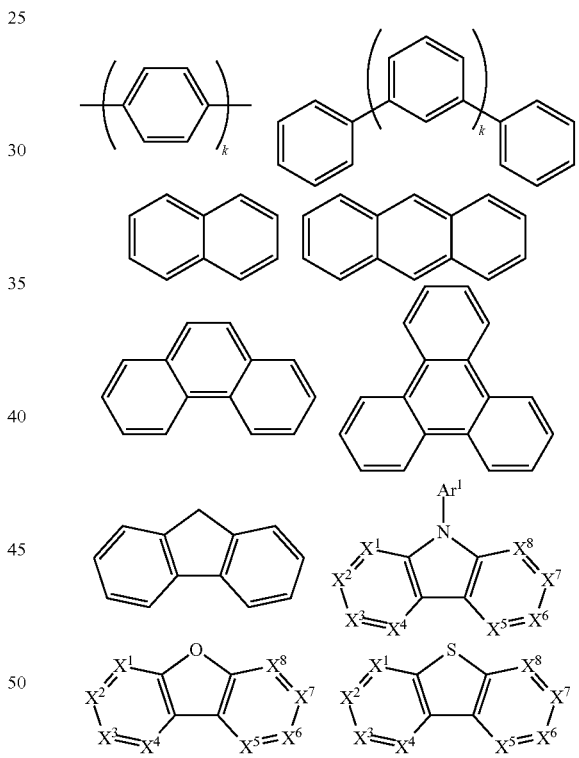

k is an integer from 1 to 20; $X^1$ to $X^8$ is CH or N; $Ar^1$ has the same group defined above.

Examples of metal complexes used in HIL or HTL include, but not limit to the following general formula:

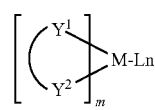

M is a metal, having an atomic weight greater than 40; $(Y^1$-$Y^2)$ is a bindentate ligand, Y1 and $Y^2$ are independently selected from C, N, O, P, and S; L is an ancillary ligand; m is an integer value from 1 to the maximum number of ligands that may be attached to the metal; and m+n is the maximum number of ligands that may be attached to the metal.

In one aspect, $(Y^1\text{-}Y^2)$ is a 2-phenylpyridine derivative.

In another aspect, $(Y^1\text{-}Y^2)$ is a carbene ligand.

In another aspect, M is selected from Ir, Pt, Os, and Zn.

In a further aspect, the metal complex has a smallest oxidation potential in solution vs. $Fc^+/Fc$ couple less than about 0.6 V.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant.

Examples of metal complexes used as host are preferred to have the following general formula:

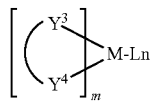

M is a metal; $(Y^3\text{-}Y^4)$ is a bindentate ligand, $Y^3$ and $Y^4$ are independently selected from C, N, O, P, and S; L is an ancillary ligand; m is an integer value from 1 to the maximum number of ligands that may be attached to the metal; and m+n is the maximum number of ligands that may be attached to the metal.

In one aspect, the metal complexes are:

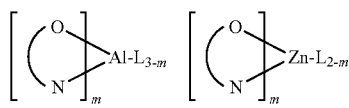

(O—N) is a bidentate ligand, having metal coordinated to atoms O and N.

In another aspect, M is selected from Ir and Pt.

In a further aspect, $(Y^3\text{-}Y^4)$ is a carbene ligand.

Examples of organic compounds used as host are selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group.

Wherein each group is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, host compound contains at least one of the following groups in the molecule:

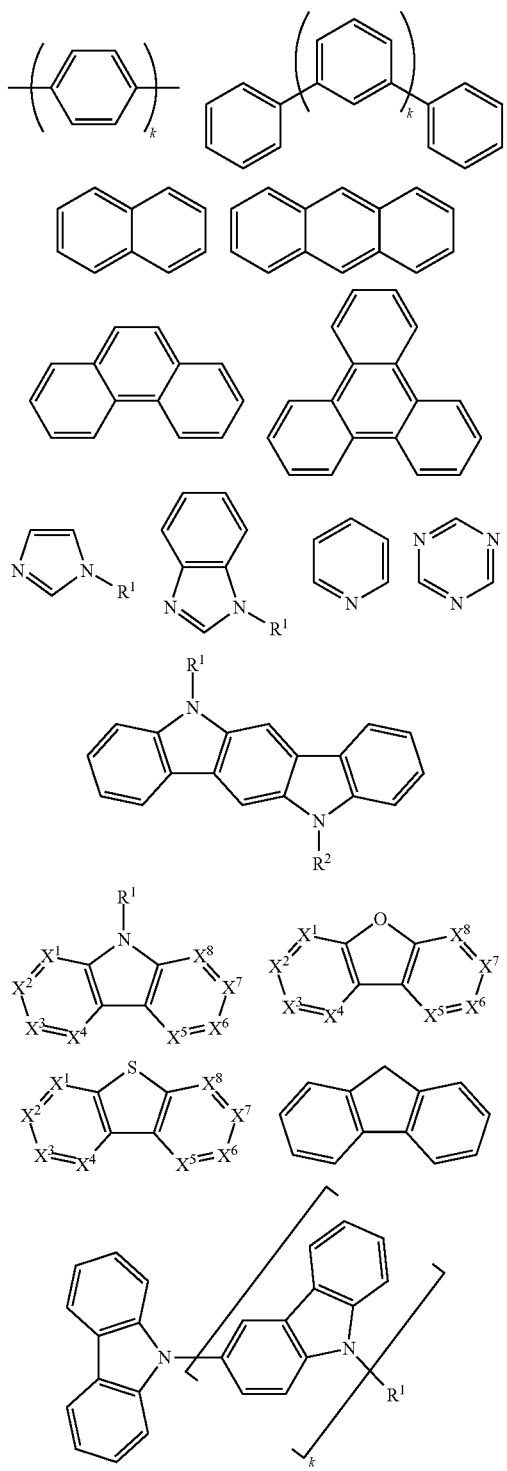

-continued

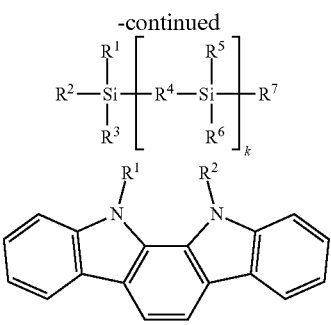

R[1] to R[7] is independently selected from the group consisting of hydrogen, alkyl, alkoxy, amino, alkenyl, alkynyl, arylalkyl, heteroalkyl, aryl and heteroaryl, when it is aryl or heteroaryl, it has the similar definition as Ar's mentioned above.

k is an integer from 0 to 20.

X[1] to X[8] is selected from CH or N.

HBL:

A hole blocking layer (HBL) may be used to reduce the number of holes and/or excitons that leave the emissive layer. The presence of such a blocking layer in a device may result in substantially higher efficiencies as compared to a similar device lacking a blocking layer. Also, a blocking layer may be used to confine emission to a desired region of an OLED.

In one aspect, compound used in HBL contains the same molecule used as host described above.

In another aspect, compound used in HBL contains at least one of the following groups in the molecule:

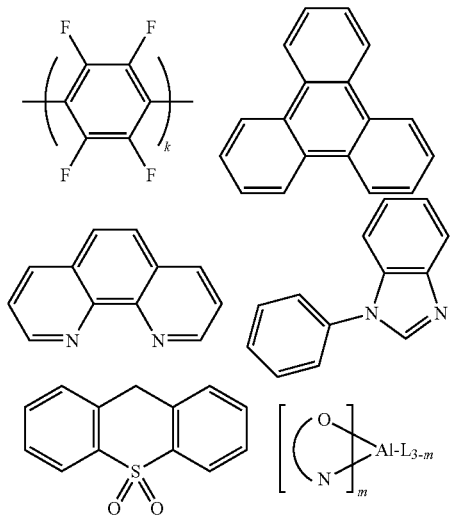

k is an integer from 0 to 20; L is an ancillary ligand, m is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

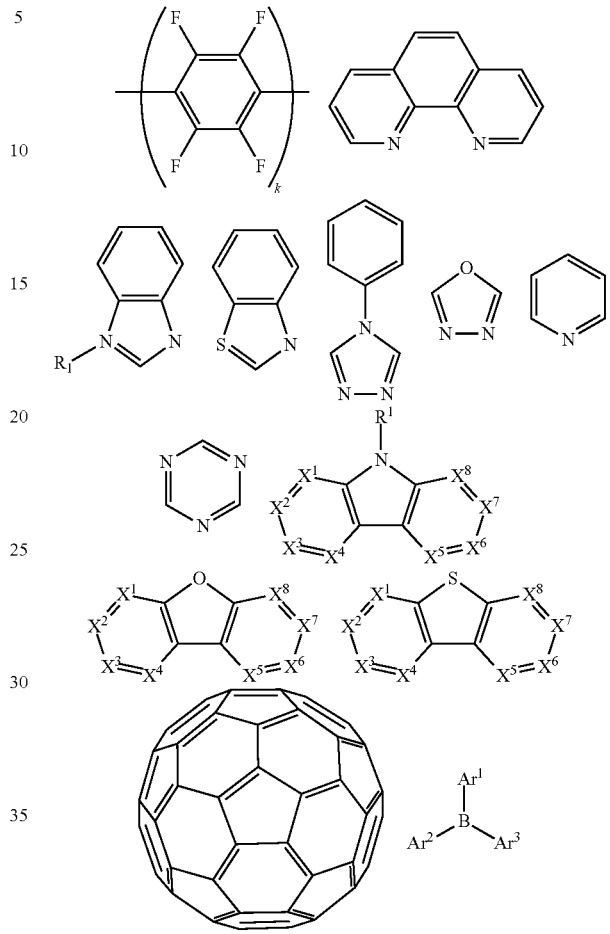

R[1] is selected from the group consisting of hydrogen, alkyl, alkoxy, amino, alkenyl, alkynyl, arylalkyl, heteroalkyl, aryl and heteroaryl, when it is aryl or heteroaryl, it has the similar definition as Ar's mentioned above.

Ar[1] to Ar[3] has the similar definition as Ar's mentioned above.

k is an integer from 0 to 20.

X[1] to X[8] is selected from CH or N.

In another aspect, the metal complexes used in ETL contains, but not limit to the following general formula:

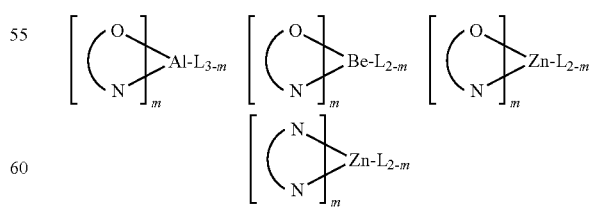

(O—N) or (N—N) is a bidentate ligand, having metal coordinated to atoms O, N or N, N; L is an ancillary ligand; m is an integer value from 1 to the maximum number of ligands that may be attached to the metal.

In any above-mentioned compounds used in each layer of the OLED device, the hydrogen atoms can be partially or fully deuterated.

In addition to and/or in combination with the materials disclosed herein, many hole injection materials, hole transporting materials, host materials, dopant materials, exiton/hole blocking layer materials, electron transporting and electron injecting materials may be used in an OLED. Non-limiting examples of the materials that may be used in an OLED in combination with materials disclosed herein are listed in Table II below. Table II lists non-limiting classes of materials, non-limiting examples of compounds for each class, and references that disclose the materials.

TABLE II

| MATERIAL | EXAMPLES OF MATERIAL | PUBLICATIONS |
|---|---|---|
| Hole injection materials | | |
| Phtalocyanine and porphryin compounds | | Appl. Phys. Lett. 69, 2160 (1996) |
| Starburst triarylamines | | J. Lumin. 72-74, 985 (1997) |
| $CF_x$ Fluorohydrocarbon polymer | $-[CH_xF_y]_n-$ | Appl. Phys. Lett. 78, 673 (2001) |
| Conducting polymers (e.g., PEDOT: PSS, polyaniline, polypthiophene) | | Synth. Met. 87, 171 (1997) WO2007002683 |
| Phosphonic acid and sliane SAMs | | US20030162053 |

TABLE II-continued
| MATERIAL | EXAMPLES OF MATERIAL | PUBLICATIONS |
|---|---|---|
| Triarylamine or polythiophene polymers with conductivity dopants | 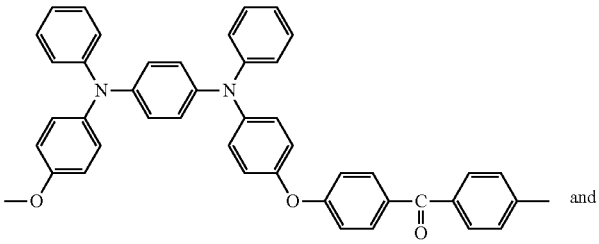 and 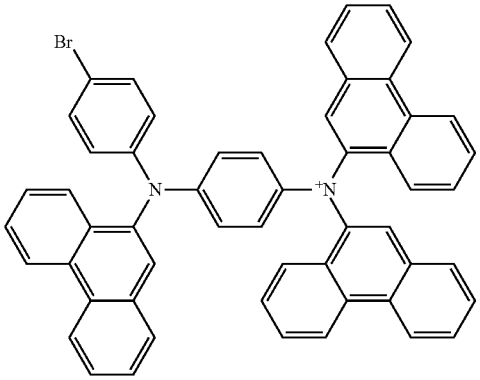 [SMILES: Brc1ccc(N(c2ccc([NH+](c3cc4ccccc4c4ccccc34)c3cc4ccccc4c4ccccc34)cc2)c2cc3ccccc3c3ccccc23)cc1] | EP1725079A1 |
| | 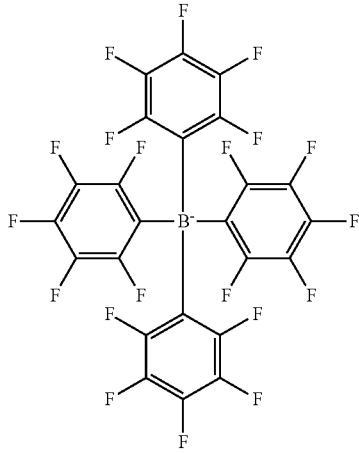 [SMILES: Fc1c(F)c(F)c([B-](c2c(F)c(F)c(F)c(F)c2F)(c2c(F)c(F)c(F)c(F)c2F)c2c(F)c(F)c(F)c(F)c2F)c(F)c1F] | |
| Arylamines complexed with metal oxides such as molybdenum and tungsten oxides | 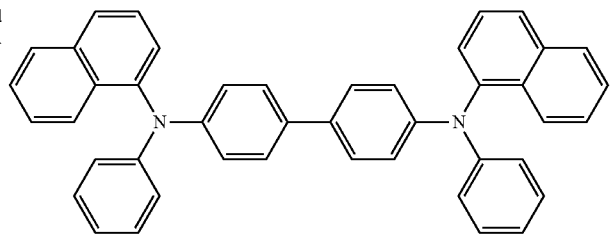 + MoO$_x$ | SID Symposium Digest, 37, 923 (2006) WO2009018009 |

TABLE II-continued
| MATERIAL | EXAMPLES OF MATERIAL | PUBLICATIONS |
|---|---|---|
| p-type semiconducting organic complexes | 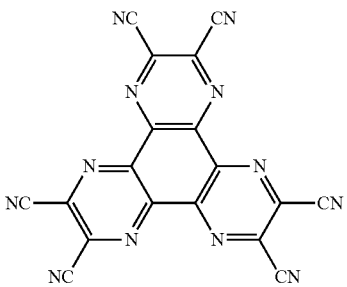 [SMILES: N#Cc1nc2c3nc(C#N)c(C#N)nc3c3nc(C#N)c(C#N)nc3c2nc1C#N] | US20020158242 |
| Metal organometallic complexes | 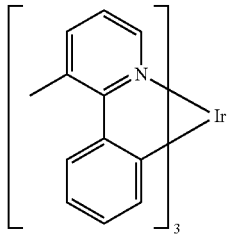 | US20060240279 |
| Cross-linkable compounds | 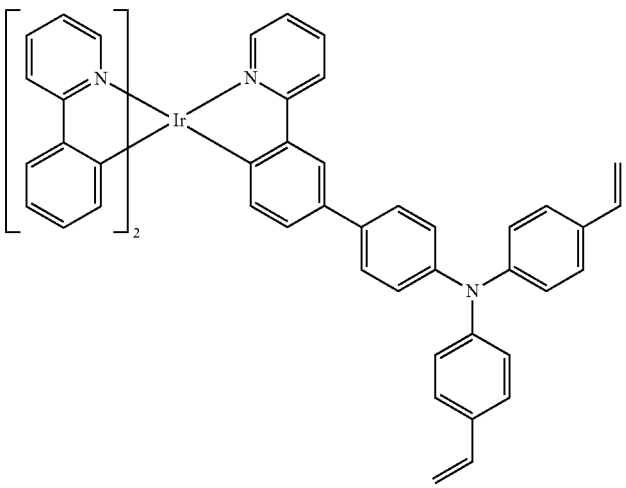 | US20080220265 |
| Hole transporting materials | | |
| Triarylamines (e.g., TPD, α-NPD) | 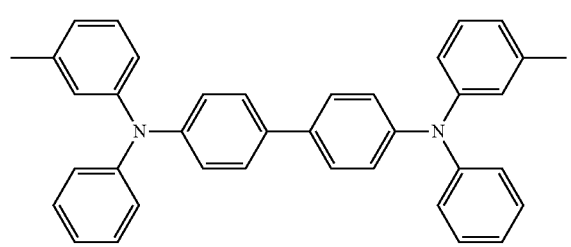 | Appl. Phys. Lett. 51, 913 (1987) |
| | 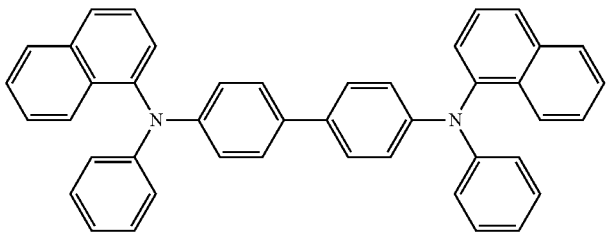 [SMILES: c1ccc(N(c2ccc(-c3ccc(N(c4ccccc4)c4cccc5ccccc45)cc3)cc2)c2cccc3ccccc23)cc1] | U.S. Pat. No. 5,061,569 |

| MATERIAL | EXAMPLES OF MATERIAL | PUBLICATIONS |
|---|---|---|
| | 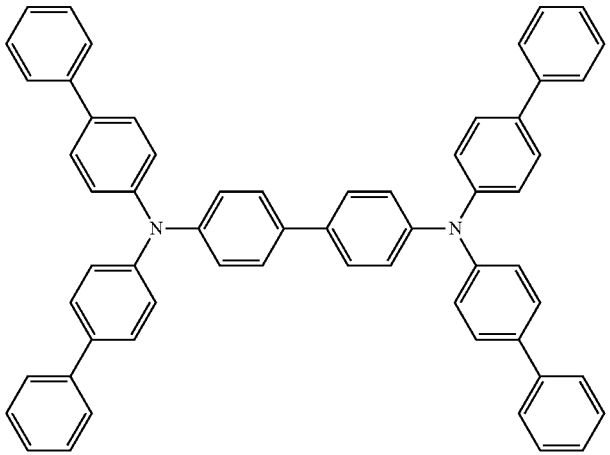 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1] | EP650955 |
| | 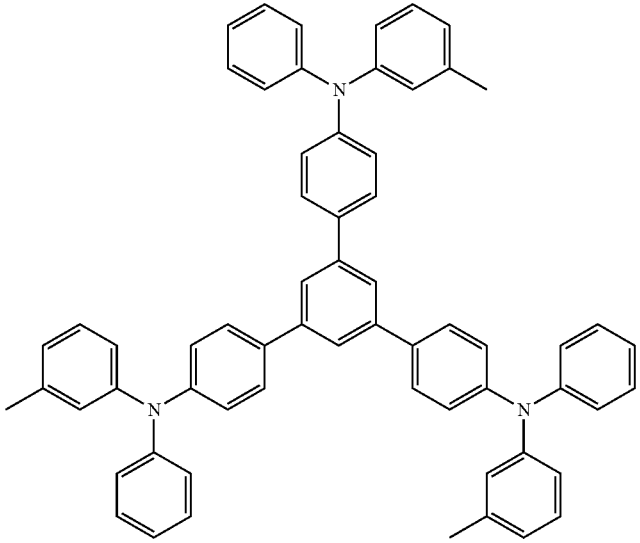 [SMILES: Cc1cccc(N(c2ccccc2)c2ccc(-c3cc(-c4ccc(N(c5ccccc5)c5cccc(C)c5)cc4)cc(-c4ccc(N(c5ccccc5)c5cccc(C)c5)cc4)c3)cc2)c1] | J. Mater. Chem. 3, 319 (1993) |
| | 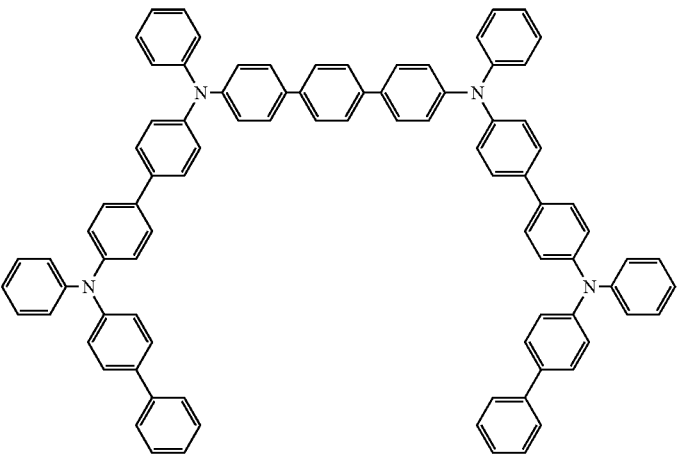 [SMILES: c1ccc(-c2ccc(N(c3ccccc3)c3ccc(-c4ccc(N(c5ccccc5)c5ccc(-c6ccc(-c7ccc(N(c8ccccc8)c8ccc(-c9ccc(N(c%10ccccc%10)c%10ccc(-c%11ccccc%11)cc%10)cc9)cc8)cc7)cc6)cc5)cc4)cc3)cc2)cc1] | Appl. Phys. Lett. 90, 183503 (2007) |

TABLE II-continued

| MATERIAL | EXAMPLES OF MATERIAL | PUBLICATIONS |
|---|---|---|
| | | Appl. Phys. Lett. 90 183503 (2007) |
| Triaylamine on spirofluorene core | | Synth. Met. 91, 209 (1997) |
| Arylamine carbazole compounds | | Adv. Mater. 6, 677 (1994), US20080124572 |
| Triarylamine with (di)benzothiophene/(di)benzofuran | | US20070278938, US20080106190 |

TABLE II-continued
| MATERIAL | EXAMPLES OF MATERIAL | PUBLICATIONS |
|---|---|---|
| Indolocarbazoles | 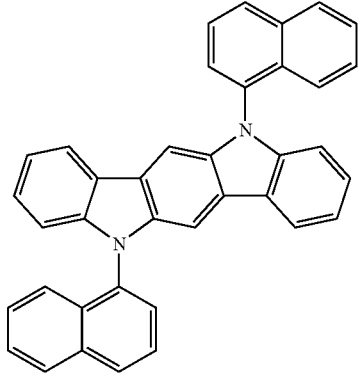 [SMILES: c1ccc2c(-n3c4ccccc4c4cc5c(cc43)c3ccccc3n5-c3cccc4ccccc34)cccc2c1] | Synth. Met. 111, 421 (2000) |
| Isoindole compounds | 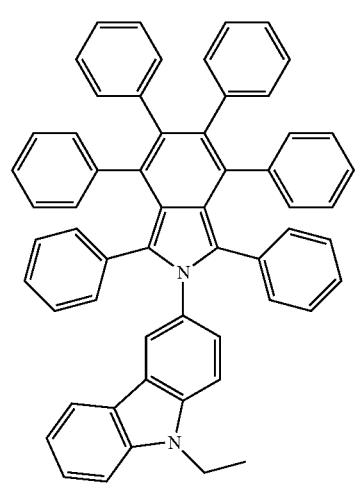 [SMILES: CCn1c2ccccc2c2cc(-n3c(-c4ccccc4)c4c(-c5ccccc5)c(-c5ccccc5)c(-c5ccccc5)c(-c5ccccc5)c4c3-c3ccccc3)ccc21] | Chem. Mater. 15, 3148 (2003) |
| Metal carbene complexes | 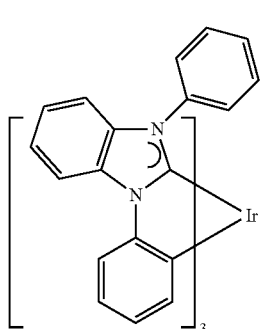 | US20080018221 |
Phosphorescent OLED host materials
Red hosts
| | | |
|---|---|---|
| Arylcarbazoles | 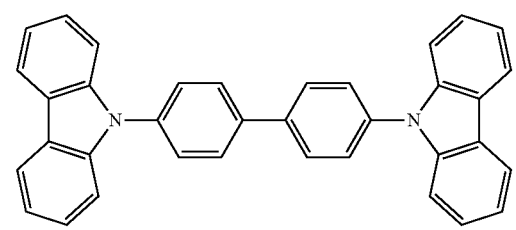 [SMILES: c1ccc2c(c1)c1ccccc1n2-c1ccc(-c2ccc(-n3c4ccccc4c4ccccc43)cc2)cc1] | Appl. Phys. Lett. 78, 1622 (2001) |

| MATERIAL | EXAMPLES OF MATERIAL | PUBLICATIONS |
|---|---|---|
| Metal 8-hydroxyquinolates (e.g., Alq$_3$, BAlq) | | Nature 395, 151 (1998) |
| | | US20060202194 |
| | | WO2005014551 |
| | | WO2006072002 |
| Metal phenoxybenzothiazole compounds | | Appl. Phys. Lett. 90, 123509 (2007) |
| Conjugated oligomers and polymers (e.g., polyfluorene) | | Org. Electron. 1, 15 (2000) |
| Aromatic fused rings | | WO2009066779, WO2009066778, WO2009063833, US20090045731, US20090045730, WO2009008311, US20090008605, US20090009065 |

TABLE II-continued

| MATERIAL | EXAMPLES OF MATERIAL | PUBLICATIONS |
| --- | --- | --- |
| Zinc complexes | | WO2009062578 |

Green hosts

| MATERIAL | EXAMPLES OF MATERIAL | PUBLICATIONS |
| --- | --- | --- |
| Arylcarbazoles | | Appl. Phys. Lett. 78, 1622 (2001) |
| | | US20030175553 |
| | | WO2001039234 |
| Aryltriphenylene compounds | | US20060280965 |

TABLE II-continued

| MATERIAL | EXAMPLES OF MATERIAL | PUBLICATIONS |
|---|---|---|
| | | US20060280965 |
| | | WO2009021126 |
| Donor acceptor type molecules | | WO2008056746 |
| Aza-carbazole/DBT/DBF | | JP2008074939 |
| Polymers (e.g., PVK) | | Appl. Phys. Lett. 77, 2280 (2000) |

TABLE II-continued

| MATERIAL | EXAMPLES OF MATERIAL | PUBLICATIONS |
|---|---|---|
| Spirofluorene compounds | | WO2004093207 |
| Metal phenoxybenzooxazole compounds | | WO2005089025 |
| | | WO2006132173 |
| | | JP200511610 |
| Spirofluorene-carbazole compounds | | JP2007254297 |

TABLE II-continued
| MATERIAL | EXAMPLES OF MATERIAL | PUBLICATIONS |
|---|---|---|
| | 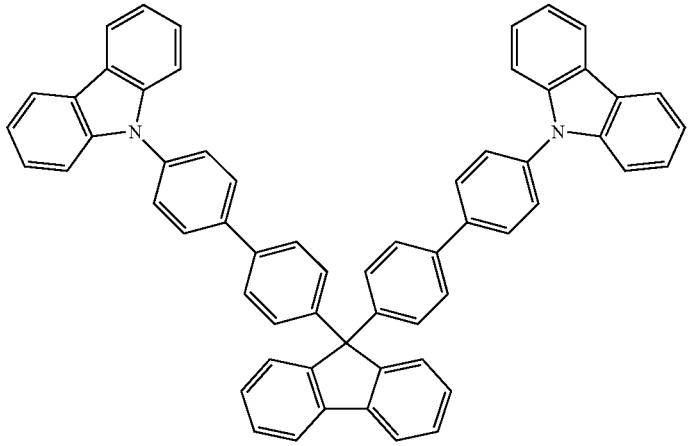 [SMILES: c1ccc2c(c1)-c1ccccc1C2(c1ccc(-c2ccc(-n3c4ccccc4c4ccccc43)cc2)cc1)c1ccc(-c2ccc(-n3c4ccccc4c4ccccc43)cc2)cc1] | JP2007254297 |
| Indolocabazoles | 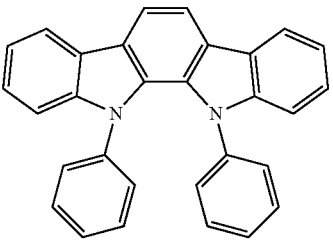 [SMILES: c1ccc(-n2c3ccccc3c3ccc4c5ccccc5n(-c5ccccc5)c4c32)cc1] | WO2007063796 |
| | 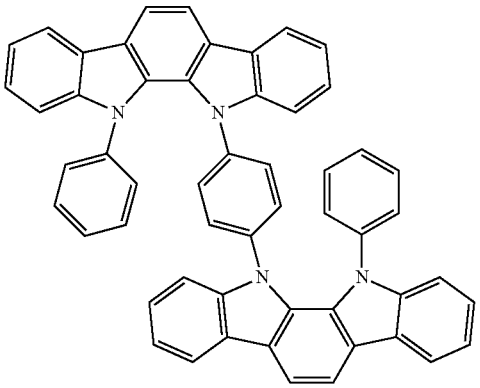 [SMILES: c1ccc(-n2c3ccccc3c3ccc4c5ccccc5n(-c5ccc(-n6c7ccccc7c7ccc8c9ccccc9n(-c9ccccc9)c8c76)cc5)c4c32)cc1] | WO2007063754 |
| 5-member ring electron deficient heterocycles (e.g., triazole, oxadiazole) | 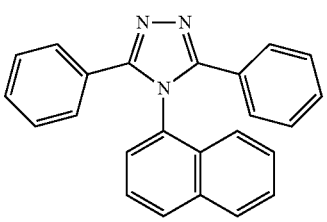 [SMILES: c1ccc(-c2nnc(-c3ccccc3)n2-c2cccc3ccccc23)cc1] | J. Appl. Phys. 90, 5048 (2001) |
| | 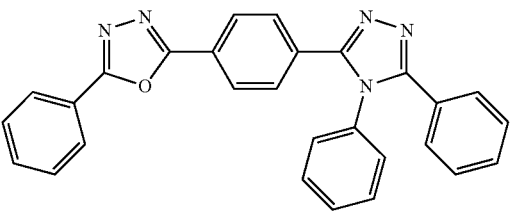 [SMILES: c1ccc(-c2nnc(-c3ccc(-c4nnc(-c5ccccc5)n4-c4ccccc4)cc3)o2)cc1] | WO2004107822 |

TABLE II-continued

| MATERIAL | EXAMPLES OF MATERIAL | PUBLICATIONS |
|---|---|---|
| Tetrraphenylene complexes | | US20050112407 |
| Metal phenoxypyridine compounds | | WO2005030900 |
| Metal coordination complexes (e.g., Zn, Al with N^N ligands) | | US20040137268, US20040137267 |

Blue hosts

| | | |
|---|---|---|
| Arylcarbazoles | | Appl. Phys. Lett, 82, 2422 (2003) |
| | | US20070190359 |

TABLE II-continued
| MATERIAL | EXAMPLES OF MATERIAL | PUBLICATIONS |
|---|---|---|
| Dibenzothiophene/ Dibenzofuran- carbazole compounds | 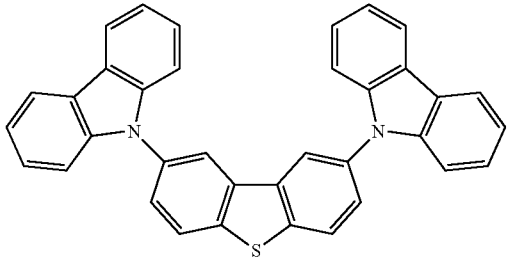 [SMILES: c1ccc2c(c1)c1ccccc1n2-c1ccc2sc3ccc(-n4c5ccccc5c5ccccc54)cc3c2c1] | WO2006114966, US20090167162 |
| | 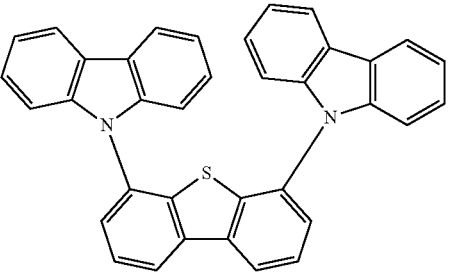 [SMILES: c1cc(-n2c3ccccc3c3ccccc32)c2sc3c(-n4c5ccccc5c5ccccc54)cccc3c2c1] | US20090167162 |
| | 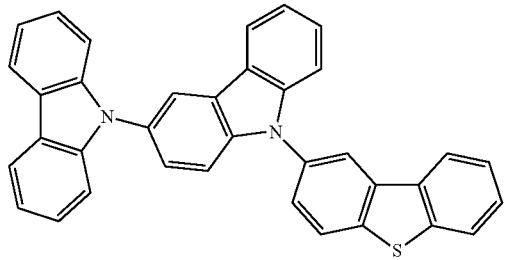 [SMILES: c1ccc2c(c1)sc1ccc(-n3c4ccccc4c4cc(-n5c6ccccc6c6ccccc65)ccc43)cc12] | WO2009086028 |
| | 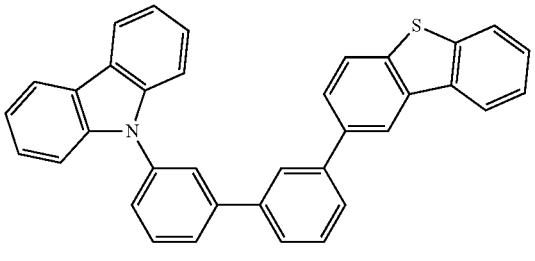 [SMILES: c1cc(-c2cccc(-n3c4ccccc4c4ccccc43)c2)cc(-c2ccc3sc4ccccc4c3c2)c1] | US20090030202, US20090017330 |
| Silicon aryl compounds | 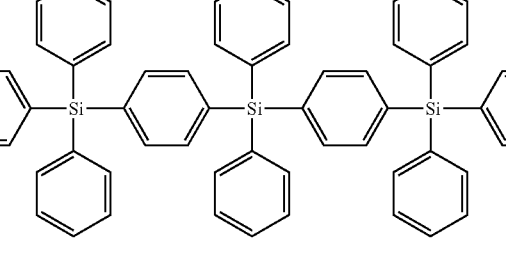 | US20050238919 |
| | 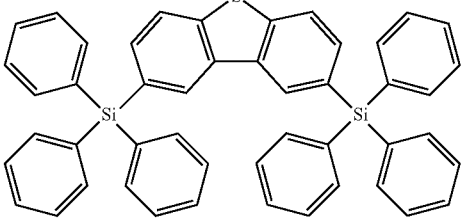 | WO2009003898 |

TABLE II-continued

| MATERIAL | EXAMPLES OF MATERIAL | PUBLICATIONS |
|---|---|---|
| Silicon/Germanium aryl compounds | | EP2034538A |
| Aryl benzoyl ester | | WO2006100298 |
| High triplet metal organometallic complex | | U.S. Pat. No. 7,154,114 |

Phosporescent dopants
Red dopants

| | | |
|---|---|---|
| Heavy metal porphyrins (e.g., PtOEP) | | Nature 395, 151 (1998) |
| Iridium(III) organometallic complexes | | Appl. Phys. Lett. 78, 1622 (2001) |

TABLE II-continued

| MATERIAL | EXAMPLES OF MATERIAL | PUBLICATIONS |
|---|---|---|
| | | US2006835469 |
| | | US2006835469 |
| | | US20060202194 |
| | | US20060202194 |
| | | US20070087321 |

TABLE II-continued

| MATERIAL | EXAMPLES OF MATERIAL | PUBLICATIONS |
|---|---|---|
| | | US20070087321 |
| | | Adv. Mater. 19, 739 (2007) |
| | | WO2009100991 |
| | | WO2008101842 |
| Platinum(II) organometallic complexes | | WO2003040257 |

TABLE II-continued

| MATERIAL | EXAMPLES OF MATERIAL | PUBLICATIONS |
|---|---|---|
| Osminum(III) complexes | [structure: pyrazole with $CF_3$ group linked to pyridine, coordinated to $Os(PPhMe_2)_2$, subscript 2] | Chem. Mater. 17, 3532 (2005) |
| Ruthenium(II) complexes | [structure: pyrazole with $^tBu$ group linked to isoquinoline, coordinated to $Ru(PPhMe_2)_2$, subscript 2] | Adv. Mater. 17, 1059 (2005) |
| Rhenium (I), (II), and (III) complexes | [structure: 8-hydroxyquinoline coordinated to $Re-(CO)_4$] | US20050244673 |

Green dopants

| MATERIAL | EXAMPLES OF MATERIAL | PUBLICATIONS |
|---|---|---|
| Iridium(III) organometallic complexes | [structure: tris(2-phenylpyridine)iridium] and its derivatives | Inorg. Chem. 40, 1704 (2001) |
| | [structure: bis(2-phenylpyridine)iridium acetylacetonate] | US20020034656 |

TABLE II-continued

| MATERIAL | EXAMPLES OF MATERIAL | PUBLICATIONS |
| --- | --- | --- |
| | | U.S. Pat. No. 7,332,232 |
| | | US20090108737 |
| | | US20090039776 |
| | | U.S. Pat. No. 6,921,915 |

| MATERIAL | EXAMPLES OF MATERIAL | PUBLICATIONS |
|---|---|---|
| | | U.S. Pat. No. 6,687,266 |
| | | Chem. Mater. 16, 2480 (2004) |
| | | US20070190359 |
| | | US 20060008670 JP2007123392 |
| | | Adv. Mater. 16, 2003 (2004) |

TABLE II-continued

| MATERIAL | EXAMPLES OF MATERIAL | PUBLICATIONS |
|---|---|---|
| | | Angew. Chem. Int. Ed. 2006, 45, 7800 |
| | | WO2009050290 |
| | | US20090165846 |
| | | US20080015355 |
| Monomer for polymeric metal organometallic compounds | | U.S. Pat. No. 7,250,226, U.S. Pat. No. 7,396,598 |

TABLE II-continued

| MATERIAL | EXAMPLES OF MATERIAL | PUBLICATIONS |
|---|---|---|
| Pt(II) organometallic complexes, including polydentated ligands | | Appl. Phys. Lett. 86, 153505 (2005) |
| | | Appl. Phys. Lett. 86, 153505 (2005) |
| | | Chem. Lett. 34, 592 (2005) |
| | | WO2002015645 |
| | | US20060263635 |

TABLE II-continued

| MATERIAL | EXAMPLES OF MATERIAL | PUBLICATIONS |
| --- | --- | --- |
| Cu complexes | | WO2009000673 |
| Gold complexes | | Chem. Commun. 2906 (2005) |
| Rhenium(III) complexes | | Inorg. Chem. 42, 1248 (2003) |
| Deuterated organometallic complexes | | US20030138657 |

TABLE II-continued
| MATERIAL | EXAMPLES OF MATERIAL | PUBLICATIONS |
|---|---|---|
| Organometallic complexes with two or more metal centers | 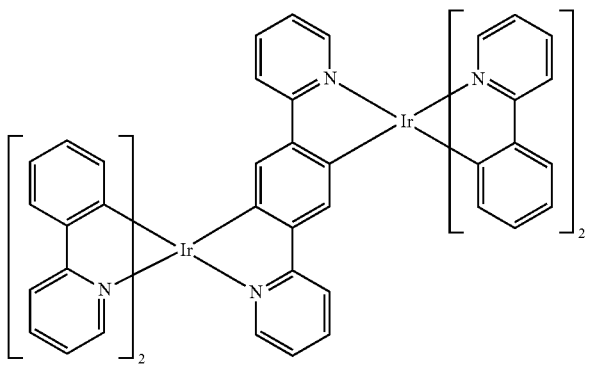 | US20030152802 |
| | 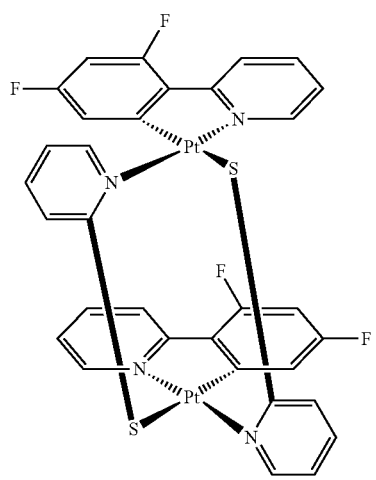 | U.S. Pat. No. 7,090,928 |
| Blue dopants | | |
| Iridium(III) organometallic complexes | 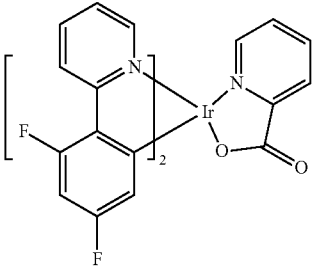 | WO2002002714 |
| | 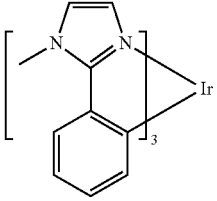 | WO2006009024 |
| | 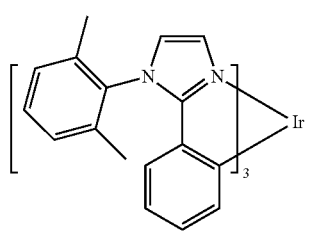 | US20060251923 |

TABLE II-continued

| MATERIAL | EXAMPLES OF MATERIAL | PUBLICATIONS |
|---|---|---|
| | *(imidazole-phenyl Ir complex, tris)* | U.S. Pat. No. 7,393,599, WO2006056418, US20050260441, WO2005019373 |
| | *(benzimidazole-benzofuran Ir complex, tris)* | U.S. Pat. No. 7,534,505 |
| | *(bis-imidazole phenylene Ir⁺ complex)* | U.S. Pat. No. 7,445,855 |
| | *(imidazo-phenanthridine Ir complex, tris)* | US20070190359, US20080297033 |
| | *(pyrazole-biphenyl Ir complex, tris)* | U.S. Pat. No. 7,338,722 |
| | *(pyrazole-pyridine Ir complex, tris)* | US20020134984 |

TABLE II-continued

| MATERIAL | EXAMPLES OF MATERIAL | PUBLICATIONS |
|---|---|---|
| | | Angew. Chem. Int. Ed. 47, 1 (2008) |
| | | Chem. Mater. 18, 5119 (2006) |
| | | Inorg. Chem. 46, 4308 (2007) |
| | | WO2005123873 |
| | | WO2005123873 |
| | | WO2007004380 |

TABLE II-continued

| MATERIAL | EXAMPLES OF MATERIAL | PUBLICATIONS |
| --- | --- | --- |
| | | WO2006082742 |
| Osmium(II) complexes | | U.S. Pat. No. 7,279,704 |
| | | Organometallics 23, 3745 (2004) |
| Gold complexes | | Appl. Phys. Lett. 74, 1361 (1999) |
| Platinum(II) complexes | | WO2006098120, WO2006103874 |

TABLE II-continued

| MATERIAL | EXAMPLES OF MATERIAL | PUBLICATIONS |
|---|---|---|
| Exciton/hole blocking layer materials | | |
| Bathocuprine compounds (e.g., BCP, BPhen) | 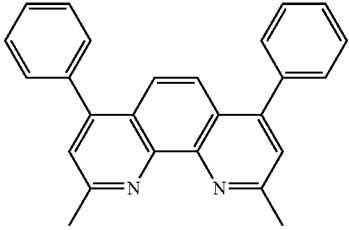 [SMILES: Cc1cc(-c2ccccc2)c2ccc3c(-c4ccccc4)cc(C)nc3c2n1] | Appl. Phys. Lett. 75, 4 (1999) |
| | 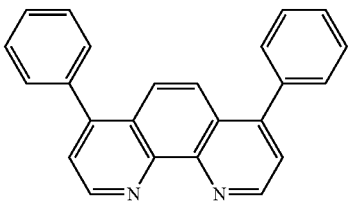 [SMILES: c1ccc(-c2ccnc3c2ccc2c(-c4ccccc4)ccnc23)cc1] | Appl. Phys. Lett. 79, 449 (2001) |
| Metal 8-hydroxyquinolates (e.g., BAlq) | 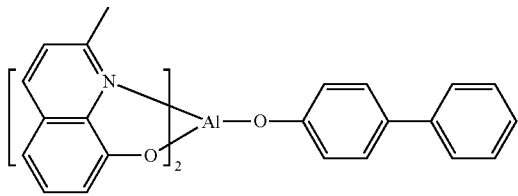 | Appl. Phys. Lett. 81, 162 (2002) |
| 5-member ring electron deficient heterocycles such as triazole, oxadiazole, imidazole, benzoimidazole | 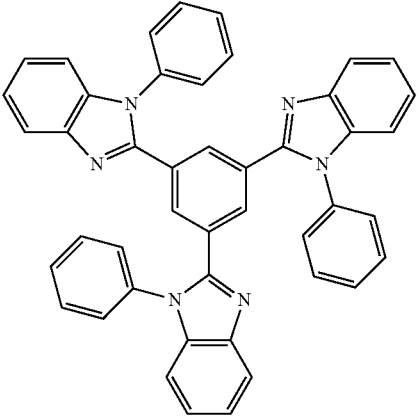 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 81, 162 (2002) |
| Triphenylene compounds | 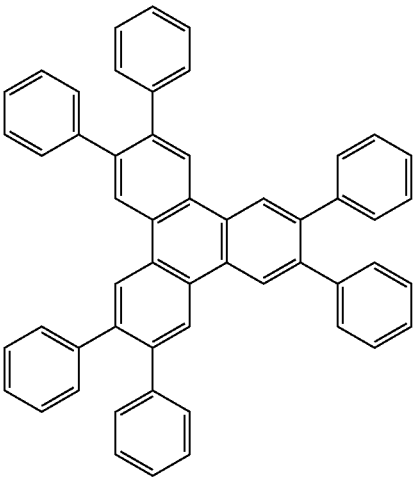 [SMILES: c1ccc(-c2cc3c4cc(-c5ccccc5)c(-c5ccccc5)cc4c4cc(-c5ccccc5)c(-c5ccccc5)cc4c3cc2-c2ccccc2)cc1] | US20050025993 |

| MATERIAL | EXAMPLES OF MATERIAL | PUBLICATIONS |
|---|---|---|
| Fluorinated aromatic compounds | 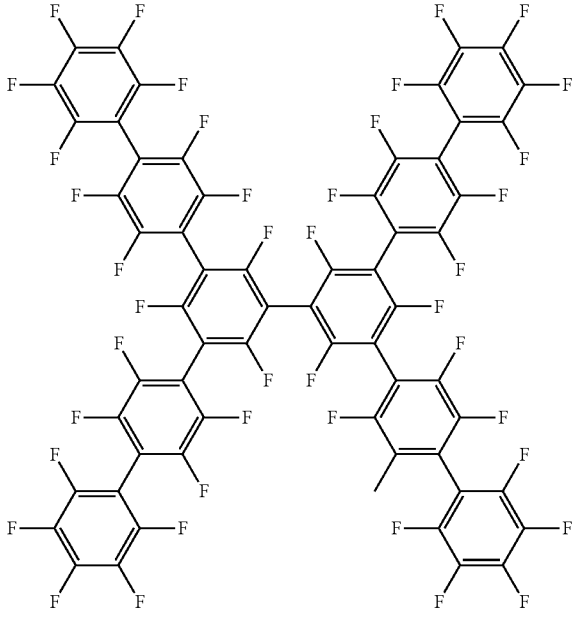 [SMILES: Cc1c(F)c(-c2c(F)c(-c3c(F)c(F)c(-c4c(F)c(F)c(F)c(F)c4F)c(F)c3F)c(F)c(-c3c(F)c(-c4c(F)c(F)c(-c5c(F)c(F)c(F)c(F)c5F)c(F)c4F)c(F)c(-c4c(F)c(F)c(-c5c(F)c(F)c(F)c(F)c5F)c(F)c4F)c3F)c2F)c(F)c(F)c1-c1c(F)c(F)c(F)c(F)c1F] | Appl. Phys. Lett. 79, 156 (2001) |
| Phenothiazine-S-oxide | 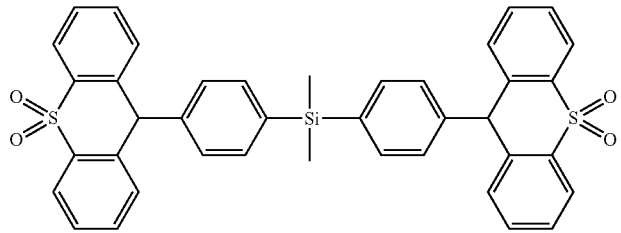 [SMILES: C[Si](C)(c1ccc(C2c3ccccc3S(=O)(=O)c3ccccc32)cc1)c1ccc(C2c3ccccc3S(=O)(=O)c3ccccc32)cc1] | WO2008132085 |
Electron transporting materials
| | | |
|---|---|---|
| Anthracene-benzoimidazole compounds | 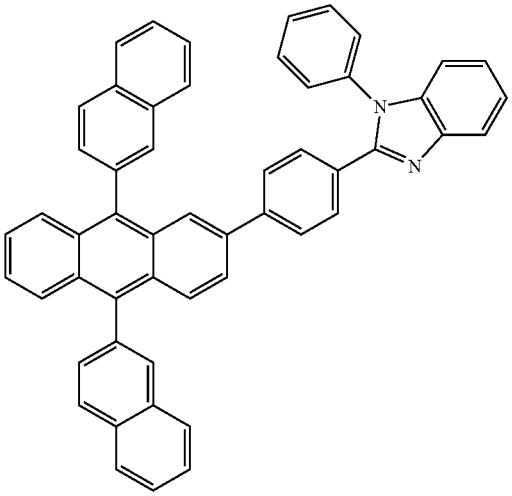 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1] | WO2003060956 |

TABLE II-continued

| MATERIAL | EXAMPLES OF MATERIAL | PUBLICATIONS |
|---|---|---|
| | | US20090179554 |
| Aza triphenylene derivatives | | US20090115316 |
| Anthracene-benzothiazole compounds | | Appl. Phys. Lett. 89, 063504 (2006) |
| Metal 8-hydroxyquinolates (e.g., $Alq_3$, $Zrq_4$) | | Appl. Phys. Lett. 51, 913 (1987)<br>U.S. Pat. No. 7,230,107 |
| Metal hydroxybenoquinolates | | Chem. Lett. 5, 905 (1993) |
| Bathocuprine compounds such as BCP, BPhen, etc | | Appl. Phys. Lett. 91, 263503 (2007) |

TABLE II-continued
| MATERIAL | EXAMPLES OF MATERIAL | PUBLICATIONS |
|---|---|---|
| | 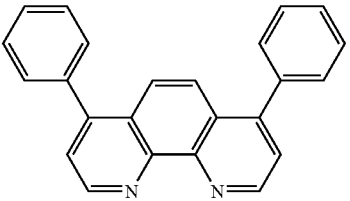 [SMILES: c1ccc(-c2ccnc3c2ccc2c(-c4ccccc4)ccnc23)cc1] | Appl. Phys. Lett. 79, 449 (2001) |
| 5-member ring electron deficient heterocycles (e.g., triazole, oxadiazole, imidazole, benzoimidazole) | 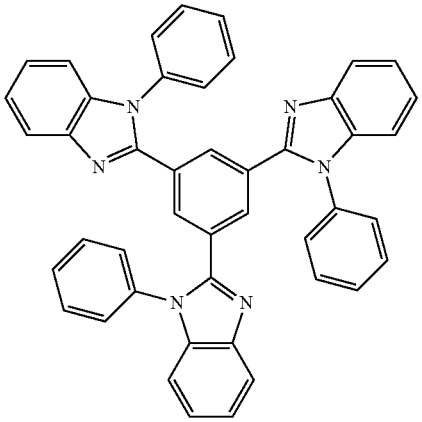 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 74, 865 (1999) |
| | 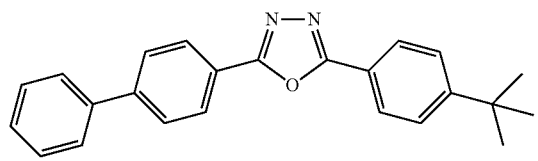 [SMILES: CC(C)(C)c1ccc(-c2nnc(-c3ccc(-c4ccccc4)cc3)o2)cc1] | Appl. Phys. Lett. 55, 1489 (1989) |
| | 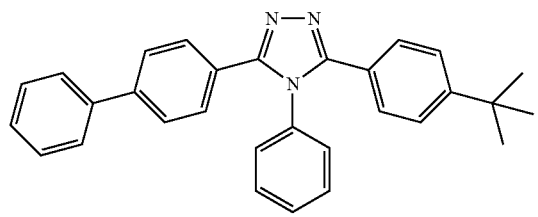 [SMILES: CC(C)(C)c1ccc(-c2nnc(-c3ccc(-c4ccccc4)cc3)n2-c2ccccc2)cc1] | Jpn. J. Apply. Phys. 32, L917 (1993) |
| Silole compounds | 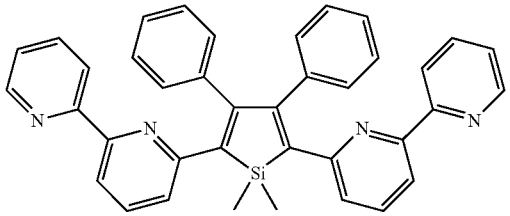 [SMILES: C[Si]1(C)C(c2cccc(-c3ccccn3)n2)=C(c2ccccc2)C(c2ccccc2)=C1c1cccc(-c2ccccn2)n1] | Org. Electron. 4, 113 (2003) |
| Arylborane compounds | 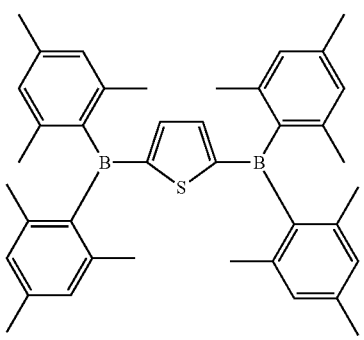 [SMILES: Cc1cc(C)c(B(c2ccc(B(c3c(C)cc(C)cc3C)c3c(C)cc(C)cc3C)s2)c2c(C)cc(C)cc2C)c(C)c1] | J. Am. Chem. Soc. 120, 9714 (1998) |

TABLE II-continued

| MATERIAL | EXAMPLES OF MATERIAL | PUBLICATIONS |
| --- | --- | --- |
| Fluorinated aromatic compounds | | J. Am. Chem. Soc. 122, 1832 (2000) |
| Fullerene (e.g., C60) | | US20090101870 |
| Triazine complexes | | US20040036077 |
| Zn (N^N) complexes | | U.S. Pat. No. 6,528,187 |

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

The invention claimed is:

1. A method of manufacturing a light emitting panel, the method comprising:
   forming a first electrode layer;
   forming an organic layer stack over the first electrode layer;
   forming a second electrode layer over the organic layer stack;
   patterning, by vapor deposition through a shadow mask, at least one of:
   (a) a plurality of bus lines in electrical contact with at least one of the first electrode layer or the second electrode layer, or
   (b) an insulator;
   wherein at least one single OLED device having at least one of a shortest dimension in plan view of greater than approximately 2 cm, or an active area greater than approximately 10 cm² plan view, is formed.

2. The method of claim 1, wherein the method includes patterning, by vapor deposition through a shadow mask, a plurality of bus lines in electrical contact with at least one of the first electrode layer or the second electrode layer.

3. The method of claim 2, wherein the patterning of the plurality of bus lines includes deposition by at least one of vacuum thermal evaporation (VTE) deposition, sputter deposition, e-beam evaporation and chemical vapor deposition (CVD).

4. The method of claim 2, wherein the patterning of the plurality of bus lines includes deposition by VTE through the shadow mask.

5. The method of claim 2, wherein a final profile shape of the bus lines corresponds to a profile shape of the bus lines as deposited.

6. The method of claim 2, wherein a slope angle of a sidewall of the bus line is in a range of 0.01°-30°, the slope angle measured based on a line between two points on the bus line sidewall at 10% and 90% respectively of bus line thickness.

7. The method of claim 1, wherein the method includes patterning, by vapor deposition through a shadow mask, an insulator.

8. The method of claim 7, wherein the patterning of the insulator includes at least one of vacuum thermal evaporation (VTE) deposition, sputter deposition, e-beam evaporation and chemical vapor deposition (CVD).

9. The method of claim 7, wherein the patterning of the insulator includes deposition by VTE through the shadow mask.

10. The method of claim 7, wherein a final profile shape of the insulator corresponds to a profile shape of the insulator as deposited.

11. The method of claim 7, wherein the insulator is disposed between the first electrode and the organic layer stack.

12. The method of claim 7, wherein the insulator is disposed between the second electrode and the organic layer stack.

13. The method of claim 1, wherein the panel is formed on a flexible substrate.

14. The method of claim 1, including patterning, by vapor deposition through a shadow mask:
a plurality of bus lines in electrical contact with at least one of the first electrode layer or the second electrode layer, and
an insulator.

15. A light emitting panel comprising:
a first electrode layer;
an organic layer stack over the first electrode layer;
a second electrode layer over the organic layer stack; and
a plurality of bus lines in electrical contact with at least one of the first electrode layer and the second electrode layer,
an insulator between the first electrode layer and the second electrode layer; and
at least one single OLED device having at least one of a shortest dimension in plan view of greater than approximately 2 cm, or an active area greater than approximately 10 cm$^2$ plan view,
wherein at least one of the bus lines and the insulator are patterned by vapor deposition through a shadow mask.

16. A method of manufacturing a light emitting panel with a plurality of bus lines, the method comprising:
forming a first electrode layer;
forming an organic layer stack over the first electrode layer;
forming a second electrode layer over the organic layer stack;
forming a plurality of bus lines in electrical contact with at least one of the first electrode layer or the second electrode layer; and
patterning an insulator by vapor deposition through a shadow mask;
wherein, the insulator is configured to electrically insulate the bus lines from the organic layer stack.

17. The method of claim 16, wherein a brightness of the panel is greater than 1,000 cd/m$^2$.

18. The method of claim 16, wherein a luminance uniformity of the panel is greater than 70% at 1,000 cd/m$^2$.

19. The panel of claim 15, wherein the plurality of bus lines include a final profile shape having sidewall angles in a range approximately between 0.01°-30°.

20. The panel of claim 19, wherein the sidewall angle is measured based on a line between two points on the sidewall slope at 10% and 90% respectively of *bus* line *thickness*.

21. The panel of claim 19, wherein the final profile shape has sidewall angles in a range approximately between 0.01°-20°.

22. The panel of claim 19, wherein the final profile shape has sidewall angles in a range approximately between 0.01°-10°.

23. The panel of claim 19, wherein the final profile shape has sidewall angles in a range approximately between 0.01°-1°.

24. The panel of claim 15, wherein the maximum absolute value of the second derivative of the sidewall of the bus line layer is <1.0.

25. The panel of claim 15, wherein a RMS surface roughness of the bus line layer along a sidewall is <30 nm.

26. The panel of claim 15, wherein the final profile shape of the insulator corresponds to a profile shape of the insulator as deposited.

27. The panel of claim 15, wherein the insulator is formed by inserting a spacer mask between the substrate and a shadow mask for patterning the insulator, and the thickness of the spacer mask is used for controlling the gap between the substrate and the shadow mask based on the desired final profile of the insulator.

28. The panel of claim 27, wherein the shadow mask used for patterning the insulator is the same as the shadow mask used for patterning the bus lines.

29. The panel of claim 15, wherein the single OLED device has a shortest dimension in plan view of greater than approximately 2 cm.

30. The panel of claim 15, wherein the single OLED device has a shortest dimension in plan view of greater than approximately 5 cm.

31. The panel of claim 15, wherein the single OLED device has an active area greater than approximately 10 cm$^2$ plan view.

32. The panel of claim 15, wherein the single OLED device has an active area greater than approximately 25 cm$^2$ plan view.

33. The panel of claim 15, wherein a brightness of the panel is greater than 1,000 cd/m$^2$.

34. The panel of claim 15, wherein a luminance uniformity of the panel is greater than 70% at 1,000 cd/m$^2$.

* * * * *